US008167626B2

(12) United States Patent
Cherian

(10) Patent No.: US 8,167,626 B2
(45) Date of Patent: *May 1, 2012

(54) PROBES WITH WIPE

(76) Inventor: Gabe Cherian, Sun Valley, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/796,141

(22) Filed: Jun. 8, 2010

(65) Prior Publication Data

US 2010/0255691 A1 Oct. 7, 2010

Related U.S. Application Data

(62) Division of application No. 12/395,700, filed on Mar. 1, 2009, now Pat. No. 7,771,210, which is a division of application No. 11/824,867, filed on Jul. 2, 2007, now Pat. No. 7,517,225, which is a division of application No. 09/947,240, filed on Sep. 5, 2001, now Pat. No. 7,254,889.

(60) Provisional application No. 60/231,387, filed on Sep. 8, 2000, provisional application No. 60/257,673, filed on Dec. 22, 2000, provisional application No. 60/268,467, filed on Feb. 12, 2001.

(51) Int. Cl.
*H01R 12/00* (2006.01)

(52) U.S. Cl. ........................................... 439/66

(58) Field of Classification Search .................... 439/66, 439/74, 82, 79
See application file for complete search history.

(56) References Cited

U.S. PATENT DOCUMENTS

| | | | | |
|---|---|---|---|---|
| 3,795,037 A * | 3/1974 | Luttmer | ........................... | 29/883 |
| 5,247,250 A * | 9/1993 | Rios | ........................... | 324/750.22 |
| 6,330,164 B1 * | 12/2001 | Khandros et al. | ............. | 361/760 |
| 6,419,500 B1 * | 7/2002 | Kister | ............... | 439/66 |
| 6,428,329 B2 * | 8/2002 | Orui et al. | ........................ | 439/75 |
| 6,438,831 B1 * | 8/2002 | Hagihara | ........................ | 29/884 |
| 6,525,551 B1 * | 2/2003 | Beaman et al. | ........... | 324/756.03 |
| 7,254,889 B1 * | 8/2007 | Cherian | ........................... | 29/874 |
| 7,306,493 B2 * | 12/2007 | Seo et al. | ........................ | 439/751 |
| 7,517,225 B2 * | 4/2009 | Cherian | ........................... | 439/66 |
| 7,771,210 B2 * | 8/2010 | Cherian | ........................... | 439/66 |

* cited by examiner

*Primary Examiner* — Tulsidas C Patel
*Assistant Examiner* — Phuong Nguyen

(57) ABSTRACT

Several novel probes are shown, highlighting the designs and non-linear spring rates of their contact springs. These springs work in conjunction with a novel comb, which affects the movement of the springs tips, so as to create the desirable scrub or wipe at the surface of the contact pads of the devices under test. At least three versions of the probes are covered by the claims, where one probe works on one device, a second probe works on two devices and the third probe comprises a lid, which controls the protrusion distance of the spring tips above the housing surface, so as to protect the springs from getting damaged prematurely.

20 Claims, 63 Drawing Sheets

M-2 [CHA-1/1]

SPRING #6 [CA]

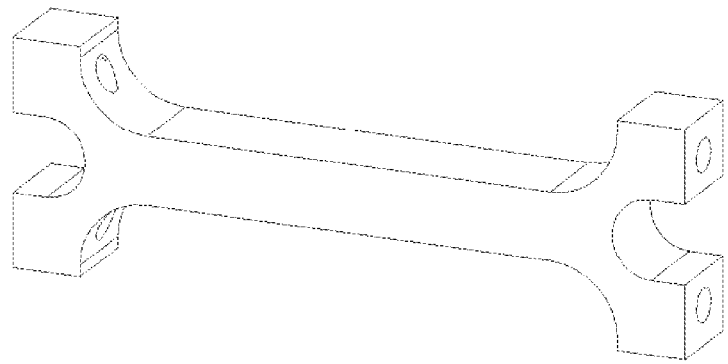
FIG. 36
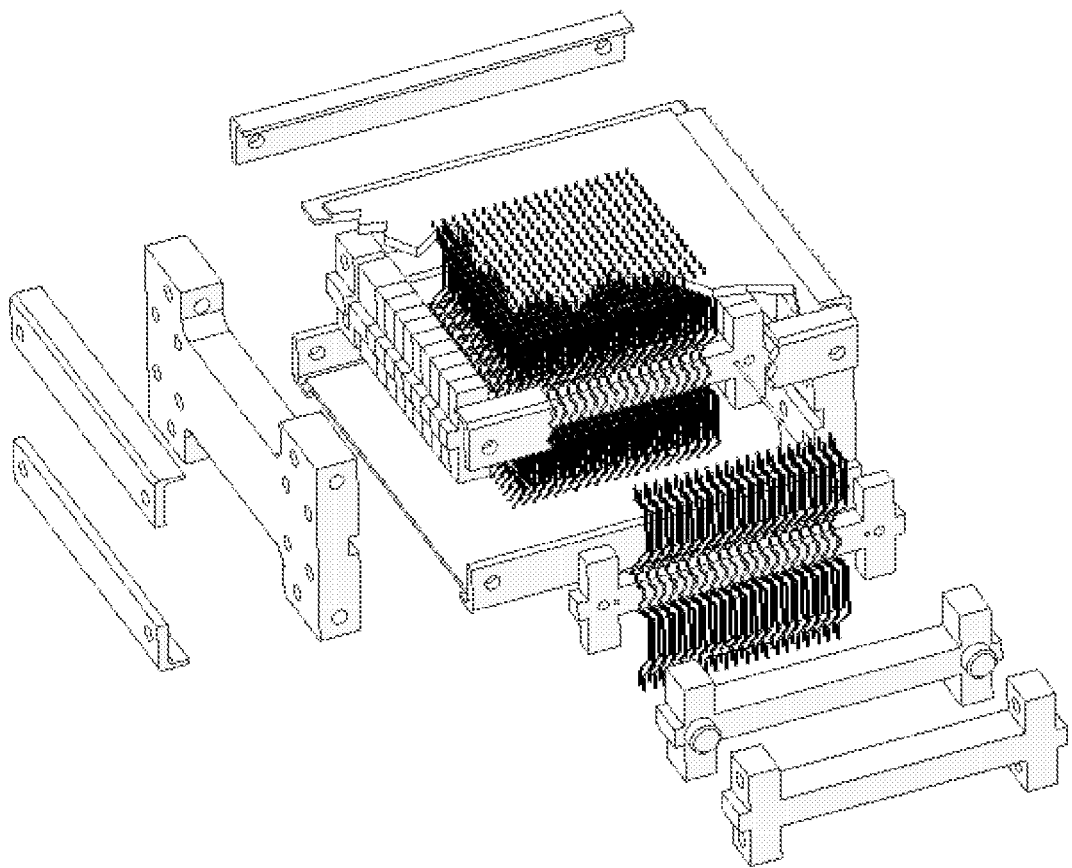
FIG. 37-A

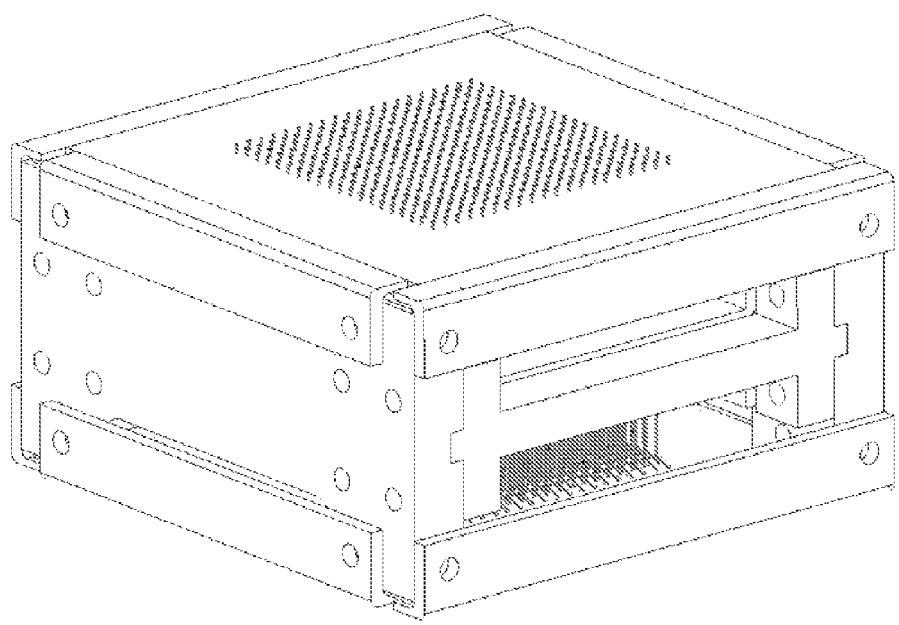
FIG. 37-B

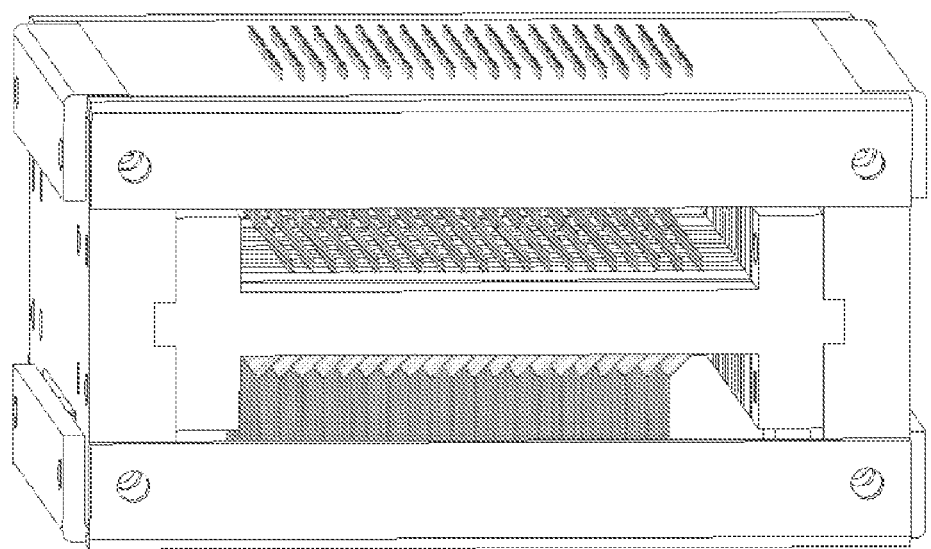
FIG. 37-C

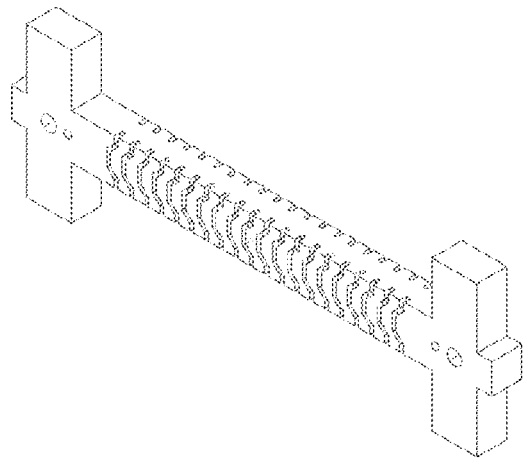
FIG. 41-A
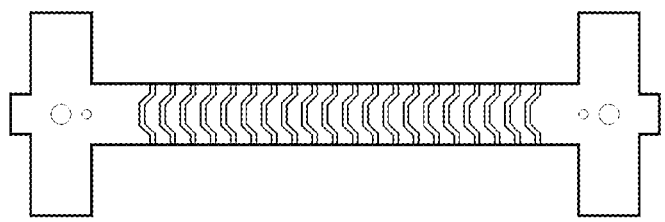
FIG. 41-B
FIG. 42
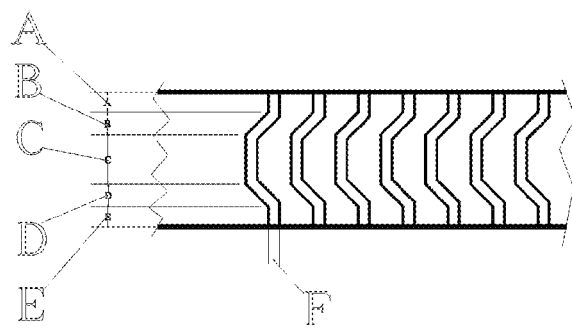
FIG. 43
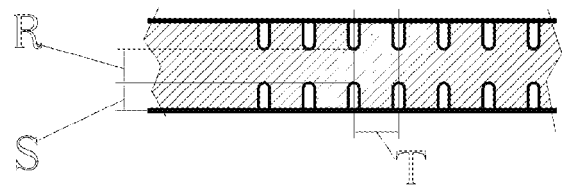
FIG. 44

PROBES WITH WIPE

CROSS-REFERENCE TO RELATED APPLICATIONS

This application is a non-provisional DIVISIONAL utility PATENT APPLICATION, BASED ON MOTHER patent application Ser. No. 12/395,700, Filed Mar. 1, 2009 now U.S. Pat. No. 7,771,210, Title: S&P3 CWW2 Connectors With Wipe, which in turn is a Divisional Application based on its mother patent application Ser. No. 11/824,867 Filed Jul. 2, 2007 now U.S. Pat. No. 7,771,210, Title: CONNECTOR WITH WIPE (TITLE WAS: S&P2 CWW1 CONNECTOR WITH WIPE), now U.S. Pat. No. 7,517,225, which in turn is a Divisional Application based on its mother patent application Ser. No. 09/947,240, filed Sep. 5, 2001, Title: INTERCONNECTION DEVICES, now U.S. Pat. No. 7,254,889. The mother application Ser. No. 12/395,700 is still pending at the United States Patent and Trademark (USPTO), as of the filing date of the present application.

This present application is claiming the priority and benefits of all prior mother patent applications mentioned above, which are incorporated herein in their entirety by reference and which will be referred to as Ref4 and Ref5 and Ref6.

This application is claiming, in turn by reference, also the priority and benefits of the references, which were claimed by the prior mother applications. Those references are:

Ref1) Provisional Patent Application Ser. No. 60/231,387, filed Sep. 8, 2000, title: Probers, and Ref2) Provisional Patent Application Ser. No. 60/257,673, filed Dec. 22, 2000, title: Probes and Sockets, and Ref3) Provisional Patent Application Ser. No. 60/268,467, filed Feb. 12, 2001, title: Probes, Sockets, Packages & Columns, ALL of which are incorporated herein in their entirety by reference, and which will be referred to as Ref1, Ref2 and Ref3.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention. The present invention generally relates to electrical connectors, and more particularly relates to high-density electrical connectors used in test and burn-in done on miniaturized electrical components.

This invention is a technology platform that enables the interconnection between high-density electronic devices. It first covers the springs and spring arrangements that represent the modular building block of devices to achieve high density interconnection and finally covers several applications utilizing the said springs and arrangements, such as sockets, connectors, probes, test heads and the like.

The invention also relates to combs, which are used in conjunction with said springs, and which promote and control wipe or scrub, and which are thermally matched to the electronic devices, to enhance life and performance especially during thermal cycling procedures.

2. Background Information. It is standard procedure to test chips or integrated circuits at different production stages to cull out the defective ones. Such tests are often done on printed circuit boards circuits, substrates and similar electronic devices as well. This is done to avoid putting extra time, money and effort into a defective component only to end up having to scrap the component at the end of the production process. Such testing is done using probes and probe cards, along with sockets. Many times when packages are tested, they undergo what is known as test and burn-in. Packages are inserted into the test sockets, or a probe is used to test the package or devices, and heat and electricity are applied to accelerate the aging or testing process. What is needed is a system that will allow these sockets and probes to be easily interchanged and to also reduce the size of the pitch or the distance between the contact elements within the sockets and probes to allow contact with the contact pads of miniaturized electronic devices.

PRIOR ART

There exist a number of prior art devices of the type in consideration herein. I will explain in the following paragraphs how each of these prior art devices have addressed some of the problems, but left some other issues unanswered and unresolved. I will explain how my present invention addresses and solves these issues.

1. Force-Deflection Curve and Damage to the Device Contacted by the Springs.

A potential user of my devices complained that his present supplier provides him with test heads, which utilize contact springs similar to the IBM Buckling Beam contact springs. He stated to me that the springs apply such a high force that sometimes they damage the substrate that are tested. So, they start with potentially good substrates, test them and during the test process, the substrates get damaged and become defective. It is almost like testing matchsticks. After each one gets tested, you determine that it "was" a good one.

In U.S. Pat. No. 4,622,514, the IBM "Multiple Mode Buckling Beam Probe Assembly", the contact springs are basically straight columns of wires, which get compressed by an external force to provide the contact pressure and contact force. There are basically two reasons why any electrical interconnection device needs springs and needs forces applied on to these springs. The first reason is to break through the layers of dirt and oxides that form on the contact surfaces and to reach the pure contact metal. In some cases the required force is only a few grams, in other cases it can be considerably higher. The second reason is to accommodate non-planarity of the contacts on the surface of the device to be contacted. For example, if the device has a non-planarity of say several thousands of an inch between any two adjacent contact pads, then one spring would have this much more deflection than the adjacent spring. The effect of this additional deflection is that the spring with more deflection will exert more force on the contact pad. This higher force could reach a level, where the contact spring would then damage the contact pad and render it defective.

So, in order to prevent any damages to the contact pads, the contact forces need to be kept within tight limits. For this reason, it is customary to select contact springs that are "soft" and have a shallow "force-deflection" curve, also called "spring index". With a soft spring, you start by applying a small force and gently, gradually increase the force until you reach the desired force level that is enough to break through the layers. Ideally you should stop there. If the device was perfectly flat and the non-planarity was zero, then all the springs should have the same deflection and thus the same contact force. But if one contact pad is lower than the others, then the spring touching this pad would not have been deflected as much as the other springs, consequently the force provided by this spring would be smaller than the force provided by the other springs. So, the force on that low pad would be below the desired level. In order to make this force higher and to make it reach the desired level, the spring working on this low pad needs to be deflected more. But we cannot selectively deflect each individual spring on its own. All the springs have to be pushed down and deflected equally, by the same amount. So, we push down on all the springs, until the spring acting on the lowest pad reaches a deflection that would provide the desired force. But the springs acting on the higher pads, because of their larger deflection, are now providing a much higher force. The amount of this additional force can be calculated from the force-deflection curve, or the stiffness of the spring.

If the springs used are relatively stiff, this can have a detrimental effect. The excessive down-push on the springs can make the force of the high pads reach a level, where the pads can be damaged. A secondary bad effect of this situation is the total force required to be applied on the device. If we have a device that has a high number of contact pads, and the force per pad to reach a satisfactory electrical connection, the total mechanical force can damage the device physically.

For all the above reasons, designers put a lot of effort in designing soft contact springs. The ideal spring would have a force-deflection curve that starts at zero force for zero deflection and then slopes upward gradually.

Now, if we look at the force-deflection curve of a column, unfortunately it has the opposite shape, or general slope, compared with the desirable/ideal springs. A column stays straight under an increasing force and when the force reaches a critical level, the column buckles and gives way very rapidly. If we study the force-deflection curve of a column, we will see that basically it has a shape and slope contrary to the ideal contact spring. At the beginning, when a force is applied to a column, we see no deflection. Even after increasing the force to a high level, there would still be no deflection. The force-deflection curve is practically a straight vertical line with zero deflection. After the force reaches the buckling level or limit, the column buckles and practically collapses down. The force-deflection curve drops down almost exponentially until it reaches a point where the structure converts to a beam mode under axial loading. The slope of the curve after the initial buckling usually becomes negative. Such a condition is not desirable, especially with any appreciable non-planarity. To reduce this undesirable effect, IBM has opted to provide several steps of buckling, to accommodate more non-planarity than is available with one level. But, in spite of that, the basic force-deflection curve is the same. The only difference is that with the multi-level buckling, we would get a curve that would look like a saw tooth. The force would increase to the buckling limit then collapse at the first buckling, then the force would increase again to a similar buckling level and then collapse at the second buckling and so on.

The contact springs according to the present invention provide the more desirable force-deflection curves as will be describes later. This means that they would not have the tendency of damaging the contact pads of the device under test.

In U.S. Pat. No. 5,385,477, the CK Technology "Contactor with Elastomer Encapsulated Probes" has modified the design of the IBM Buckling Beam slightly. Instead of relying only on the applied force to buckle the beam, CKT has provided means to "nudge" the column to collapse more easily. However, the force-deflection curve is still basically that of a column and it would have a similar vertical spike, for one column segment, and if more than one segment, then the saw tooth shape, as described above. Hence, no drastic improvement.

As mentioned above, the contact springs according to the present invention provide the more desirable force-deflection curves as will be describes later. And again, this means that they would not have the tendency of damaging the contact pads of the device under test.

2. High-Density or Small Pitch.

All the patents listed below in this section have been invented by the present inventor, Gabe Cherian, either solely by him or together with other co-inventors. The reason for listing them is to show that each one of them has one or more features which make them not compatible with the present needs of the industry, from the point of view high density. This is the reason the inventor was motivated to update his old inventions and to address the present market needs.

G. B. Cherian, W. S. Scheingold and S. J. Kandybowski, "Electrical Interconnect Device", AMP Incorporated, Harrisburg, Pa., U.S. Pat. No. 4,262,986, Apr. 21, 1981. Shows a large footprint compared to the height (excluding the solder-tail). Totally opposite of what is being achieved in this invention.

G. B. Cherian, W. S. Scheingold and L. D. Wulf, "Zero Insertion Force Connector", AMP Incorporated, Harrisburg, Pa., U.S. Pat. No. 4,080,032, Mar. 21, 1978. Only 2 rows of contacts, then we can use the space between the rows or outside the rows.

E. J. Bright, G. B. Cherian and W. S. Scheingold, "Ejection Device for a Electronic Package Connector", AMP Incorporated, Harrisburg, Pa., U.S. Pat. No. 4,190,310, Feb. 26, 1980. Same. Only 2 rows of contacts, then we can use the space between the rows or outside the rows.

G. B. Cherian, W. S. Scheingold and F. C. Youngfleish, "Active Device Substrate Connector", AMP Incorporated, Harrisburg, Pa., U.S. Pat. No. 4,341,433, Jul. 27, 1982. Perimeter. Almost like the 2 rows, except at the corners. 2 rows or perimeter: Worry about the center distance only in one direction, but have more room in the direction perpendicular to the former.

G. B. Cherian, W. S. Scheingold, "Connecting Element for Surface To Surface Connectors", AMP Incorporated, Harrisburg, Pa., U.S. Pat. No. 4,161,346, Jul. 17, 1979. Close but too difficult for real small pitch G. B. Cherian, W. S. Scheingold and R. D. Zimmerman, "Electrical Interconnection Device", AMP Incorporated, Harrisburg, Pa., U.S. Pat. No. 4,199,209, Apr. 22, 1980. Close but too difficult for real small pitch Cherian, Gabe, "Heat Recoverable Connecting Device", Raychem Corporation, Menlo Park, Calif., U.S. Pat. No. 4,487,465, Dec. 11, 1984 . . . . Close but too difficult for real small pitch.

In U.S. Pat. No. _____, IBM "COBRA" has one advantage over the Buckling Beam, but it has a major drawback. It can not be parallel nested close enough to accommodate high-density in both the x- and the y-directions. FIG. 12. A shows the general configuration of the IBM Cobra Spring or Needle. If we place such springs next to each other, but without allowing them to touch, in a direction perpendicular to the plane of the belly, which we would arbitrarily call the y-direction, the center distance between any two adjacent springs would depend on the diameter of the spring. For example, if we want the clearance between any two adjacent springs to be equal to one diameter of the springs, then the center distance would be equal to two diameters. But on the other hand, if we try to parallel nest two or more such springs, in the direction shown in FIG. 12A, which would be in this case the x-direction, the center distance will be considerably larger. The reason is because the C-Shape belly of the IBM Cobra Springs is almost a half circle. In order to prevent the springs from touching, and thus shorting electrically, and have a similar clearance of one diameter between any two adjacent springs, as in the previous case, the springs will have to be placed at a much larger center distance.

In the present invention, we present ways to decrease the center distances between springs, thus accommodating higher densities of contacts pads.

3. Impedance Control

In all the above prior art, the contact springs are bare, i.e. not covered by any insulation or the like. If the spring is long, then its length may affect the quality of the electrical transmission.

In the present invention, we present ways to control the impedance of the contact springs and improve their electrical performance.

4. Wipe or Scrub

In all the above prior art, as well as in U.S. Pat. No. _____, which is the Charles Everett "POGO" pins and all similar contact springs, the tips of the springs apply the force at one point of the contact pad. They do not provide "wipe" or "scrub". If a contact spring provides wipe or scrub, it help in removing the undesirable layers of dirt and/or oxides from the space under the spring and allows the spring to make metal contact under a smaller force, than when there is no wipe or scrub. So, all the prior art mentioned above, by not providing wipe or scrub, require a comparatively high force to make a good electrical connection, compared with a contact spring that does provide the desirable wipe or scrub. The present invention does provide means to have wipe or scrub as will be describes later.

5. TCE Matching

In all the above art and in most sockets or connectors, the springs are located in housings, usually made of plastic. Then the sockets or connectors are mounted on boards, which are usually made of FR4 or glass-filled epoxy material or the like. Then the device under test, for example, a BGA package is placed on top of the socket or connector, and the whole stack would be placed in a thermal cycling oven. The TCE (Thermal Coefficient of Expansion) of these material can vary dramatically. During thermal cycling, these different materials would expand and shrink at different rates. The effect of this can be detrimental, especially for large temperature variations, and for the materials in contact with each other. There would be a "relative motion" between the tips of the springs and the contact pads, both at the socket/board interface, as well as at the socket/package interface.

The present invention covers improvements to this undesirable condition as will be explained later.

6. Elastomer with Dispersed V Springs

U.S. Pat. No. 4,660,165, for the Shin-Etsu "Press-Contact Type Interconnectors" rely on the elastomer to provide some of the contact force. This is not what I am doing here in my invention. Wherever I use an elastomer, it is simply as a means to hold the springs together to facilitate the assembly process. As I have explained in the description, I can use a wax to hold the springs together and after the assembly is done, I can melt the wax away and the socket would work just as well without the wax or the elastomer.

REFERENCES

1. J. Novitsky and C. Miller, "MicroSpring™ Contacts on Silicon: Delivering Moore's Law-type Scaling to Semiconductor Package, Test and Assembly", FormFactor Inc., Livermore, Calif., International Conference on High Density Interconnect and Systems Packaging, Denver, Colo., Apr. 25-28, 2000, Proceedings pp. 250-255.

2. Novitsky, John, "Production Sockets Using MicroSpring™ Contacts", FormFactor Inc., Livermore, Calif., International Conference on High Density Interconnect and Systems Packaging, Denver, Colo., Apr. 25-28, 2000, Proceedings pp. 363-368.

SUMMARY OF THE INVENTION

As the electronics industry has become more advanced, the chips and components have become smaller and smaller. A resulting problem is that sockets, probes and the like are too large, or have their contact elements too large, to work with many of the products which are now available. This results in increased cost to the manufacturers, who must test the devices through more expensive means.

The object of the invention is to utilize new systems to design and mount springs or needles to reduce the drawbacks that exist in present probes and sockets. This method can be used for probes, sockets, test heads and other interconnections. The basic goal is to provide contact springs that can be located on small, effective center distances to correspond to the center distances of contact pads on chips, wafers, packages, substrates or boards and similar devices. This should also cover a small area or footprint of the devices. Another general goal is to provide a way to support and guide the springs or needles, and to locate them precisely, especially at their tips, where they contact the device under test (DUT). This will reduce the chance of deforming the springs or needles out of position and keeps the tips in close alignment. One more goal is to provide adequate wipe or scrub action at the tips of the springs or needles, thus requiring small forces to break through the undesirable layers on top of the contact pads. Yet another goal is to reduce the ill effect of thermal cycling through the use of TCE-matched combs. Another important goal is to shield the needles and/or make them with controlled impedance to perform like coaxial cables. This would be accomplished by providing an insulating cover, layered over the needles, and then providing another layer of conductive material that can be grounded.

Still other objects and advantages of the present invention will become readily apparent to those skilled in this art from the following detailed description wherein I have shown and described only the preferred embodiments of the invention, simply by way of illustration of the best modes contemplated by carrying out my invention. As will be realized, the invention is capable of modification in various obvious respects all without departing from the invention. Accordingly, the drawings and description of the preferred embodiment are to be regarded as illustrative in nature, and not as restrictive.

BRIEF DESCRIPTION OF THE DRAWINGS

FIG. 1 shows the basic contact element and how it is formed to act as "formed beam" rather than a "column". It interacts with what I call the comb. The tail of the spring passes through an aperture in the comb, said aperture acts in turn as a fulcrum for the tilting of the spring tail.

FIG. 2 shows a cantilever beam, which has similar features. Its tail passes through an aperture of a comb, which in turn controls the tilting of the spring tail as well.

FIGS. 3 and 4 show how springs can be "parallel nested".

FIGS. 5 through 7 show how springs can be placed in a "Staggered" arrangement.

FIG. 8 shows how springs can be placed in a "Head-To-Toe" arrangement.

FIGS. 9 through 47 show applications of parallel nesting. These apply to interconnection devices, usually known as "sockets".

FIGS. 48 through 68 show similar applications of parallel nesting, but the applications are for interconnection devices, generally known as "probes", test heads, test modules, and the like.

Figure 9:
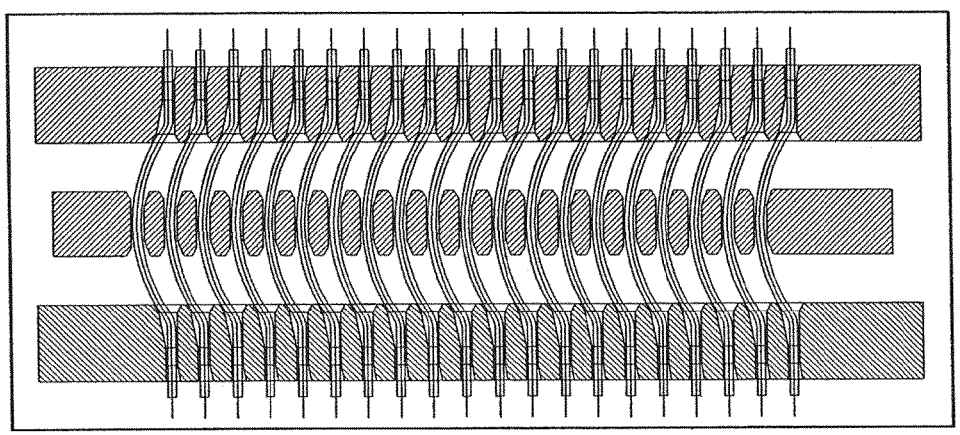
Figure 68:
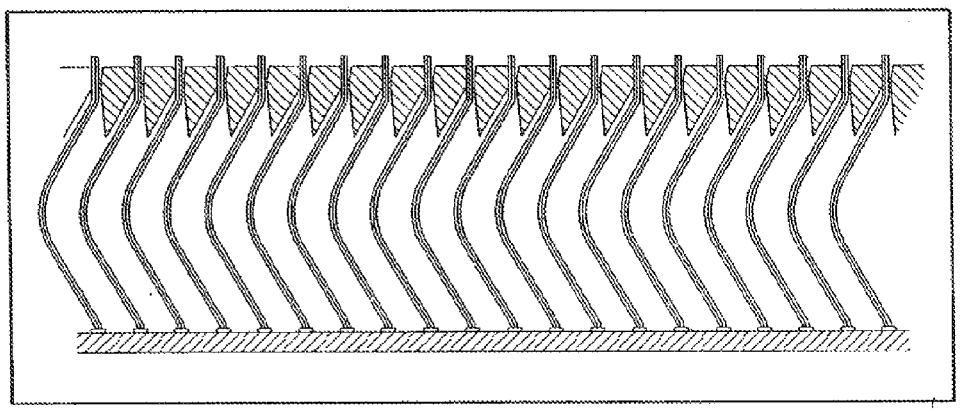

All contact springs in FIGS. 9 through 68 could be considered to have "vertical axis".

FIGS. 69 through 101 show applications of cantilever type of springs, as they are used in applications which also use the "combs". These applications are usually known as "probes" or "probe cards". Some will be referred to as "horizontal cantilever", while others as "vertical cantilever", based on whether the anchor portion of the springs is horizontal or vertical respectively.

Figure 102:
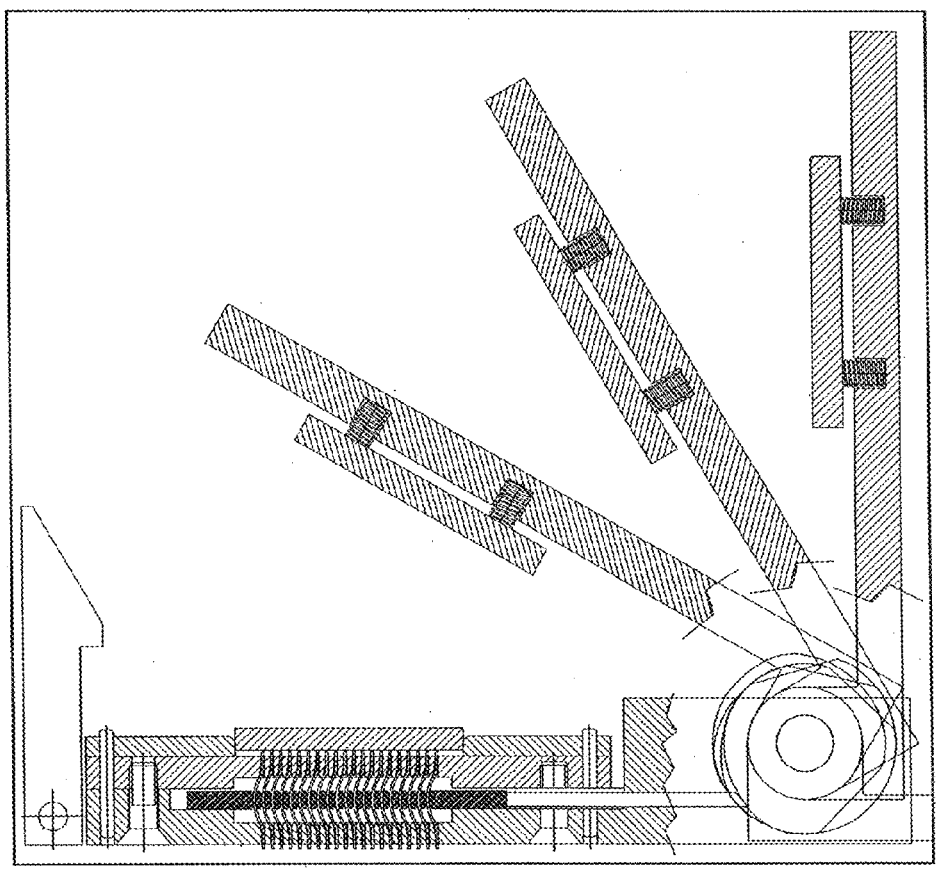

FIG. 102 is the drawing, which will be attached to the "abstract". It shows a socket, which is designed according to the teachings of this invention.

DEFINITIONS

Figure 1:
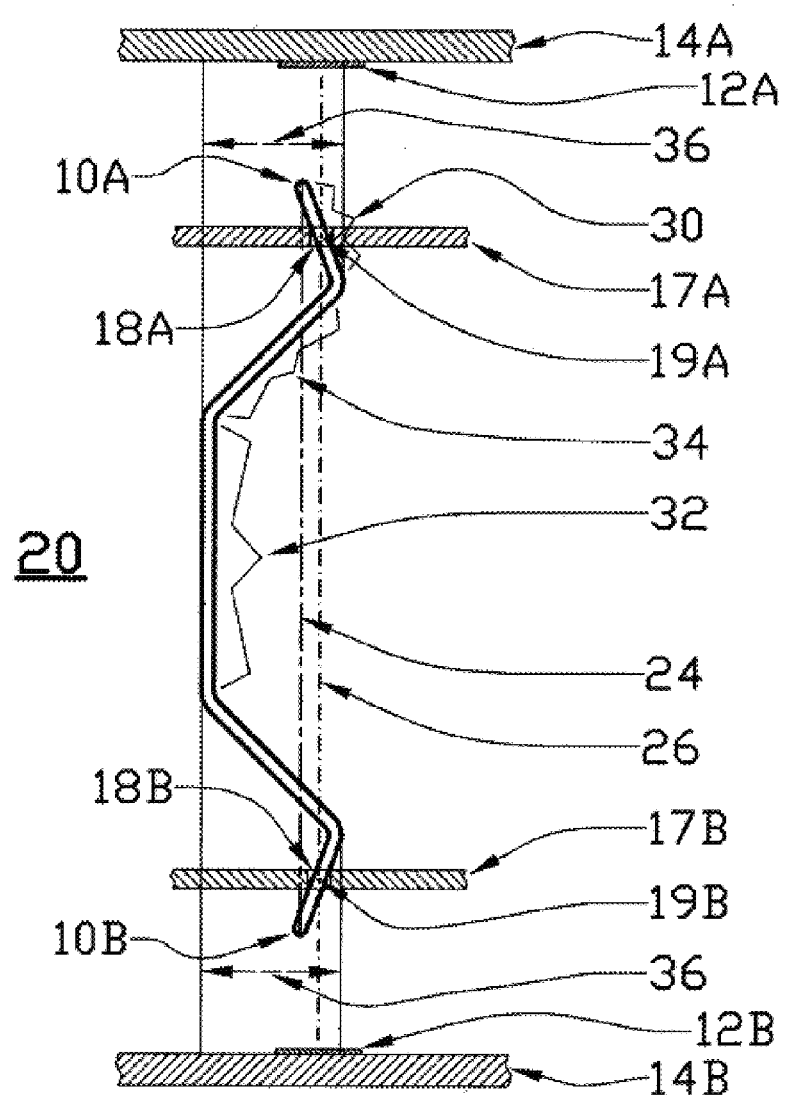
FIGS. 1 through 8 show the basis of the invention, what I like to call the basic technology.
Figure 2:
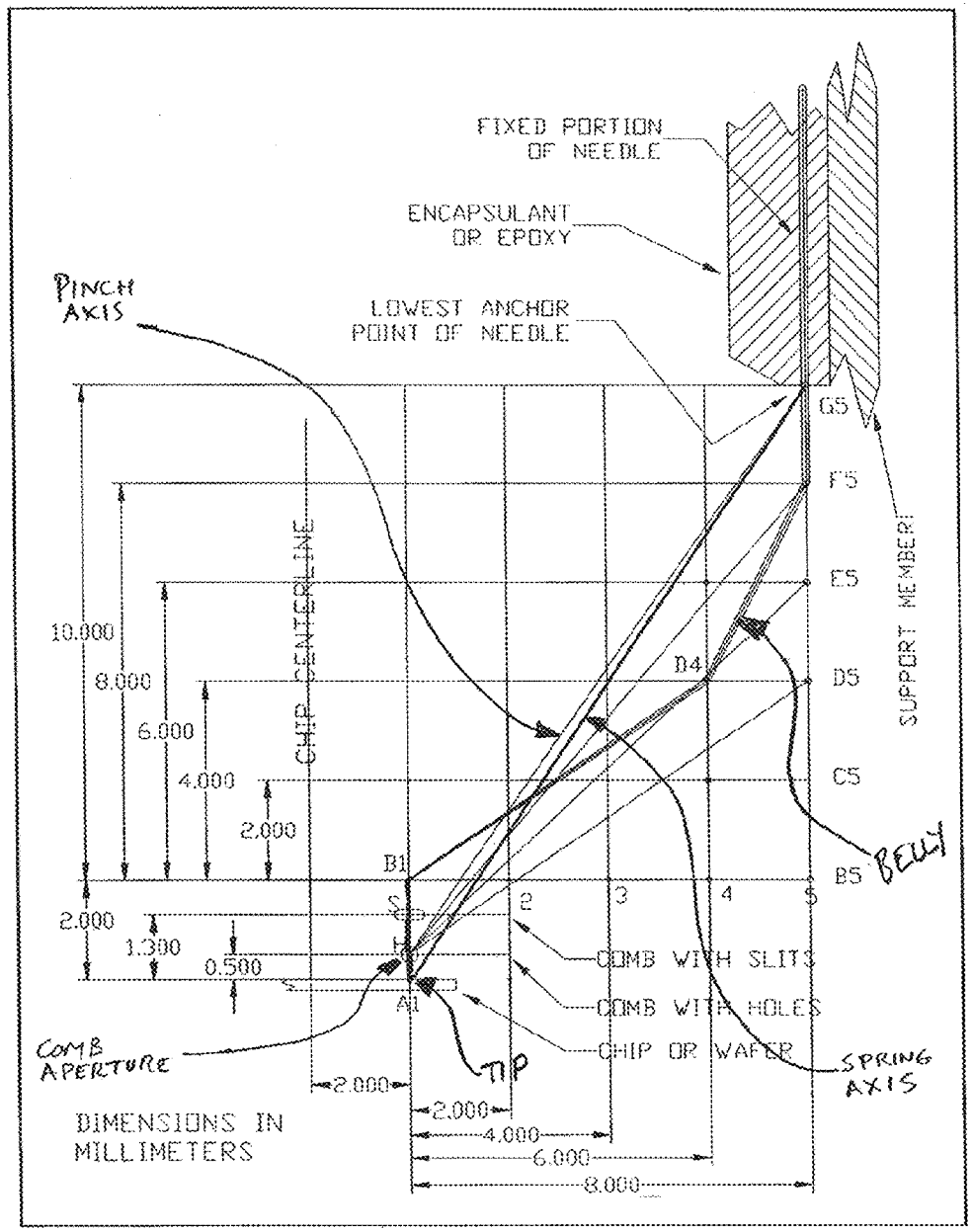

For the purpose of the following invention description, I will use certain words or terms that may be peculiar to this application. They will be explained in the following definitions. For different spring elements and portions, please refer to FIGS. 1 through 3. These figures represent typical springs, with a generally elongated slender body.

SPRING TIP OR SIMPLY THE TIP. The farthest point of a spring, which generally makes contact to a device, such an electronic chip or package or substrate or board. Most springs would have two active tips, while some springs could be fixed at one end, in which case they would have only one tip active, which is the tip that is not fixed.

SPRING BODY OR SIMPLY THE BODY. It is the major part of the spring, between the two tips or between the one active tip and the fixed portion of the spring.

SPRING AXIS OR SIMPLY THE AXIS. It is the imaginary line between the two tips or the line that is between the tip and the anchor point. This axis usually affects the general deflection behavior of the spring when subjected to external forces.

PINCH AXIS. If a spring has both its two ends free and each one passes through a comb, then the pinch axis is the imaginary line that passes through the pinch point of the apertures of the two combs. If the spring is fixed at one end and has only one end free that passes through only one comb, then the pinch axis is the imaginary line that starts at the fixed end and passes through the pinch point of the aperture of the comb.

SPRING TAIL OR SIMPLY THE TAIL. It is the portion of the spring just before the tip. It can be in line with the axis or at some angle to it. With springs that operate in conjunction with guiding combs, the tail is usually the part of the spring that is located inside the comb and passes through its aperture. It is restrained from moving sideways at the pinch point of the comb or at the edges of the aperture holes of the comb, but it is allowed to rotate through a certain angle.

SPRING BELLY OR SIMPLY THE BELLY. The portion of the spring body that usually bulges out at some eccentric distance from the spring axis. It is also the portion that deflects the most out of line from the axis when the spring is under some external axial load.

SPRING SHOULDER OR SIMPLY SHOULDER. It is the portion of the spring that is generally between the belly and the tails.

SPRING FOOTPRINT OR SIMPLY FOOTPRINT. If a spring is located so as to make contact with an electrical device, such as a substrate or printed circuit board, and if we look at the area of board surface that the spring occupies or shadows, we will refer to that area as the spring's footprint on the board, or simply its "footprint". See FIG. 1.

PARALLEL NESTING. Plastic spoons and forks used for picnics and the like come packaged in cardboard boxes, stacked neatly one next to each other. They can be considered as elongated slender objects, which are "parallel nested". Plastic or paper cups stacked one inside the other, or dishes stacked one on top of the other, or some metal chairs stacked one on top of the other are examples of parallel nesting. All these and similar objects, which can be arranged such that one object "encroaches" on the space of the adjacent object, can be considered as being "parallel nested". The main purpose of parallel nesting in these cases is to use less space to contain such objects, than if these objects were placed next to each other or on top of each other, whereby each one occupies its own space, without encroaching on the space of the adjacent object. So, for the purpose of this invention, we will define "parallel nesting" as placing objects next to each other, in such a way that one object is encroaching into the "space" of the adjacent object, and such that the space utilized by any two adjacent objects is smaller than the total space that would have been used by the two objects if they were not encroaching on each other's space. The same would apply to objects encroaching on each other's "footprint". They would also be considered to be parallel nested. Parallel nested objects can be touching their adjacent neighbors, or they can be placed at some predetermined distance, and can still be considered parallel nested, if they encroach on the space or footprint of their respective adjacent object(s). The same applies to contact springs. They can be parallel nested and kept at a certain distance from each other. We may refer to that distance as the "center distance" between the springs or the "pitch".

Figure 3:
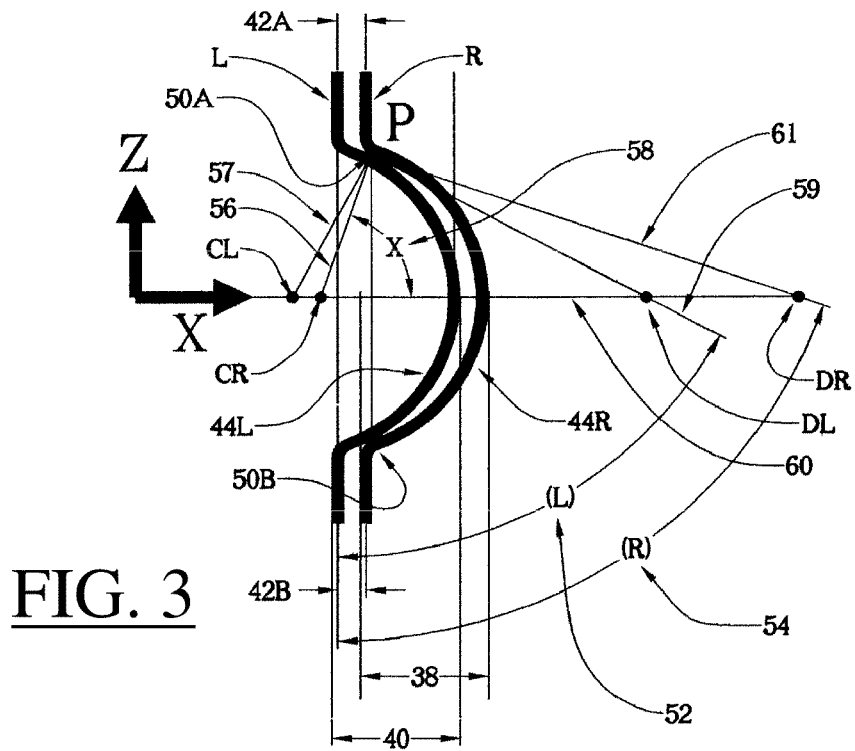
Figure 4:
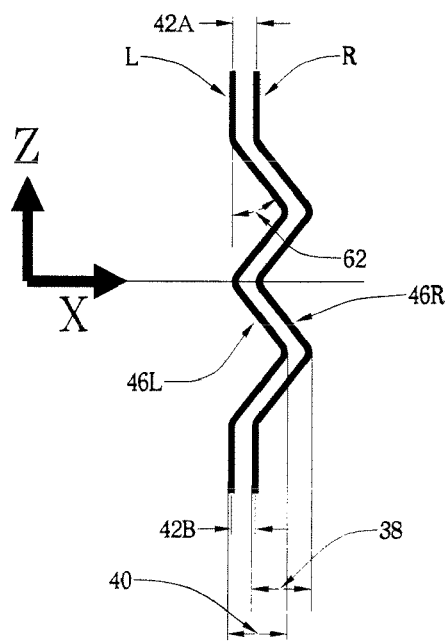

FIG. 3 shows two parallel nested springs with bellies that look like a "Cee-shape". FIG. 4 shows two parallel nested springs, whose bellies look like "Vees".

NESTING POINT. When two springs are placed next to each other, and nested into each other, and then brought as close as possible to each other, the two springs will eventually touch at some point. We will call such a point the "Nesting Point". We will use the same definition for the closest point between two parallel nested springs, even though the springs are not physically touching each other.

In FIG. 3, we could have 2 nesting points. In FIG. 4, we either not touch at all, in which case there will be no nesting point, or we could touch, in which case we would probably touch along a line, or more than one line.

NESTING ANGLE. The slope of the springs' arcuate shape controls and affects the minimum distance between the two springs. Frequently at the nesting point, the slope of the shape of one spring may be slightly different than the slope of the shape of the adjacent spring. FIG. 3 shows an example of such a situation. If we draw a tangent to the spring body outside surface at the nesting point and we call that angle the nesting angle, we would see that in this case we have two nesting angles, one for each of the two springs. We will call the nesting angle of the left spring "L" and the nesting angle of the right spring "R". We can see in this case, that R is larger than L. For our purpose in this invention description, I will define the nesting angle for these two springs to be the larger of either L or R. In this case, the nesting angle is the angle "R".

We can find the nesting angle of any other spring shape, using a similar approach. Each particular shape of spring would have its own nesting angle. In this particular case, the belly is part of a circle, with its center at point C. The radius CP makes an angle X with the horizontal line CD. From the trigonometrical relations, we know that the angle X equals the angle R. So, we can use the angle X as representing the nesting angle. However, in FIG. 4, the situation is different. All the portions of the two springs are parallel. So, we have to use the angle Y as the nesting angle.

MINIMUM SEPARATION OR MIN PITCH. From FIG. 20, we can observe that if the nesting angle is small, we can place the springs closer to each other. In other words, the separation distance between the springs becomes smaller by reducing the nesting angle. This separation distance controls the ultimate center distance between springs nested this way.

GUIDING COMB OR SIMPLY COMB, OR SOCKET COMB, OR CONNECTOR COMB. Please see FIG. 1 and other figures used later in the description. When we use a pencil to write on a sheet of paper, where the pencil has the usual lead tip at one end and a rubber eraser at the opposite end, we usually do not hold the pencil at a point near the eraser. This would make it difficult to write and to position the lead tip, the working tip of the pencil, accurately at the proper position on the paper. We rather hold the pencil at a point close to the lead tip, which is the writing tip, or rather, the working tip. The fingers holding the pencil at that point act as a guide, to help position the working tip more accurately to meet the paper at the desired location. It is generally more effective to place the guiding fingers as close as possible to the working tip. Similarly with contact springs or contact elements, which are supposed to touch an electronic device at specific contact pads or contact point. When a contact element is shaped as an elongated body and is fixed only at the end opposite the contact tip, the working tip, it would be rather difficult to locate the working tip accurately on the contact pad. It would be better to use some guiding means to help in the positioning and alignment of the working tip to meet the contact pad properly. We will refer to such a guiding means as the "Guiding Comb" or simply as the "Comb". The word comb, however, could be confusing. It usually refers usually to a device that has elongated fingers or teeth attached to a back strip. Webster defines it as a toothed strip of some hard material.... For the purpose of this invention description, we will use two terms: First, an "open comb", where the teeth are straight and open at their free ends, i.e. with open slots between the teeth, as in the Webster definition; and Second, a "closed comb" or simply a "comb", to designate a comb where the slots are not open, but rather they are aperture, like holes, in the hard material. This could be considered as a "honeycomb", although the holes would not necessarily be hexagonal in shape and would not be located on a hexagonal pattern like the standard honeycomb. The holes would be either round as a circle, or would be as an elongated hole, as a slot. The location of the holes could be on a square pattern or any pattern that matches the pattern of the contact pads of the electronic device to be contacted. As with the pencil and guiding fingers, it is desirable to place the comb as close to the spring tips as possible. However, the location of the comb and the pinch point (see definition) would also affect the multiplication factor, controlling the magnitude of the wipe or scrub. So, we will have to make some tradeoffs to accomplish the most desirable end results.

THREADING COMB. We will, however, talk about and use an open comb for threading the springs into the Connector Comb. In this case, we will refer to such a comb, as the "threading comb".

PINCH POINT. Please see FIGS. 1 and 2. The apertures in the comb can have a cross section that looks like an hourglass, or like a trapezoid, or simply like a straight cylinder. The contact springs would pass through these apertures and as will be explained in more details in the description, they would tilt with respect to the spring axis. At one point or another, within the comb, the spring will be restrained from moving sideways during this tilting action. We will refer to such a point as the "pinch point". In case of an hourglass shape aperture, the pinch point would be the point with the smallest diameter. In case of a trapezoidal shaped aperture, again it would most probably be point of smallest diameter. In case the aperture looks like a straight cylinder, the pinch point would be an imaginary point close to the midpoint along the thickness of the comb. If the comb were composed of more than one layer of material, then the pinch point would depend on the geometry of the composite aperture. In all the above cases, the tolerances of the aperture and the spring body, as well as the clearances would slightly affect the geometrical location of the pinch point.

WIPE OR SCRUB. When we want to make an electrical connection between a wire and a surface of an electrical or electronic device, it is usually necessary to apply some pressure or force between the wire and the contact surface. If we push the wire straight against the contact surface, such as a Pogo pin, without sliding the pin along the surface, we will need to apply a considerably large force, before a good electrical connection is achieved. This is because most contact bodies develop layers of oxides and/or dirt on top of their surface. The Pogo pin will need to penetrate through these layers, in order to reach the clean base metal and to touch it, to make an acceptable electrical connection. If on the other hand, we slide the tip of the pin along the surface of the contact, then we find that a smaller force is needed to arrive at a good electrical connection. This is because when we slide the pin along that surface, we create what is known as "wipe" or "scrub". The wipe or scrub is almost like "'plowing" through dirt. It helps to remove or scrape off and to penetrate through the layers of oxides and/or dirt that form on the contact surfaces of DUTs, and to expose the clean base metal. This promotes good electrical contact. Wipe or scrub exposes the base metal and allows the contact spring to make good electrical contact to that base metal, using a smaller contact force than if we do not have such wipe or scrub.

SPRINGS VS. NEEDLES, AND WIPE VS. SCRUB. The terms ["springs" and "needles"] and ["wipe" and "scrub"] are used interchangeably in the text. My understanding, however, is that the terms "springs" and "wipe" are used more frequently when talking about "sockets" and "connectors", while the terms "needles" and "scrub" are usually used when talking about "probes". Also, the terms contact spring or contact elements will be used in this description interchangeably for springs or needles, as a general term.

DESCRIPTION OF THE PREFERRED EMBODIMENTS

While the invention is susceptible of various modifications and alternative constructions, certain illustrated embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined in the claims.

While I am describing the drawing in more details, I will at the same time explain the technology basis of the invention. I will also include a number of examples in this section, which should be considered as part of the embodiments for the purpose of this application as well. The embodiments in the section on "PREFERRED EMBODIMENT" are additional ones.

This description covers more than one invention. The inventions are based partly on the same technology platform, but then each of the inventions has some additional features of its own. Not being an expert in handling patents, I would like to leave it to the patent examiner to decide on the number of the inventions contained and how to split one invention from the other.

I will also cover in this application a number of embodiments for some of the described inventions. Some will relate to the springs arrangements, others will relate to the springs themselves, while others will relate to combs. Moreover I will cover embodiments of applications utilizing the said springs, their arrangements and the combs and then expand with additional features.

I will first describe the basic technology platform that is common to all the applications. I will use some socket embodiments to illustrate the technology. Then I will describe other socket embodiments on their own.

I will then describe each of the other applications separately.

Finally, I will describe some new features that are common to many applications.

Moreover, I will describe some additional features, related to some individual applications. These new features are not based on the common basic technology that I started with at the beginning.

(Section 1—Technology & Sockets)

A. "Staggered" and "Head-to-Toe" Springs Arrangement

Summary of the Concept

Frequently, (contact) springs have shapes where one part of the spring is large, while other parts are smaller.

For example, a compression coil spring, with a cylindrical body, has a coil (body) with a large outside diameter, while the end rod (pusher or tip) is much smaller in diameter. In other cases the spring body itself is tapered, such that one end is larger in diameter or girth than the other end; or has a double taper, where the middle is larger than the ends.

Conventional "In-Line" Arrangement

The conventional arrangement is to place the springs side by side inside pockets of the housing. All the pockets are at the same height or at the same elevation and the springs are consequently placed also at the same elevation, i.e. side by side. I would refer to such an arrangement as the "In-Line" arrangement. This creates a matrix of springs inside a matrix of pockets, all in one row at the same height. The distance between the springs will be equal to the largest diameter or girth of the spring, plus the wall thickness separating the pockets from each other plus the clearance that is needed between the pocket and the spring, to allow for free movement of the springs.

"Staggered" Springs Arrangement

Figure 5:
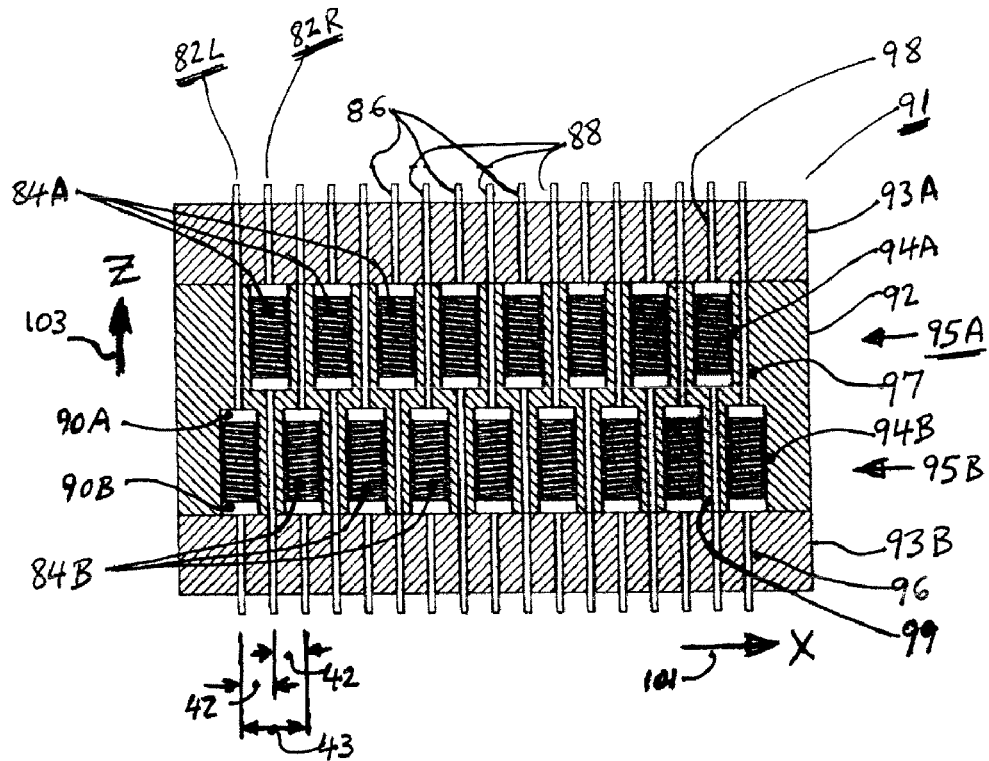

FIG. 5 shows what I would like to refer to as "staggered" springs arrangement. The springs are arranged such that they would have the large portion of the body of one spring located next to a smaller portion of the body of the adjacent spring. They would also be placed in two rows, with the springs of one row offset one half pitch with respect to the other row, as in FIG. 5. Hence the term "staggered". This is in contrast with the conventional arrangement, where all the springs are arranged such that the largest portion of each spring is next to the corresponding largest portion of the adjacent spring, which I referred to as "In-Line" or "shoulder-to-shoulder". Thus the center distance between the adjacent springs in the "staggered" or "head-to-toe" arrangement will be smaller than the center distance in as "In-Line" or "shoulder-to-shoulder" arrangement.

Application Example 1

FIG. 5 shows an example of a "socket" built according to the concepts covered here, specifically using the staggered spring arrangement.

Figure 32:
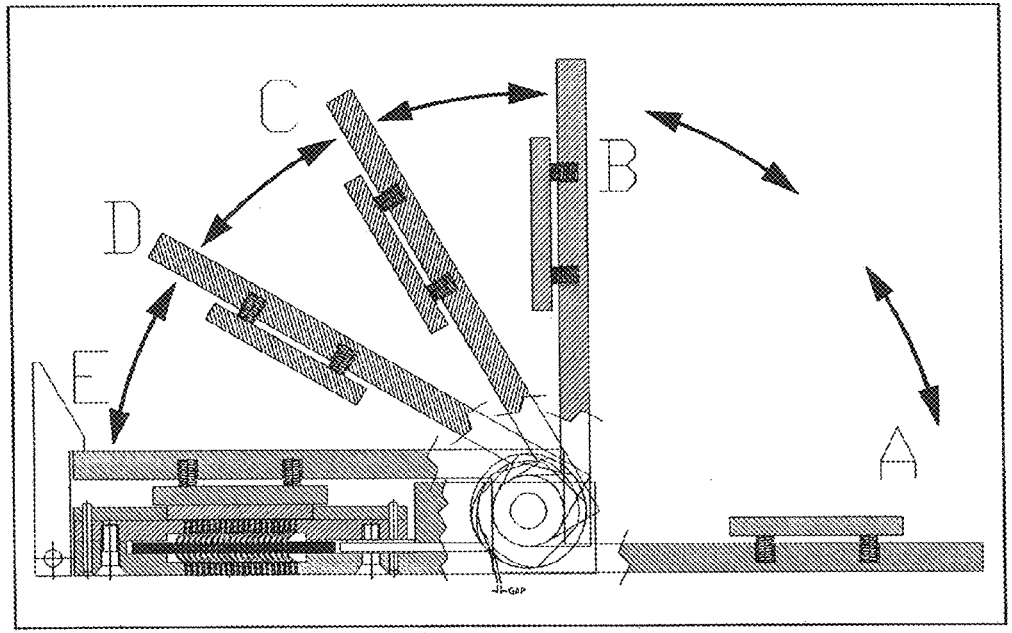

The contact springs are located inside a housing. The housing includes the upper and lower "combs" and the housing body. Depending on the application, the socket may also have a lid to push down on the DUT, a latch to hold the lid down, and other peripheral components. An example of these components is shown in FIG. 32 and will be described later.

Figure 7:
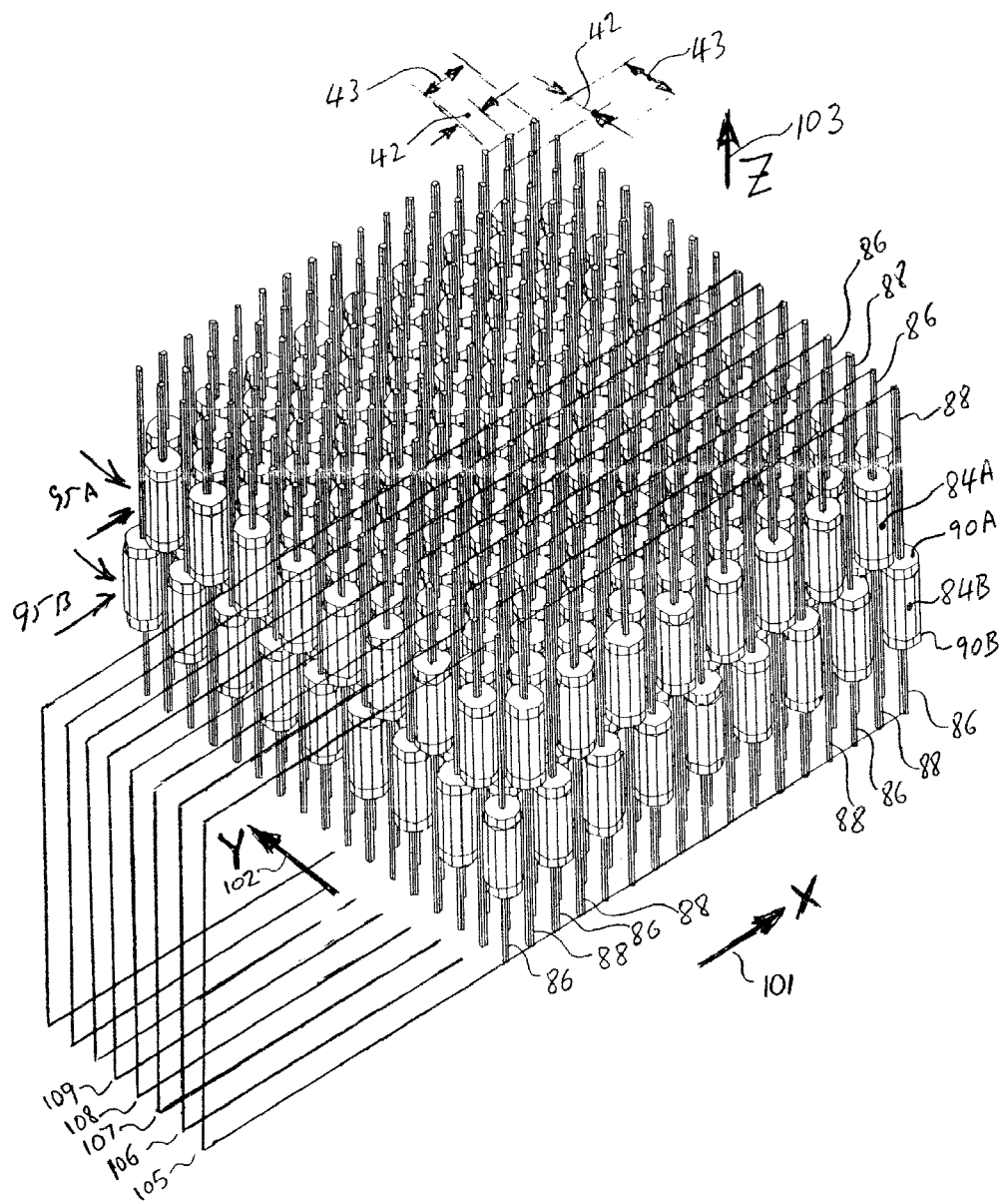

FIG. 7 shows an isometric view of the springs shown in FIG. 5, but without the housing, for clarity's purpose.

Let us also agree on the coordinate directions. If we look at the socket or the spring matrix from the top, then we will say that this is the x- and y-directions. If we look at the side view, as in FIG. 5, then the horizontal direction is the x-direction, while the vertical direction is the z-direction.

The 3-Dimensional view in FIG. 7 shows all three directions.

Figure 6:
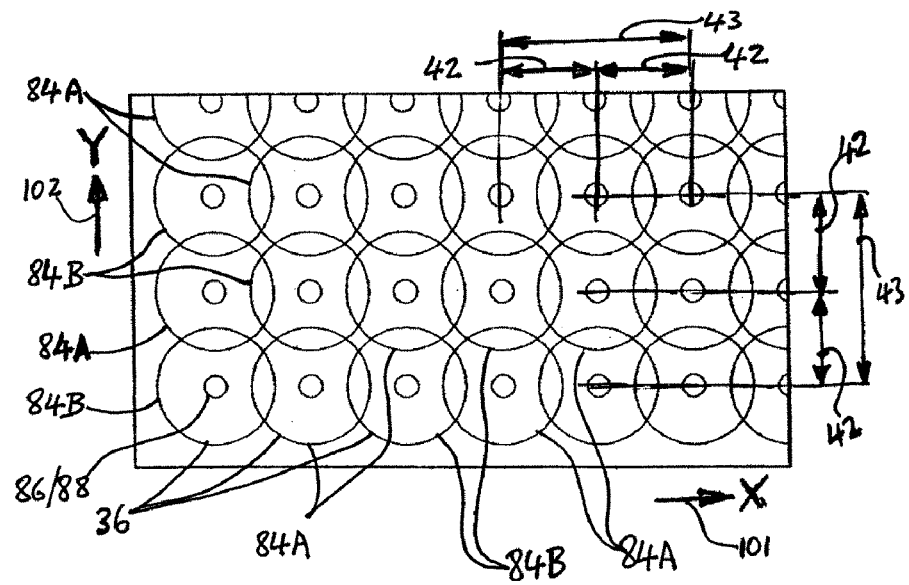

FIG. 6 shows a top view of the socket; thus it is showing the x- and y-directions.

Figure 8:
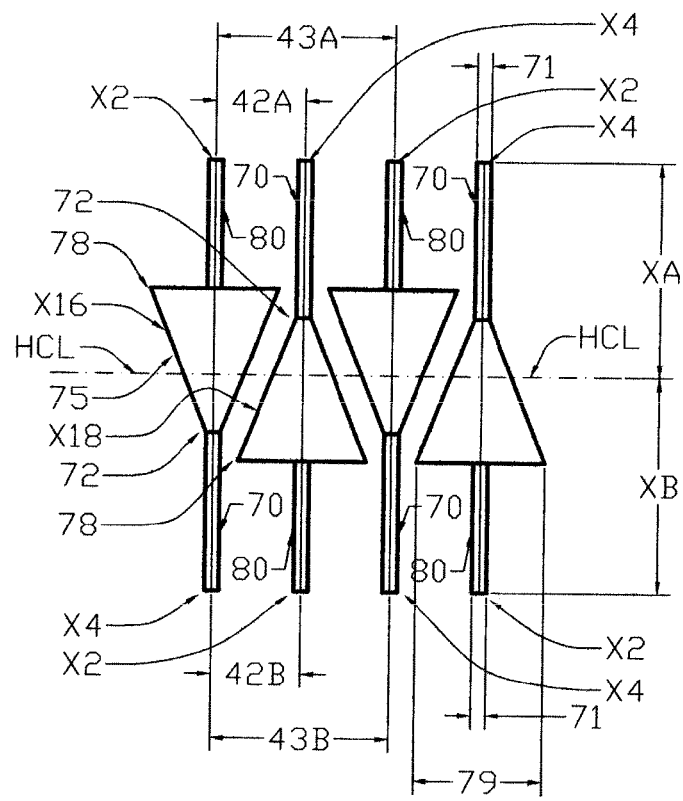

The springs in the socket, which is shown in FIGS. 6, 7 and 8, and which is according to the present invention, are arranged in a way, whereby the large portion of any spring is located next to the smaller portion of all the springs adjacent to it. The springs are placed in two (or more) rows, staggered in height (elevation). The pushers are elongated enough to reach their respective contact pads. The basic concept is to stagger and/or offset the contact springs, thus reducing the "effective" footprint and pitch.

The top row is offset sideways, in the x-direction, by a distance equal to half the pitch with respect to the lower row, and the pushers of the contact springs are extended to reach both the top and bottom surfaces of the housing. The pushers will then protrude further, to make contact with the devices that will be contacted by the springs. These pushers are now practically at almost twice the density of the conventional method, in each of the x and y directions.

Now Some More Details

FIG. 5 shows a cross-sectional side view of the "staggered" arrangement. This method applies to coil springs, "Pogo" pins and other similar springs, where the spring has a relatively large size body and a relatively small size "tip".

FIG. 7 shows a 3-Dimensional view of the springs. The housing has been removed simply to be able how the springs are arranged. The first row has been described earlier. The second row would be similar to the first row, but turned up side down, so that the adjacent springs in the y-direction would also be staggered. The third row will be arranged like the first, and the fourth row will be arranged like the second, etc. In other words, all odd numbered rows, in the y-direction, would look alike and all even numbered rows would look alike.

FIG. 6 shows an enlarged top view of the above socket. It shows the improvement in density. It also shows how the footprint of one spring looks as if it is encroaching on the footprint of the adjacent springs. This is simply an illusion. We know better now. Since the springs are staggered in the elevation, they do not interfere with one another.

There are, however, some limitations or disadvantages to this arrangement of pins. First, the total height of the socket will be increased. For testing and burn-in, this should not be a serious problem. Additionally, springs could be made fatter and shorter reducing the overall height. Second, the total path for the electric signal will be longer. This creates additional electrical path length, and additional inductance and/or impedance. The electrical path can be shortened by plating the inside surfaces of the pockets, thus reducing the effective electrical path length. Creating electrical paths that can be provided inside the barrier walls, between the pockets, and that do not touch the insides of the pockets may achieve additional improvements. This could then be electrically connected to ground, acting as an electrical barrier or shield against stray electrical signals or noise.

"Head-to-Toe" Spring Arrangement

The "head-to-toe" arrangement, according to the present invention is illustrated in FIG. 8.

In some cases, the spring main body shape or "envelope" may look more like a triangle, as in FIG. 8, or a trapezoid or diamond-shape, where the body is wider at one point than at another point, but where the push rods are still thinner than the general main body. In such a case, the springs can still be arranged in a staggered form, as above, but we can benefit even more from their peculiar shape and arrange them, as in FIG. 8. I refer to this as the "Staggered Head-To-Toe", or simply the "Head-To-Toe" arrangement.

This arrangement would not only reduce the center distance between the springs, but will also reduce the total height of the whole arrangement.

1. B. "Parallel Nesting" Spring Arrangement

Summary of the Concept

An alternate approach is to use parallel nested springs. The parallel nesting arrangement utilizes springs that are formed such that they can be arranged side by side at close proximity and can be nested into each other, thus occupying less space than if they were not nested inside each other.

The concept of parallel nesting is really not new. What is new is applying the concept to contact springs in the context of this invention/application.

The concept is similar to the following very obvious examples. When we stack dishes in a cupboard, in essence we parallel nest them. When we have a stack of paper or plastic cups that are shaped to suit the purpose, we are parallel nesting them. When we stack metal chairs on top of each other, again, we parallel nest them. Plastic forks or spoons that are sold in small container would take a much larger space, if they were not parallel nested.

In all these examples, if we did not nest the objects "inside" each other, they would occupy a larger space. Looking at it in a different way, we can say that the (center) distance between any two adjacent objects is much smaller if they were parallel nested, than if the objects were placed side by side without nesting, or if they were simply thrown in next to each other at random.

The above, then, will be our definition of "parallel nesting". (See also the "DEFINITION" section.

The concept of this invention is basically an extension of the idea of parallel nesting, applying it to springs that can be used to connect electrical devices. In addition, the invention introduces other features, as will be explained below.

Each spring constructed in accordance with the present invention is shaped such that it can be parallel nested, so as to occupy a smaller effective space, than if the springs could not be parallel nested.

An additional, optional, feature of a spring constructed in accordance with the present invention, is that the spring would be basically a slender column that has one or more portions of its length offset eccentrically away from the spring axis, to ensure that the deflection under external forces will occur in a gentle and predictable fashion.

The springs can be wire formed or stamped. The springs can be shaped like a "C" or a "Chevron" or a variety of shapes as will be shown later. They would have a "belly" that protrudes usually beyond their effective "pitch" and encroach on the footprint of the adjacent spring. However, since all the springs are parallel and nested in the same direction, they would not touch.

Please notice also that these are "discrete" springs, each one "addressing" a particular contact point on the DUT. This is in contrast to some "random" distribution of springs inside a carrying layer of elastomeric material or the like.

Illustration Example

FIG. 9 is an illustration of parallel nested springs. In this case, the springs are "C"-shaped. They are shown under No-Load, i.e. with no deflection.

Figure 10:
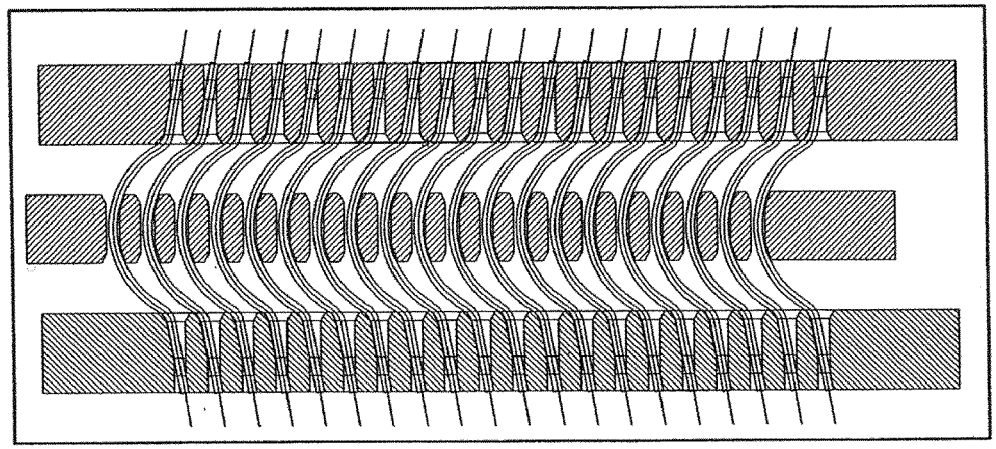

FIG. 10 shows the same springs, but under some load. The natural tendency of such springs, when compressed by an axial load, is to deform as shown. Their bellies have bulged, but because they are all parallel and nested in the same direction, they still do not touch. The tails of the springs tilt when compressed, as shown. Please notice the somewhat slanted hourglass shape of the holes in the top and bottom combs. This shape does not "fight" the natural tendency of the springs tails to rotate or tilt.

Wipe or Scrub

Assuming that the device under test (DUT) to be contacted by these springs is "fixed" horizontally or "guided" with respect to the combs, then the compression of the springs creates a horizontal relative motion between the spring tips and the contact pads of the DUT. This relative motion creates a "wiping" or "scrubbing" action. This is very desirable. (See also the "DEFINITIONS" section).

The wipe or scrub is almost like "'plowing" through dirt. It helps to remove or scrape off and to penetrate through the layers of oxides that form on the contact surfaces of DUTs, and to expose the base metal. This promotes good electrical contact. Wipe or scrub exposes the base metal and allows the contact spring to make good electrical contact to that base metal, using a smaller contact force than if we do not have such wipe or scrub.

We will talk more about wipe and scrub, when we describe the "probes".

Application Example 2

Figure 11:
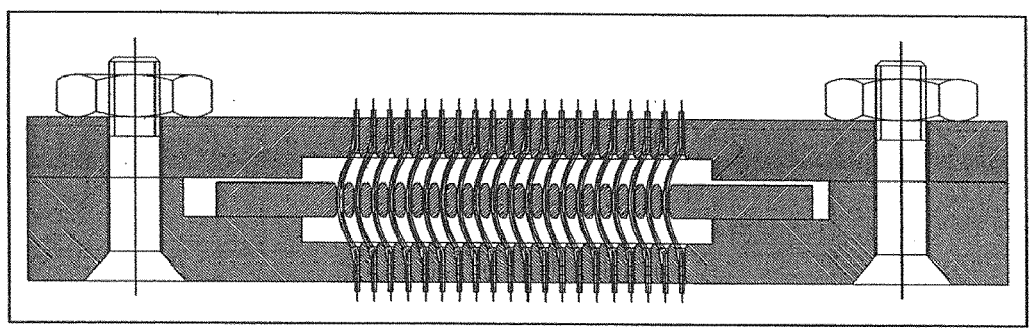
Figure 12:
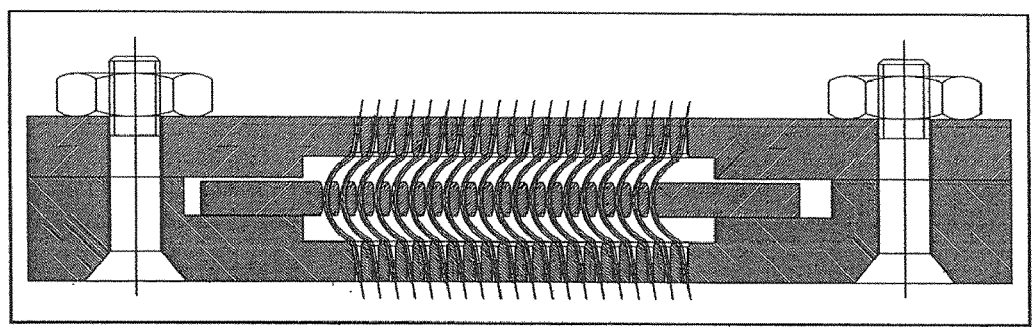

FIGS. 11 and 12 show a socket implementation containing a matrix of 20 by 20 "C" springs. We are looking at a side view in the x-z directions. This shows only one row of 20 springs. The other rows are behind and are hidden.

FIGS. 21 through 24 and 30 and 31 show the top view of similar sockets, showing the full matrix.

Figure 21:
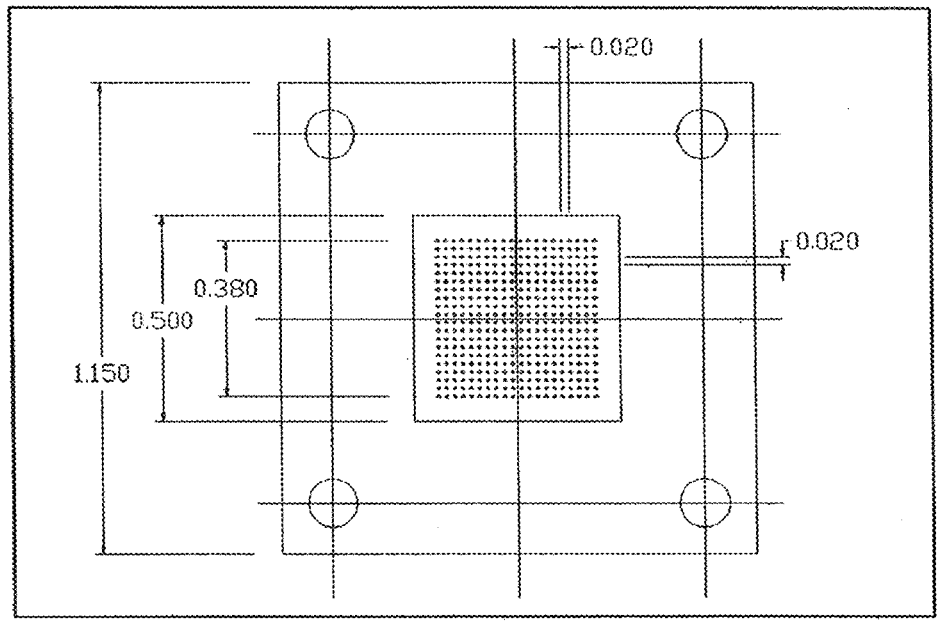
Figure 31:
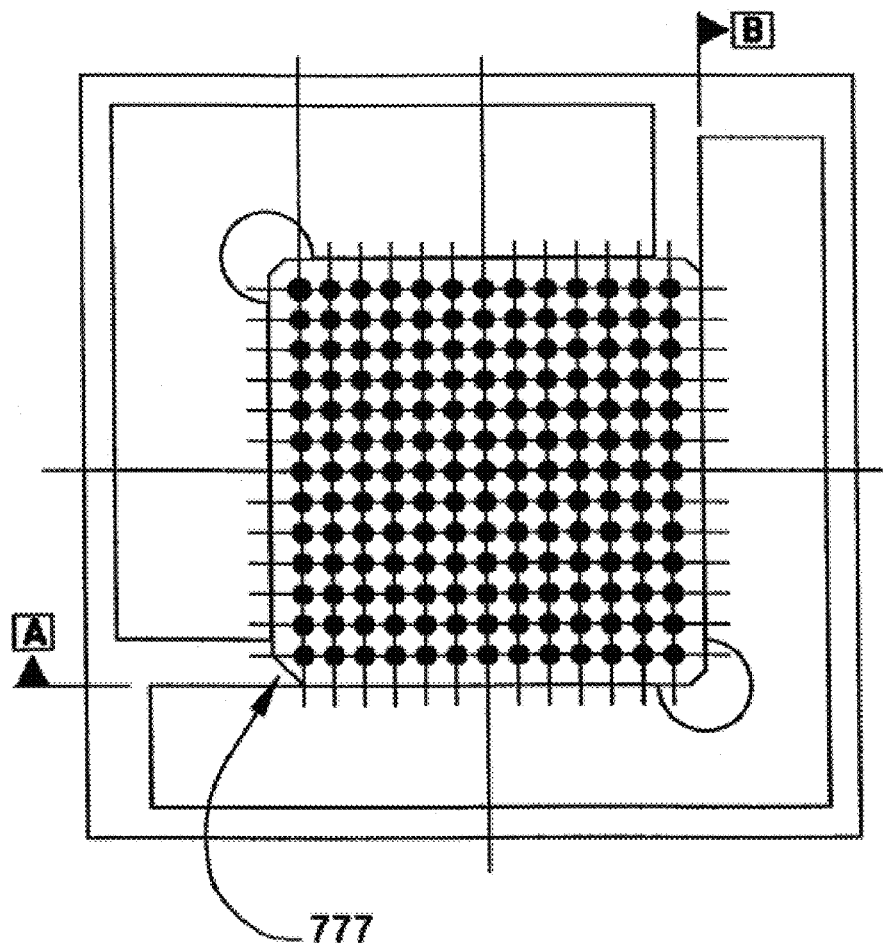

FIGS. 21 and 31 shows the top view of the socket, with the 20 rows, each having 20 springs.

The springs are shown in a "parallel nesting" arrangement, held in place with two combs. We also see a middle member.

The middle member in FIGS. 11 and 12, called a "slider", moves back and forth with the movement of the bellies of the springs. The springs can slide and move freely through the holes of the slider, as well as through the holes of the top and bottom combs.

The slider has a number of functions. First, it keeps the springs "organized". Second, it helps to prevent the springs from touching each other and "shorting. Third, it has another function, which will be described later in conjunction with the "retracting springs", which will be described later in connection with FIGS. 32 through 35.

In this FIG. 11, the springs are under no-load. The tips of the springs are shown protruding beyond (above and below) the respective combs.

In a typical application the socket would be mounted on top of a load/test board, with the DUT on top of the socket, held in place with a top pressure means applying force on top of the package against the socket springs. The springs would compress as they contact the DUT and the test board.

Other Embodiment Examples

Figure 13:
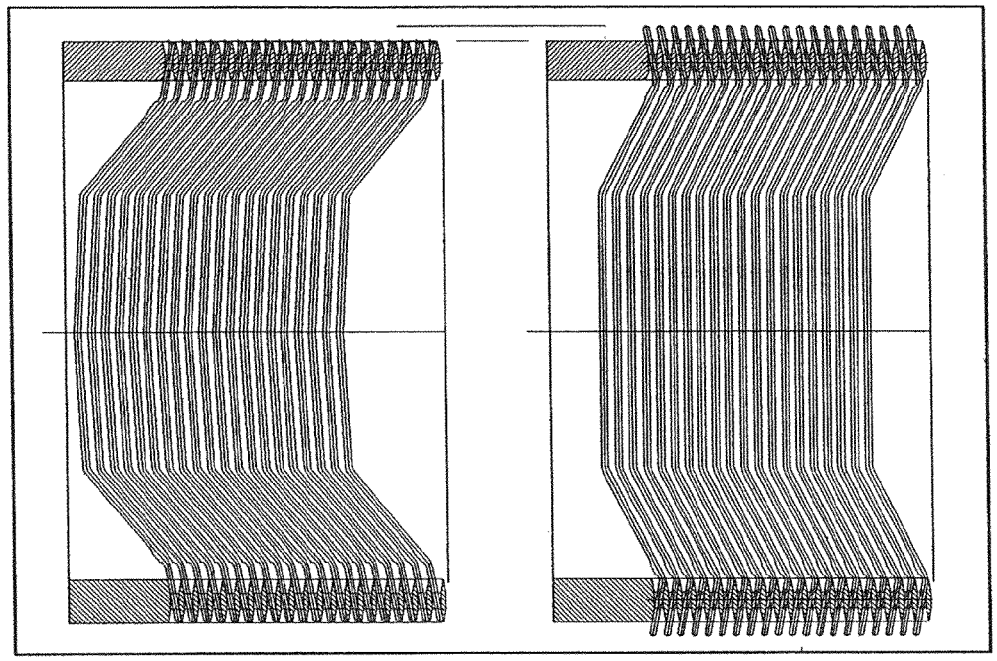

FIG. 13 shows another shape of springs that can be used to make high-density sockets. I refer to this shape as the "chevron" springs. These springs can be "stamped" or "wire formed" and are obviously "parallel nested".

Under compression, we notice two things. First, the belly of the springs protrudes to the side and the tips of the springs move sideways to create a desirable wiping action.

Figure 14:
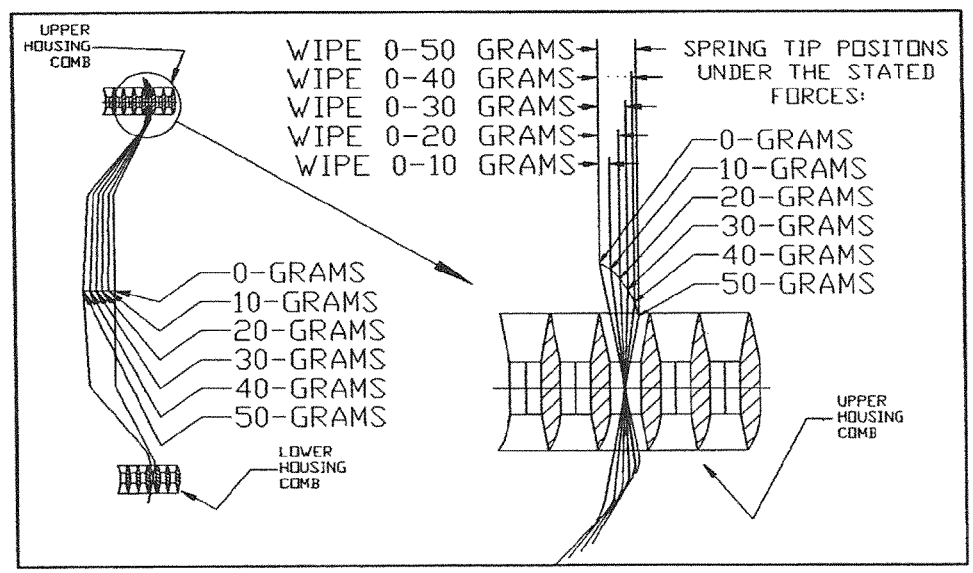

In FIG. 14 an individual "chevron" spring is analyzed in detail as it deforms under an applied force. In order to see clearly what is going on, I am showing only the centerline of the spring. As the spring is deflected, the belly bulges from its "free" position (under No-Load or Zero-Grams force) and moves to the left, while the tails of the spring tilt. The tip of the spring, which will touch the DUT, moves inwards and sideways to the right.

The enlarged view shows the tip of the spring and the effect of spring deflection on the movement of the tip. The spring is in its comb that controls the horizontal position of the spring. When the spring is compressed inwards under the increasing load, its tip moves sideways, horizontally to the right, at the same time. This creates a desirable "wiping" action.

Figure 15:
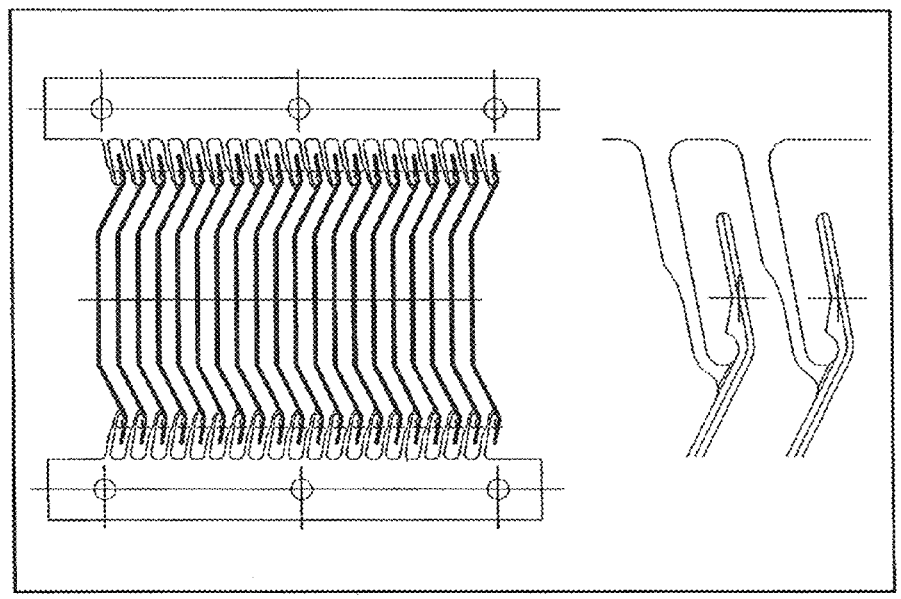

FIG. 15 shows stamped chevron springs on carrier strips. The figure on the right-hand side shows some details of the tip. Please notice especially the tapered "barb" at about the end of the tail, just before the beginning of the shoulder. This would help in locating and retaining the springs in a socket. It also has another benefit. It can create a pre-load on the springs, so that we would need a smaller amount of deflection to reach the desirable contact force.

Spring Curves & Behavior

When the springs are loaded, by applying an external compressive force on their tips, they would deflect. On one hand, they appear as if they were columns buckling under a compressive force, but in reality, because of the preformed shape of the springs, they operate more as bent or formed beams under axial loads. The belly portions can be stress analyzed as a beam, or as two cantilever beams attached together at the center of the spring.

The biggest benefit is that their force-deflection curves are usually gentler than in the case of pure columns. See "Background" for a detailed description of the behavior of a column, as compared to a Chevron spring that I will describe here.

The spring curve of a buckling beam in general is not desirable for electrical contacts. See explanation in the "BACKGROUND" section.

Figure 16:
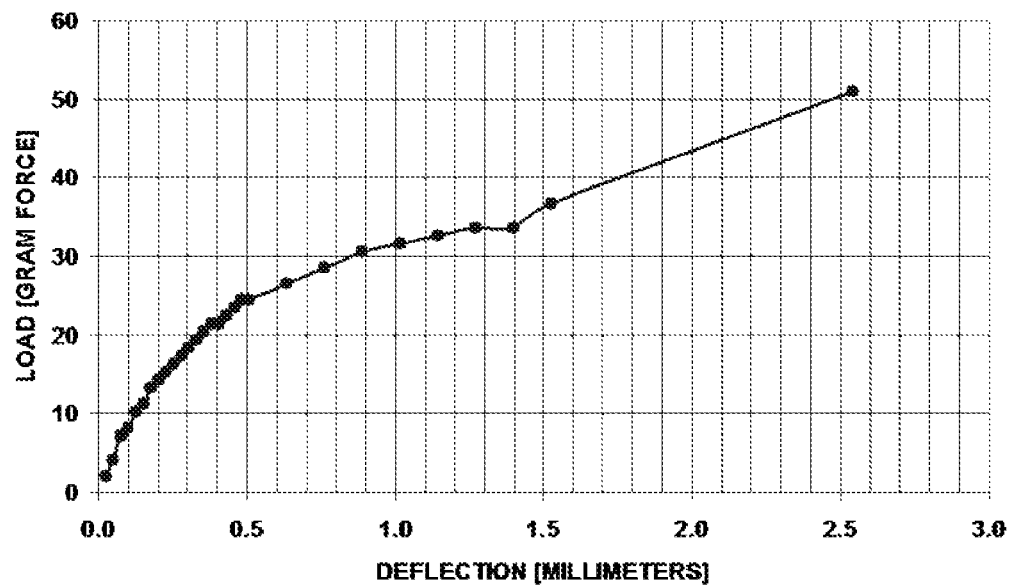

A typical example of the force/deflection curve of a Chevron shaped spring is shown in FIG. 16. Notice that the curve starts at the origin, point 0,0. The curve rises at some steep slope for some amount of deflection, as for a slightly stiff spring. Then the slope gradually flattens out and the springs behave like a softer spring. The interesting thing is that the curve is still rising, though at a smaller rate. The curve is continuous, and its slope is always positive.

Figure 17:
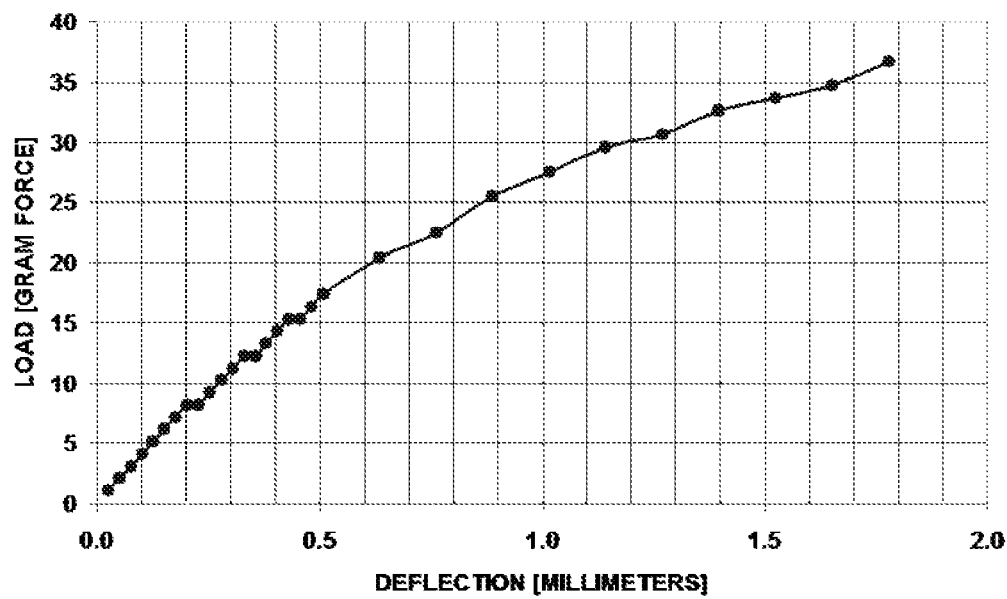

FIG. 17 shows a typical curve for a "C"-shaped spring. It too has some flattening at the top of the curve, albeit not as pronounced as the Chevron spring in FIG. 16.

In both these cases, the spring curve is desirable for electrical contact springs.

Design Verification

In conjunction with Point Technologies, Inc., a manufacturer of miniature springs and needles, we have made several springs of various shapes and sizes, and tested them for the sockets and probes applications.

The key points are:

Spring forces are available in a wide range.

Spring designs are able to obtain proper force deflection performance.

Wiping action is achievable and predictable.

Spring "Force-Deflection" Curves

I will describe the following two charts as typical examples of what can be obtained in practical applications.

According to this invention, sockets can be designed with springs that need with contact forces that can vary from as low as 20-30 grams to over 250 grams. Probes can be designed with springs with smaller forces down to single digit grams.

FIG. 16 shows the Force-Deflection curve for a "Chevron" shaped spring (sample #2), made of Tungsten, with a wire diameter of 0.008" (0.203 mm). The flex portion was approx. 0.750" (approx. 19 mm) tall, with a belly of approx. 0.100" (approx. 2.5 mm). The total length was approx. 0.375" long (approx. 9.5 mm). The spring provides a force of over 50 grams at a deflection of approx. 2.5 mm.

The non-linearity of the slope is very desirable. The curve has a steep slope at the beginning, and then its slope becomes shallower as the deflection increases. The spring provides a high force at the beginning of the application as it starts to make contact with the package or substrate. This helps in breaking through the oxide layers, etc. Then, the force stabilizes, (does not change much for relatively larger deflections), which compensates for any non-planarity of the package or substrate. This is very desirable, because it reduces the total force required to hold down the DUT in the socket.

FIG. 17 shows the Force-Deflection curve for a "C" shaped spring. This is spring sample #6, also made of Tungsten, with a 0.008" (0.203 mm) diameter. The flex portion was approx. 0.625" (approx. 15.9 mm) tall, with a belly of approx. 0.150" (approx. 3.8 mm). The total length was approx. 0.200" long (approx. 1.9 mm). We can get approx. 37 grams force at a deflection of approx. 1.8 mm. The total force of this spring is not much different than the Chevron spring but it is applied more linearly.

Materials

A number of materials are available to make the springs. They include the following:

Beryllium-Copper (BeCu), which is used very frequently to make contact springs.

Phos-Bronze, which is low cost and suitable for relatively large springs

The Neyoro G, the Paliney 6 and the Paliney 7 materials, which are made by Ney Metal Co, and which are also good spring candidates.

However, for very thin springs, Tungsten is preferable, mainly to take advantage of its higher strength. In other applications, springs may be made of aluminum, copper, or they can be wire-bonded directly to the components.

Still More Embodiments

Figure 18:
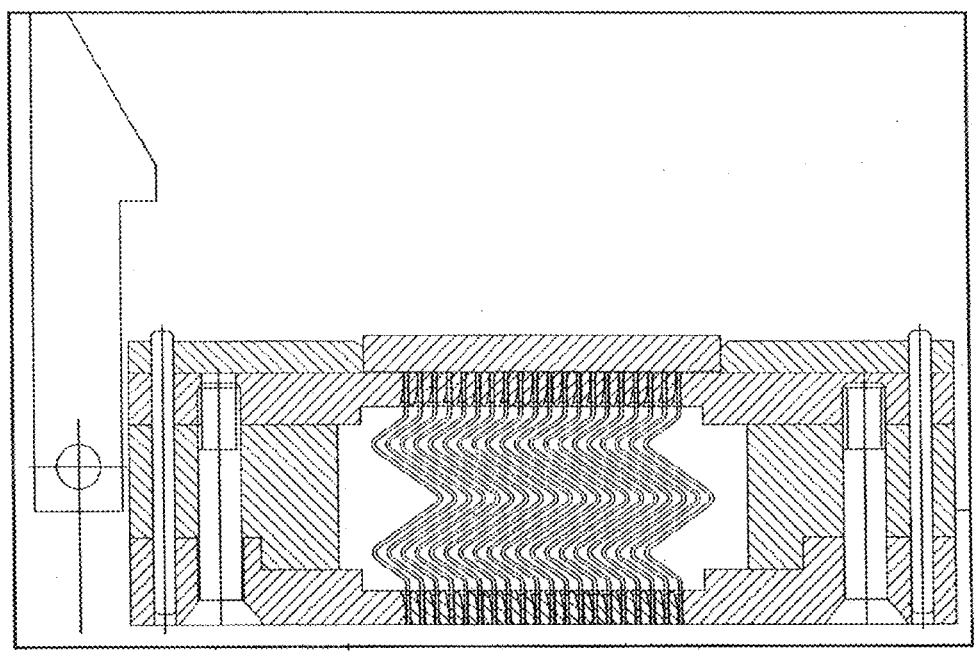

FIG. 18 shows a socket with springs that have a shape called "3-VEES". This spring shape reduces the amount of wiping action. This effect may be desirable in certain kinds of applications.

Figure 19:
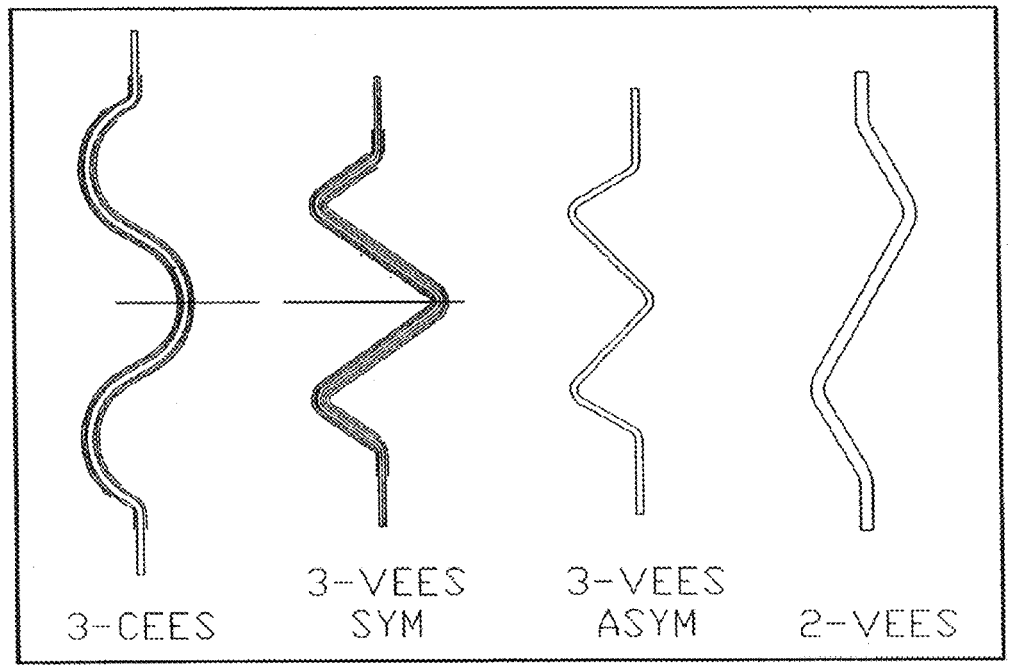

FIG. 19 shows other shapes of springs that can be used for various applications. They all can be "parallel nested". They are called "3-Cees", the "3-Vees" Symmetric,", the "3-Vees" Asymmetric and the "2-Vees" respectively.

All these springs still behave and have their force-deflection curves as a formed beam, not as a straight column. And also their shape obviously allows parallel nesting.

Spring Design Trade-Offs for Parallel Nesting

Figure 20:
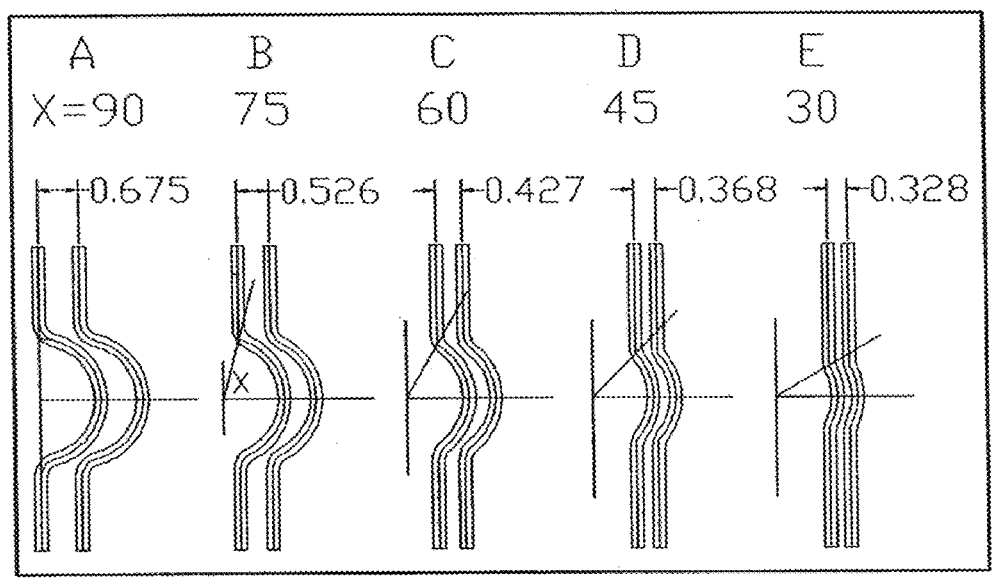

If we compare the springs in the previous figures, their shape in general and specifically the shape of their "bellies" can be optimized for pitch, spring compression and wiping action. FIG. 20 shows a number of C-shaped springs. Their bellies are arcs or segments of circles, with varying amounts of protrusion. We can identify the shape by the included angle "X" shown in spring B. (See "DEFINITIONS"). In this case, this angle X equals the nesting angle.

For clarity, the springs shown in FIG. 20 were drawn with a wire diameter of 0.200" (approx. 5.080 mm). The radius of the circle is 1.000" (approx. 2.540 mm). The angle "X" is varied from 90 to 30 degrees. Two similar springs are placed next to each other in order to determine how small a "pitch" we can achieve with each pair of springs.

Nesting Angle [NA]

The "best geometry" of parallel nested springs is achieved when the springs have the desired spring force/deflection characteristics and at the same time, the smallest pitch and the proper allowance for non-planarity. It is a trade-off. In general, the nesting angle should be equal to or less than 60 degrees. An angle of 45 could be a good trade-off between spring characteristics and pitch. An angle of 30 degrees increases the stiffness of the springs, but reduces the pitch even more yet. The same conclusion applies to other shapes including the Chevron or the 3-Vees springs, etc.

In general, a smaller nesting angle would give us a smaller pitch, but would make the springs stiffer. We can compensate for that by making the spring longer or making the belly of the spring deeper, so as to make the spring softer and still keeping the small pitch.

Visual/Perceptual Interference

FIG. 21 shows the top view of a typical socket. It shows the top comb, with the holes through which the springs protrude. In this specific example, the center distance is 0.020" (approx. 0.508 mm) in both the x- and the y-directions. Above the top comb is a locating plate with a "window" or "nest", which would receive the Device under Test. The nest here is shown as a 0.500" (approx. 12.70 mm) square opening. The dimensions shown here are arbitrary, selected simply to illustrate the concepts.

Figure 22:
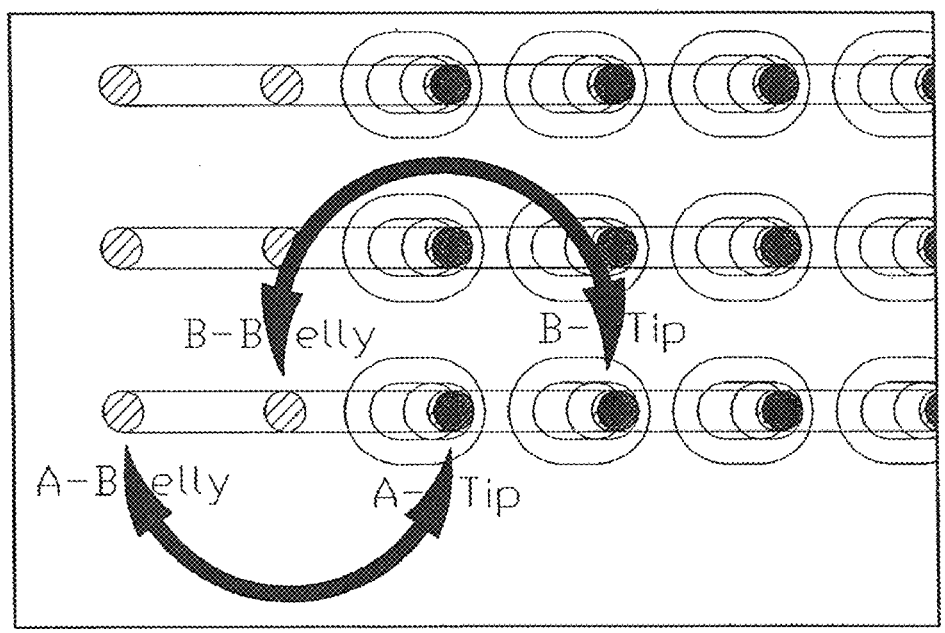

FIG. 22 shows a detailed close-up view of FIG. 21. Shown are springs near the bottom left-hand corner of the top comb and the springs underneath it. It also shows the footprints of the springs under the comb, as if the comb is transparent. The dark, full circles are the upper "tips" of the springs. The crosshatched circles are cross-section of the "bellies" of the springs underneath the comb.

Highlighted are two springs "A" and "B". It is obvious that the bellies and bodies of the springs look as if they overlap and interfere with each other, but in reality, we do know now that they are parallel nested. Hence, no problem.

We can also notice that each row of springs is completely independent from the adjacent rows.

Reducing the Pitch by Approximately 30%

Figure 23:
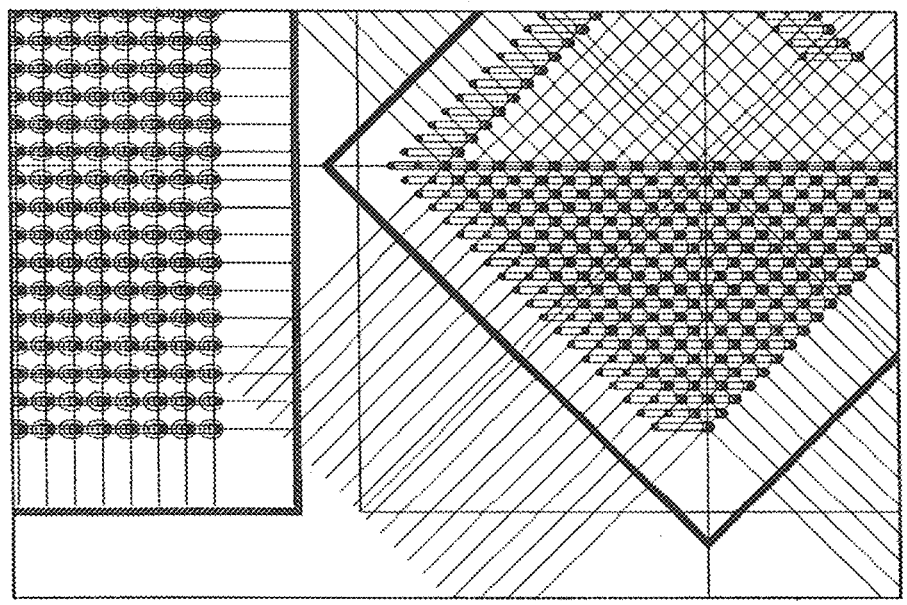
Figure 24:
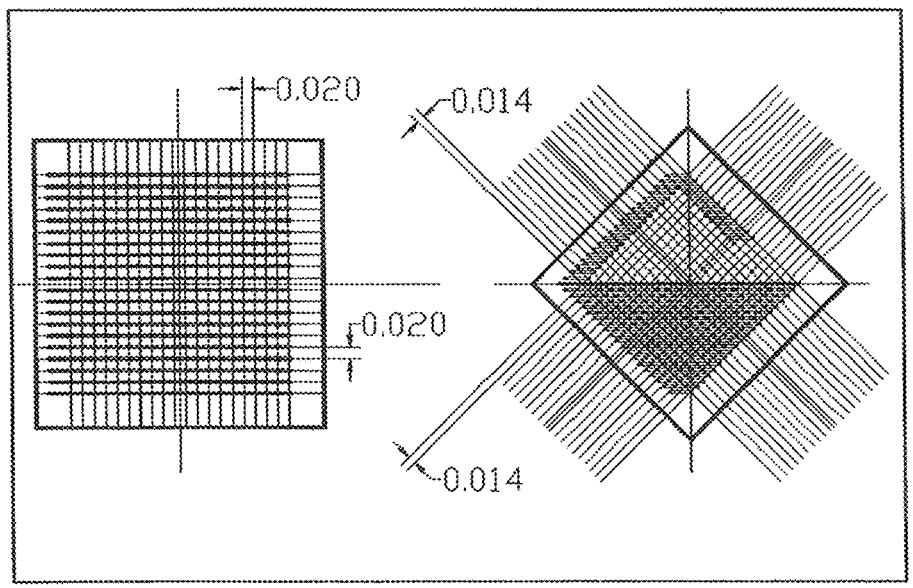

FIG. 24 shows the matrix with its 0.020"×0.020" (approx. 0.508×0.508 mm) pitch. The centerlines of the rows and columns are orthogonal and are either horizontal or vertical. The bellies of the springs are along the same directions of the centerlines. Refer also to FIGS. 21 and 22. In this case, the bellies are along the horizontal axis. At the right-hand side of the figure we show the same set of springs, but arranged along centerlines that are at 45 degrees diagonal to the previous arrangement. The pitch between the springs now has been reduced from 0.020" (approx. 0.508 mm) to approx 0.014" (approx. 0.356 mm). This is approximately a 30% reduction in pitch. FIG. 23 shows a close-up view of FIG. 24.

Please note that the pitch of 0.020"×0.020" was selected simply to illustrate the method, by using a pitch size that is easy for the calculations. Similar results will occur if we select any other pitch. Also, the present invention is geared for small pitches, down to half or quarter the one used in this example, and even smaller yet.

Bundling or Encapsulation

Figure 25:
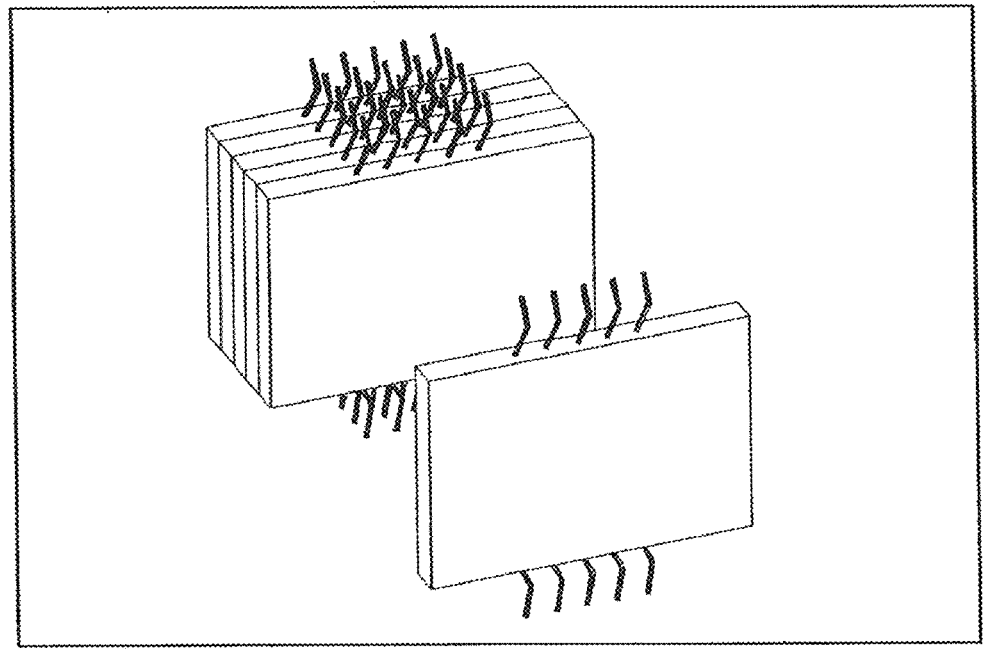

For ease of manufacturing and assembly, the springs can be pre-assembled into a block as shown in FIG. 25. For clarity, the springs are shown here farther apart than they would be in an actual application. A single "slab" can be combined with other slabs into blocks for ease of assembly. In an application where the pitch is relatively large with respect to the spring wire diameters, we can go directly to the block form, bypassing the use of individual slabs.

The material used to "bundle" the springs as shown can be a very soft elastomeric material, or a gel, or even very fluffy foam. It is simply a way to keep the springs together until they are installed in place into their socket housing. We do not rely on the encapsulant to provide or to apply any appreciable force, if any, during the operation of the socket.

Figure 26:
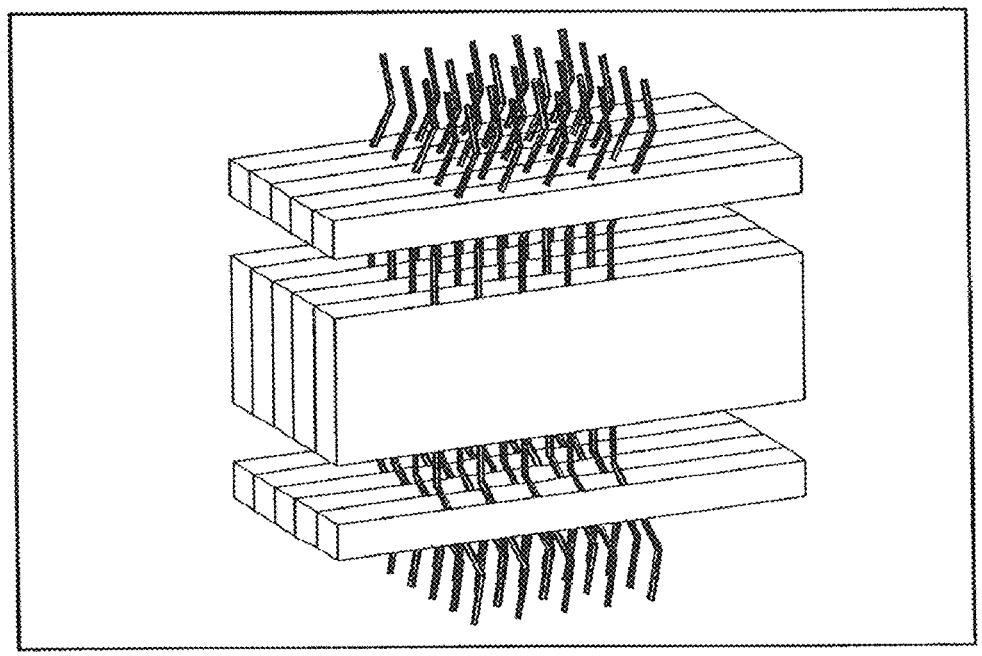

FIG. 26 shows another alternative with the encapsulant in three distinct parts. The two gaps between the three different parts would help in the manufacturing process. They allow us to use "spacers" and other fixturing means during the manufacturing or assembly operation. The encapsulation can serve an additional purpose, which is to act as a conductive shield or ground, as will be explained later.

Alternatively, we could use a "wax" as the encapsulating material. Then, after the springs are fully assembled inside the housing, we could melt the wax and remove it. This would be similar to the "lost wax" process used in certain operations in the industry, like in "investment casting".

Application Example 3

Figure 27:
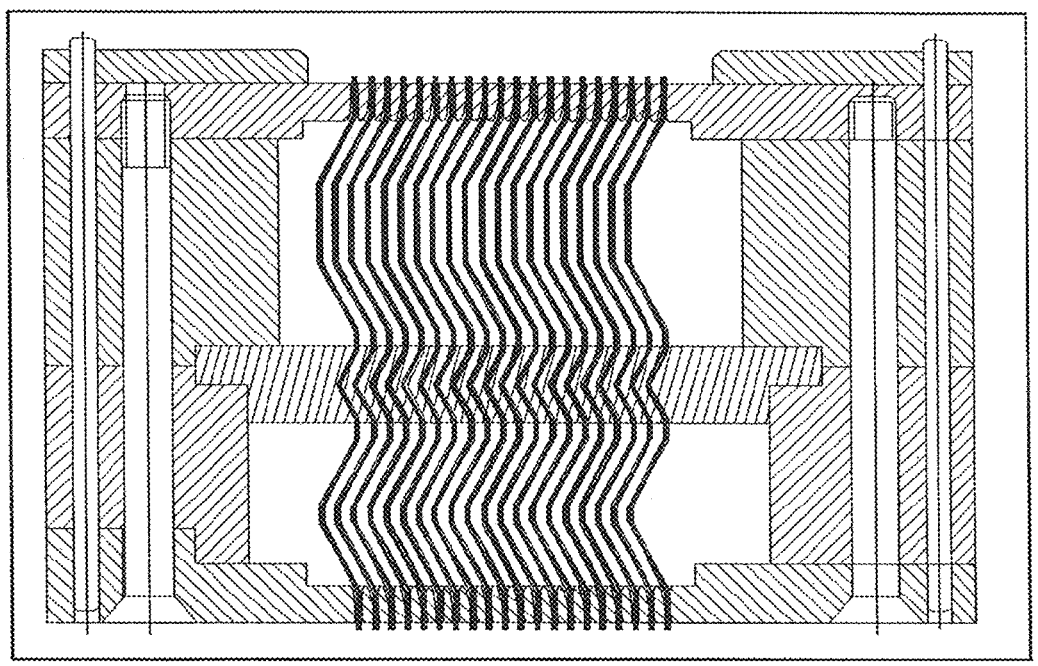

FIG. 27 shows another example of a socket as per this invention. Here, the springs are fixed somewhere close to the center of the socket by a holding means. The portions of the springs above and below the holding means are shaped as Chevron springs in this case. Each portion above the holding means flexes independently from the portion below the holding means.

We can retain the springs in the holding means by a number of methods. We can insert mold the springs in the holding means. We can do that for one slab at a time and then stack the slabs together, or insert mold them as one block in one shot. Similar to the encapsulation method.

We can also mold the holding means into individual slabs, with appropriate groves in each slab, and then snap the individual spring in its respective grove. This would also allow us to populate the slabs either fully or at specific spots, for a specific reason. Basically, it is so that the springs locations would match the locations of the contact pads of the DUT.

We could also insert the springs into slabs with groves or force the springs into blank slabs, almost like a flat sheet of plastic, by the use of ultrasonic means or the like. See FIGS. 41 through 45 for slabs with groves.

We could also make the slabs to have two layers of springs, one layer on each of the two faces, and then stack them next to each other, placing some spacers between them to ensure that the pitch between the springs is as needed.

Insert Molding

Encapsulation may not be needed to hold the springs together if we use the insert molding process. FIG. 27 shows that the springs will be attached at one point to the holding means and the opposite ends of the springs are free to protrude through the respective combs, as shown. In this figure, we also notice that the portions of the springs below and above the carrier are not equal in length. We may use such different length springs if the mating devices at the top and bottom of the socket have varying amounts of non-planarity. Each length of spring accommodates different amounts of non-planarity and applies different amounts of force.

In this case, the molded holding means is fixed to the housing and the springs on each side of the carrier act independently from each other. A slider can be used to retract the top portion of the springs, if desired.

Mounting of Socket to Substrates

Sockets may be soldered to the board by adding solder tails to the springs inserted in through holes in the printed circuit board or may be surface mounted.

Application Example 4

Figure 28:
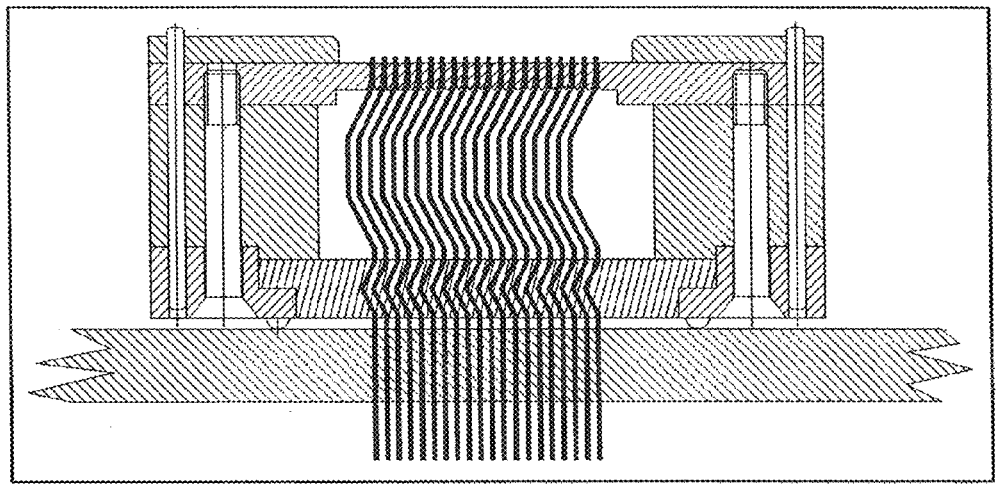

FIG. 28 shows another socket according to the present invention, where the springs have solder tails.

Application Example 5

Figure 29:
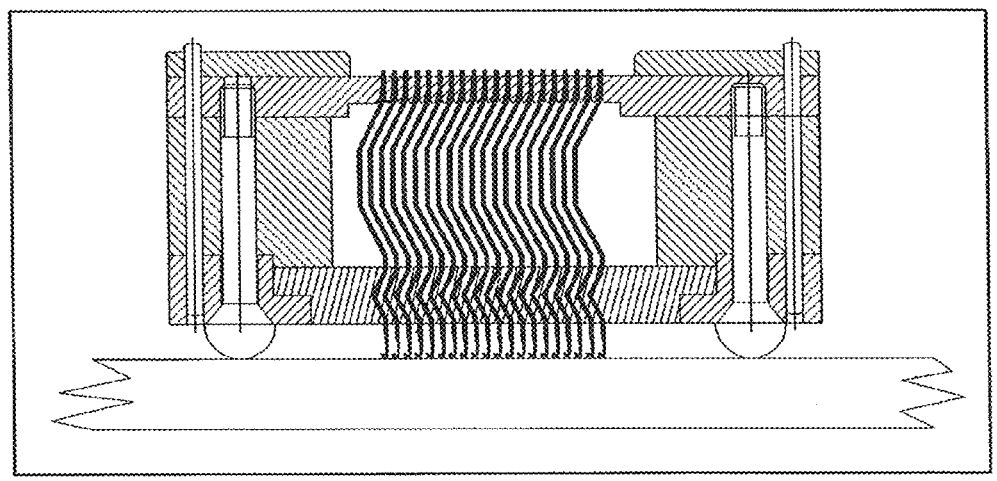

FIG. 29 shows yet another version of the socket according to the present invention, where the springs are ending in "J-leads", or the like, to be surface mounted to the PCB.

Application Example 6

In most of the above examples, the DUT would be placed in a nest, to hold it on top of the springs, and in registration with the springs tips.

Figure 30:
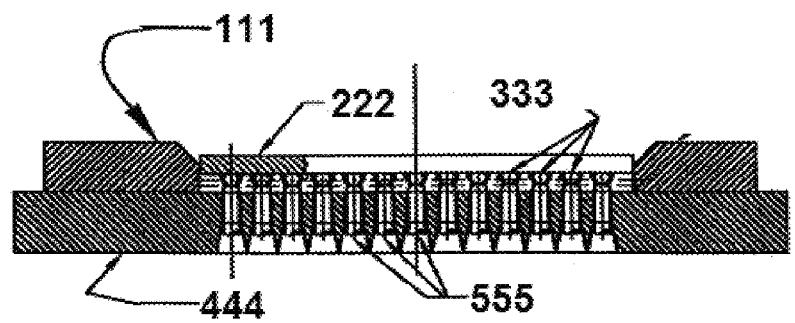

The DUT can be a BGA, a substrate, a chip or the like. Most of these devices are controlled by Industry Standards. JEDEC for example have standards for BGAs. FIGS. 30 and 31 show a BGA sitting in a nest on top of the springs tips. The nest is also shown. Here, the nest is made out of two parts, which we could call jaws. One jaw is "fixed", while the other slides out and in, to allow the package to be inserted and then be clamped in place.

To enhance the registration and to minimize the effect of tolerance build-up, it is recommended to use the fixed jaw of the nest as the "datum", and to place the BGA such that the datum of the BGA would coincide with that of the nest. According to JEDEC, this would orient the BGA to be positioned as shown in FIG. 31. In this case, the "A1 Corner" of the BGA should be at the bottom left corner, as shown.

Insulation, Shielding and Impedance Control

All the springs can be individually insulated by using a thin cover layer of plastic. It is possible to shield and ground the contacts by coating the springs with a conductive layer on top of the insulating layer. This would create an electrical conductor similar to a "coax cable".

The insulation can be achieved by a number of different ways. For example, the portions of the springs that need to be rendered non-conductive can be oxidized chemically or by any other means to make them non-conductive. Similarly, the conductive layer can be applied over the insulation by either Electroless nickel plating, or by vapor deposition, by plasma, or any other suitable method. Also this conductive layer could be selectively concentrated more along the mechanical neutral axis of the springs, where the deflection is minimal, to minimize cracking of the layer due to the bending and flexing of the springs.

Another alternative is to have an encapsulant surround a number of springs, or all of the springs, where the encapsulating material can be "conductive". The encapsulation can then be "grounded". This would provide "electrical shielding" from stray electrical signals and noise, and the springs would then behave as shielded "coax cables", and would have a "controlled impedance".

We can take advantage of the geometry of the springs and the way they are mounted in their housing, to improve their electrical performance. The springs are arranged in rows and are "in-line" and have a gap or space between each line and row of springs. We can provide a layer or sheet of conductive material, placed between the rows of springs. This can act as a shield or ground layer to electrically isolate each row. Effectively, we would have a situation almost similar to "microstrips". If the individual springs are insulated, then the ground layer/sheet can be a simple thin sheet of metal, or a number of wires or a mesh, or even a layer of conductive plastic, connected to an appropriate ground point. If the individual springs were not insulated, then the ground plane would be insulated on any side that faces such springs.

If the application requires additional shielding, we can use some of the springs to act as a ground. In other words, we would have one spring for signal and the adjacent spring for ground, etc. This can duplicate the effect of the ground plane mentioned above. Furthermore, we can use this scheme together with the ground plane, to really surround the "live" spring with a tight cage of ground. A conductive encapsulant can do the same shielding.

Retractable Springs (or "Turtle Socket")

FIG. 32 shows a socket with "retractable" springs, so that the springs would be protected from damage while the socket is open. Special means retract the springs so that they hide inside the envelope of the housing, under the surface of the comb.

The test socket in this example uses a cam that retracts the tips of the spring inwards, inside the housing, when the lid is opened.

Figure 33:
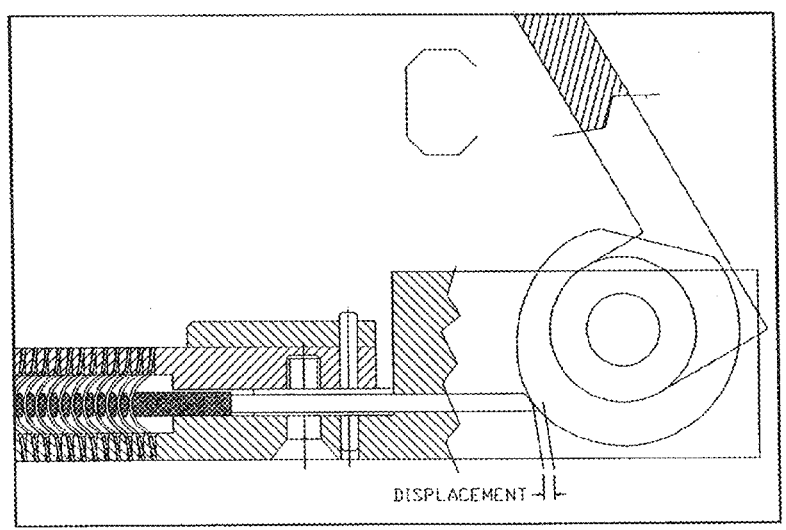

FIG. 33 shows a close-up view with cross-section of this test socket. The cam actuates a "connecting rod", which pushes the "slider", When the lid is at any position, roughly between positions A and C, (see FIG. 32 for a full picture of all the Positions, A through E), the cam is at its "high" dwell. It pushes the connecting rod a certain distance, to push on the belly of each spring, enough to get the tips of the springs inside the housing and beneath the outside surfaces of the combs. In this position, the springs are fully protected from any outside interference. Any object can be placed on top of the comb, i.e. in the nest, without touching, disturbing or damaging the springs. This condition will prevail until the lid is rotated from position A to approx. position C of FIG. 32.

Figure 34:
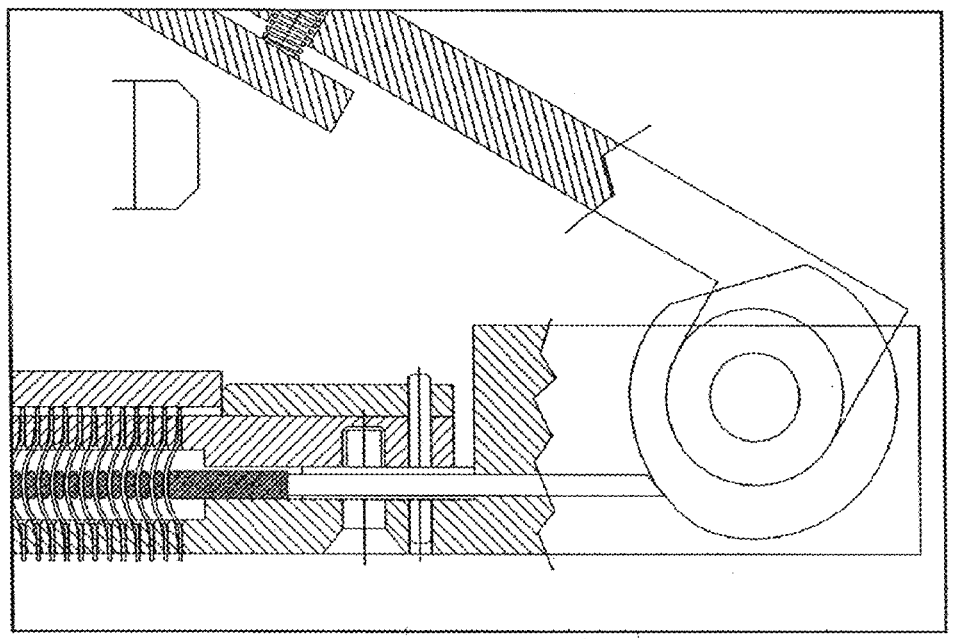

FIG. 34 shows the lid in position D, i.e. at roughly 30 degrees. Here the cam is now off its high dwell and is not pushing the connecting rod. The springs are in their "no-load" or free shape, where they have pushed the slider back, so that they are now at their fully extended length. The spring tips are now out of the housing and they will start to contact the device under test.

Figure 35:
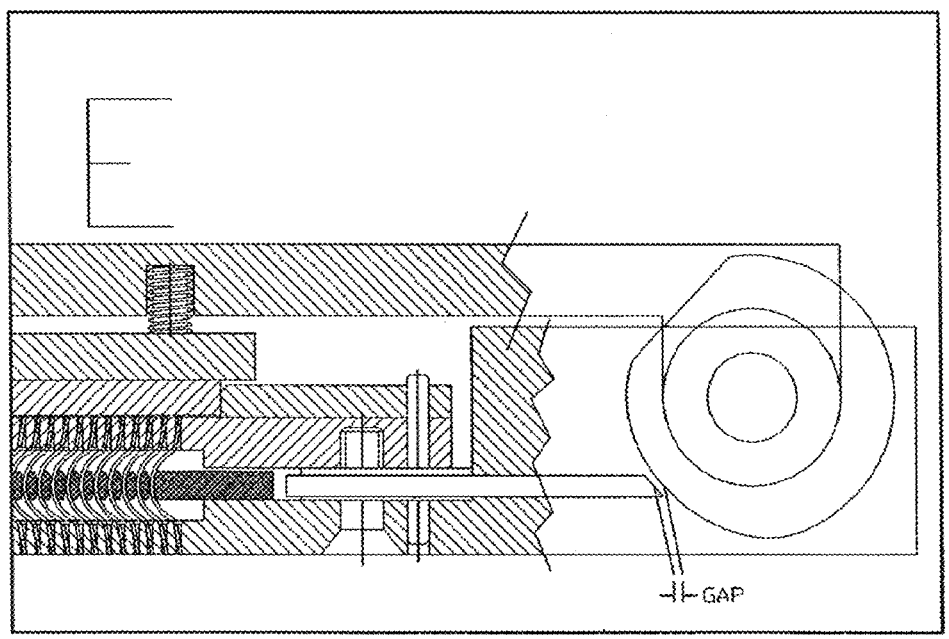

FIG. 35 shows the lid fully closed. The cam is even at a lower dwell point and there is a gap between the cam and the connecting rod. The connecting rod is not pushing against the slider and the slider is free to move to wherever the springs want it to go. The springs will find their best position under compression.

In a typical application, where test sockets are used in Automatic Test Equipment (ATE), there are alternate ways to protect the springs. For example, the connecting rod or the slider can be pushed directly by the ATE machine.

A spring-loaded comb that lifts up and protects the springs may also be used. In its rest condition, the comb is raised above the level of the springs' tips, so that the springs are hidden underneath.

Yet Another Embodiment

FIG. 37 shows a socket made of modular slabs, which are contained inside a "cage". FIG. 36 shows an alternative to the slab shown in FIG. 37. The cage in FIG. 37 is made of skeletal members, in a way so as to have access openings on all sides and both at the top and bottom halves of the socket. This way, we can reach inside the cage from the outside with open combs, and guide the tips of the springs into their respective apertures in the socket combs. Using two sets of such open combs, which we would call the "threading combs", we would get in from one direction, say the X-direction, and push the individual fingers of one threading comb between each pair of adjacent springs. Then we would get the second threading comb and push its fingers in the perpendicular direction, in this case the Y-direction, and again insert each finger of the comb between each pair of adjacent tips of springs. This will trap each spring tip between two pairs of threading comb fingers, each pair being perpendicular to the other. This would hold the spring tips firmly in position. Then we would bring all these open combs with the springs trapped between them towards the socket comb, which we will call interchangeably "connector comb" also, and push the springs home.

FIG. 37 does not show the springs. This is just for clarity. Only one spring is shown, going through an aperture of the socket comb. Even the socket comb is shown as a thin section, so as not to hide the details of the modular construction.

Figure 38:
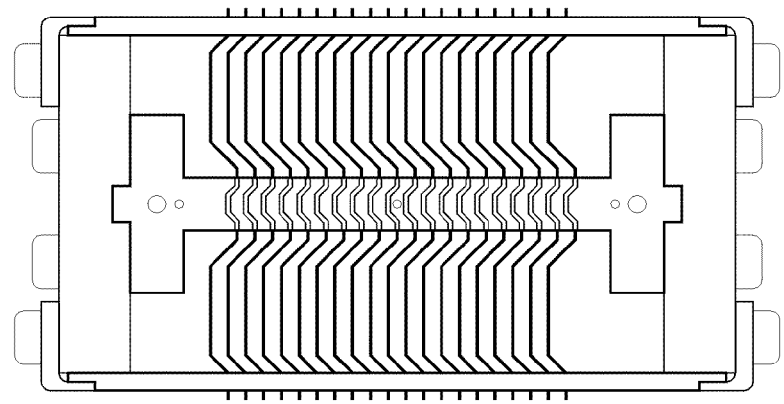
Figure 39:
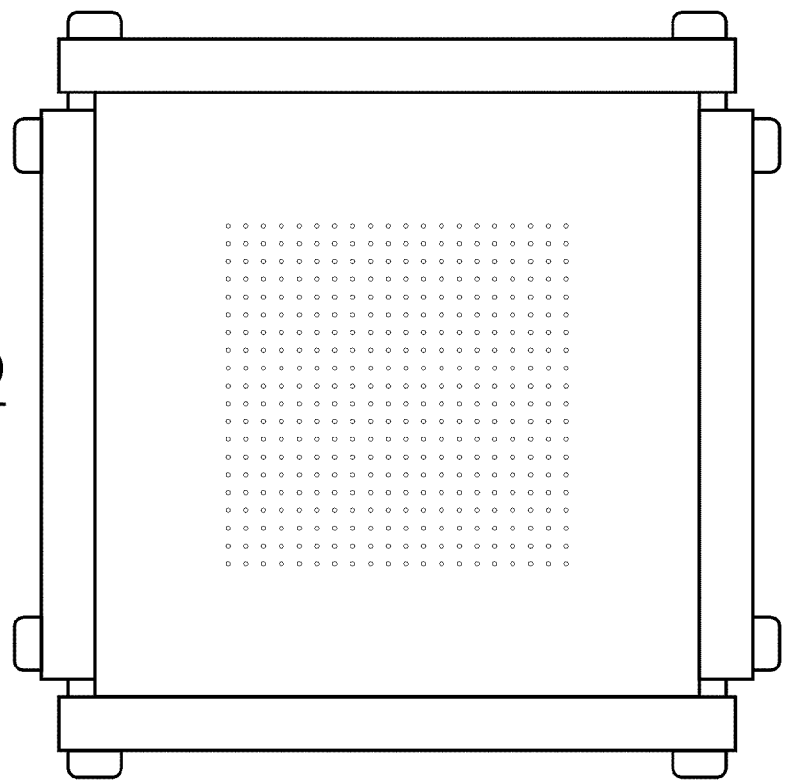
Figure 40:
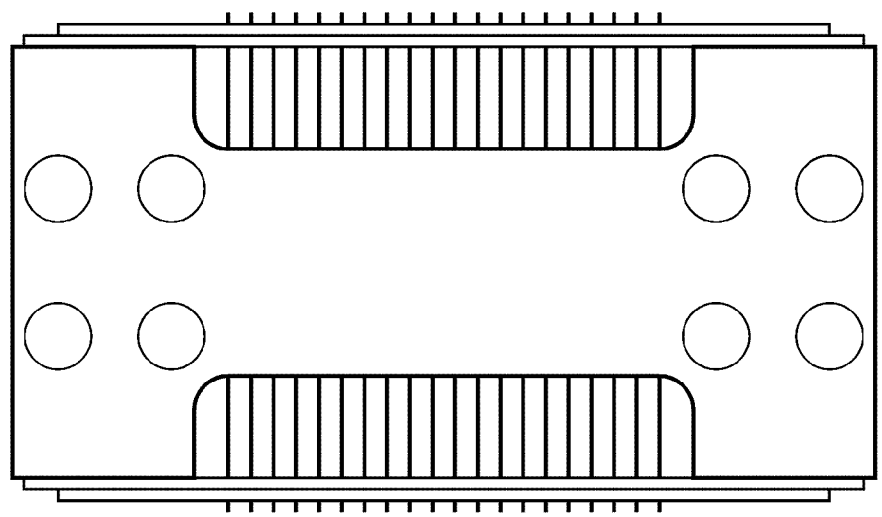

FIGS. 38, 39 and 40 show three orthogonal views of the socket of FIG. 37.

FIGS. 41 through 44 show details of the slab, and some dimensions. In this example, the center distance between the springs is 0.009". Also the slab here is what I call a double slab. It has springs on both sides. The total thickness of the slab is 0.018". So, when several slabs are placed next to each other, to create a "stack", the whole matrix of springs will automatically be on 0.009" center or pitch.

Figure 45:
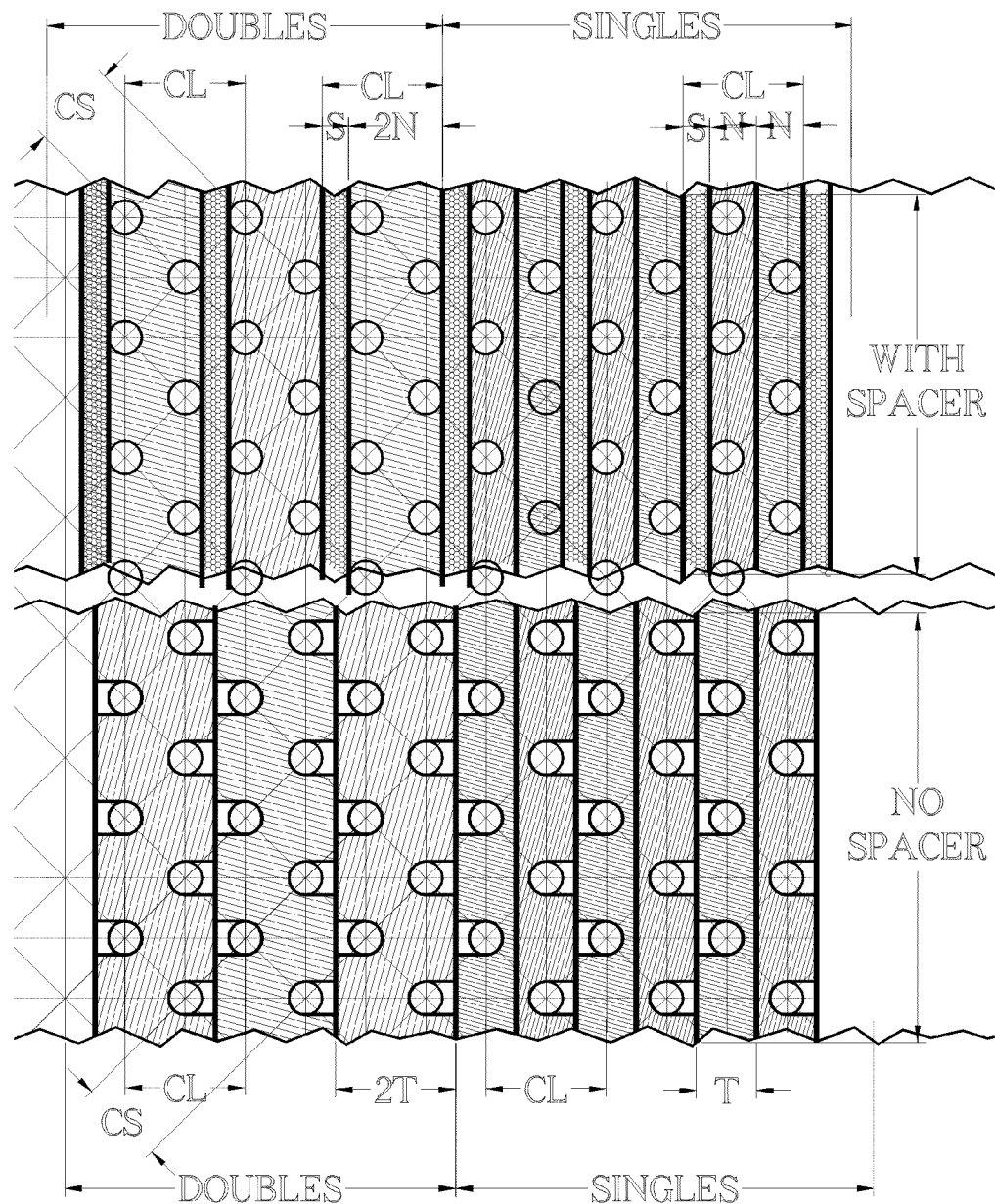

FIG. 45 shows two alternate ways to make another double slab, with springs on both sides, on alternating pitch distribution. However, here the springs are every other space, which results in that the springs are on 0.018" center. However, if we look at the matrix, tilted at 45 degrees, the resulting matrix would have a center distance of only 0.0127".

All the above is to facilitate the manufacturing processes to make such sockets and connectors.

Figure 46:
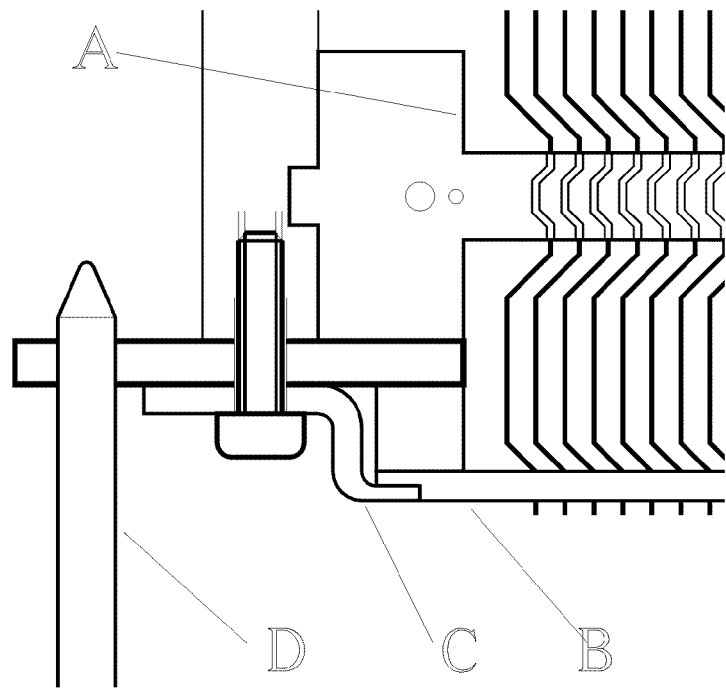
Figure 47:
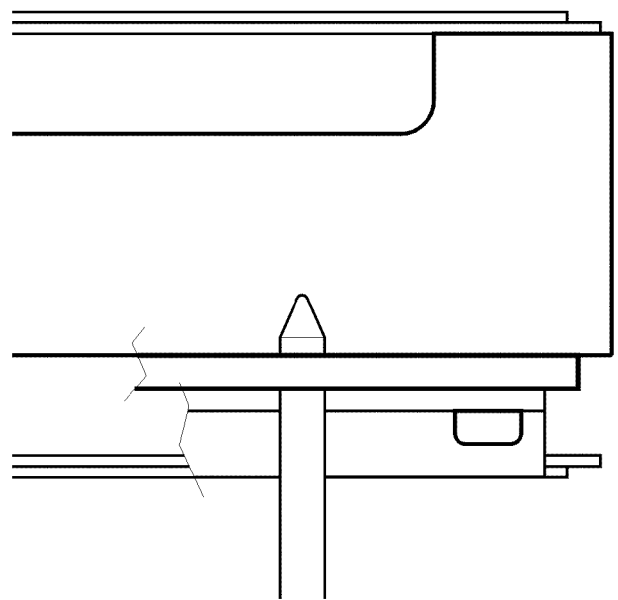

FIGS. 46 and 47 show details of how to secure the socket combs to the housing and how to register the housing to the test board, using some locating dowel pins.

(Section 2—Probes)

Probes Applications

Now I will use many of the parts of this invention, that were discussed earlier, and apply them to yet another group of products that are referred to as "Probes".

Background for Probes

The majority of Probe Cards are built so that they can make contact and test one chip at a time. The reason is the construction style of the probes and the fact that the contact pads on chips nowadays are usually small and located at close proximity to each other and that many of the chips have quite a few contact pads that need to be probed. The contact springs or needles are usually mounted on a printed circuit board (PCB), which is called the probe card. The needles fan out, from the chip as a center, to the outside, to create a sort of a radial array. The probe card PCB is usually parallel to the chip and the needles are usually in a general direction that is also parallel to the board or the chip. The needles act usually as cantilever beams. This general arrangement usually requires a considerably large amount of area (footprint) that is parallel to the board and to the chip, and it is the main reason that only a limited number of needles can be accommodated on the probe card.

Because of all that, most of the times, the probe card is mechanically positioned, so that the spring tips touch the contact pads on the chip and then the chip is tested electrically. After the chip is tested, the probe card is "indexed"; i.e. repositioned, mechanically, to contact the next chip and then the electrical test is repeated. Actually in many cases, the wafer is indexed while the probe card is held in place.

It is time consuming to test the chips this way, i.e. to test each chip individually, because the wafer has to be repositioned mechanically for each chip. It would be nicer if it were possible to contact more than one chip with one mechanical setting of the probe card. In such a case, the electrical test would be done on a first chip, then without any further mechanical repositioning, the second chip would be tested electrically, then the third, etc. until all the chips that are contacted by the probe card are tested electrically.

So, it is more desirable to test a number of chips with one mechanical setting. Better yet, it would be more economical, if a whole wafer could be contacted, with one mechanical setting.

Recently, attempts have been made to test a whole wafer, or a large portion of same, i.e. more than one chip, at one time. "FormFactor, Inc., Livermore, Calif." has shown in their various patents, a number of ways to accomplish some of that. However, those methods have their advantages but also some limitations. The proposed approach could be fairly expensive. But the important thing that I notice particularly, is that it lacks a specific feature, namely the comb, which is part of this present invention here.

According to the designs in this invention, a whole group of chips or a whole wafer can be contacted at one time. This can be accomplished by using the Form Factor approach and combining it with my comb. Other methods will also be presented that use totally different approaches.

Furthermore, since many of these tests are frequently done at varying temperatures, the effects of TCE Mismatch can ruin such tests and/or damage the chips. The designs in this invention take care of this problem as well.

On a different front, packages and Printed Circuit Boards (PCBs) and substrates also get tested frequently. Packages can be tested using "Test Sockets", but PCBs and substrates are not amenable to this method of testing. So, PCBs and substrates could be tested using probes, if necessary. They could also be tested using the "Test Heads" mentioned earlier.

Another problem with most present types of probes is that the needles, being long extended cantilevers, are pretty delicate and prone to be bent out of shape and out of position, if they are not handled very carefully.

I will describe in this section the designs of the probes and probe cards, as per the present invention. They aim to solve all the above shortcoming of probes and probe cards presently on the market.

Details of the Proposed Solutions

Figure 48:
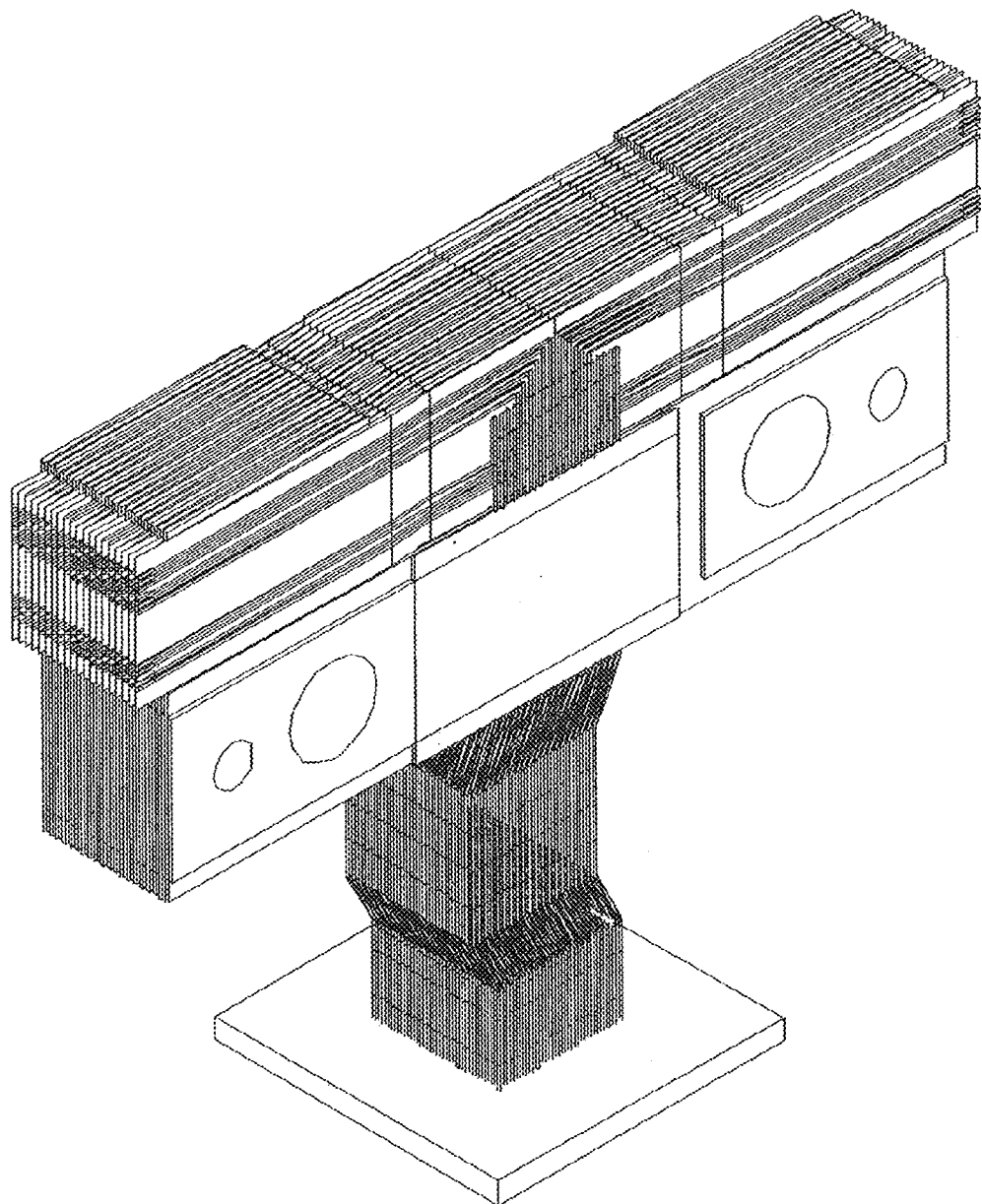
Figure 49:
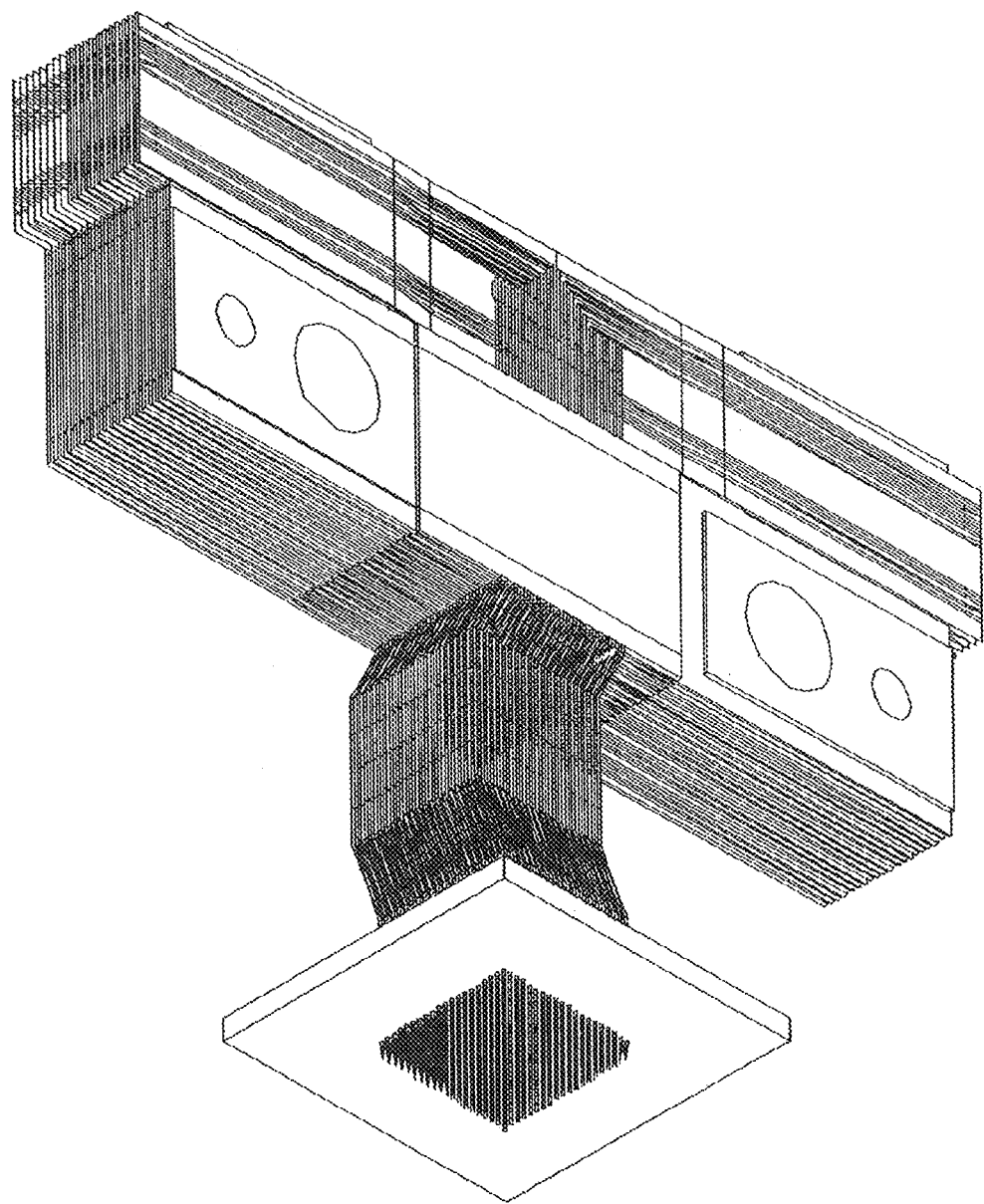

FIGS. 48 and 49 show isometric views of an example of a "probe" that can be built according to the present invention. FIG. 48 shows the probe, looking down at it from above, and FIG. 49, looking up at it from below.

I will describe the major steps required to build such a probe.

Application of the Concepts to "Probes"

Next, I will show one example of how to apply the above concepts to make a "PROBE", using the "Chevron" springs/needles. The same can be done with other shapes of springs or needles, like those I described earlier, or like those that will be shown later.

Also notice that the number of springs placed in any one row is optional and the number of rows or stacks or slabs is also optional.

Then, I will talk about other examples including one, where the product can be used as a test socket as well.

First Example of a Probe

I will first show a probe, with a 20 by 20 matrix of Chevron springs or needles. I will then show in the subsequent figures how we can put such a probe together and then later I will show some details of individual components of such a probe.

Please note that the parts shown in FIGS. 50 through 55 are shown as if they are laid flat on a table, as during the manufacturing/assembly process. After the assembly is completed, the probe will most probably be used in a vertical position, as shown in FIGS. 48 & 49.

FIGS. 48 & 49 show a probe containing a matrix of 20 by 20 Chevron needles, arranged on 0.020" pitch. The needles are obviously in a "parallel nesting" arrangement.

Please notice that I have used 0.020" pitch here just for illustration. It makes is easier to see the details. The same concepts and principles apply to smaller center distances. We are actually working right now on a model that will have a center distance of 50 micron, i.e. approx. 0.002".

Notice also that the tips of the needles are located within holes of a "comb". This comb locates the needles accurately and in alignment, so that they match the location of corresponding contact pads on the chip or wafer under test, and at the same time, protects the needles from damage.

In addition, the comb can be made of a material that has a Thermal Coefficient of Expansion that matches that of the Device Under Test (DUT). This way, when the tests are done under varying temperatures, the spring tips will remain in their respective position relative to the DUT.

Figure 50:
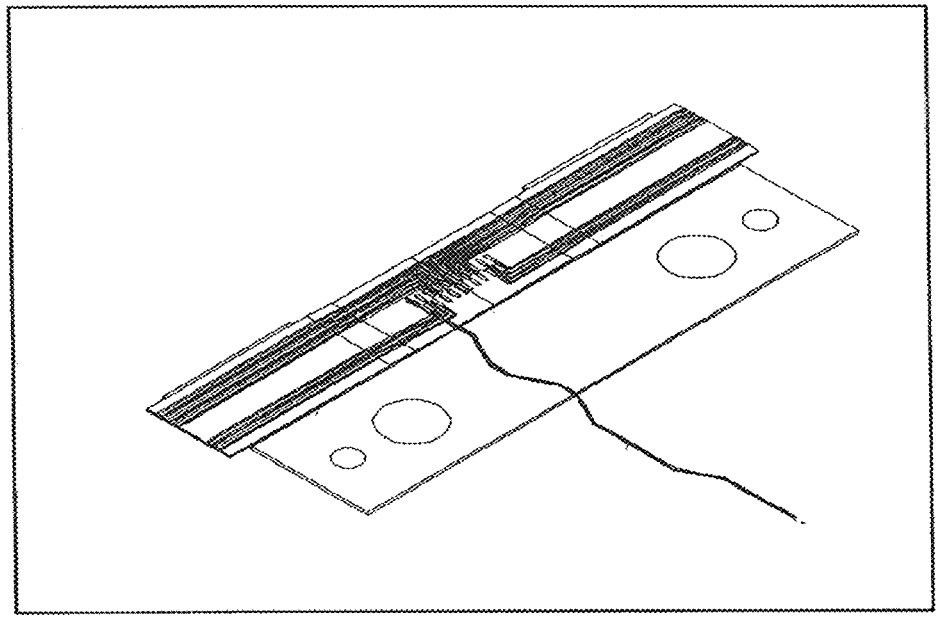

FIG. 50 shows the start of the basic "building block" of the above probe. This is what I call the "SLAB". The figure shows the primary components of such a slab. Basically, they include the needles and the support member. The latter can be a PCB or it can be a plate together with a flex circuit, or any equivalent arrangement. Notice several things here.

First, the needles are slightly different from the one shown earlier. Here each spring has three major portions. See also FIG. 63. The first is a "flexible body" or "flex portion", similar to the needles shown earlier. The second is the spring "tip", which would go through the comb, again similar to the one shown earlier. The third portion is the new thing. It is the "anchor". It is the part that holds the spring to the support member. In particular, the anchor has a "kink" or similar feature somewhere along its length, where it will lay against the support member. The anchor is not the "flexing" part of the spring. It specifically provides what I call the "anchoring and orientation" feature. It first holds the spring in position, and second it keeps its "orientation" with respect to the support member and to the other needles. In other words, it prevents it from rotating out of place.

Figure 51:
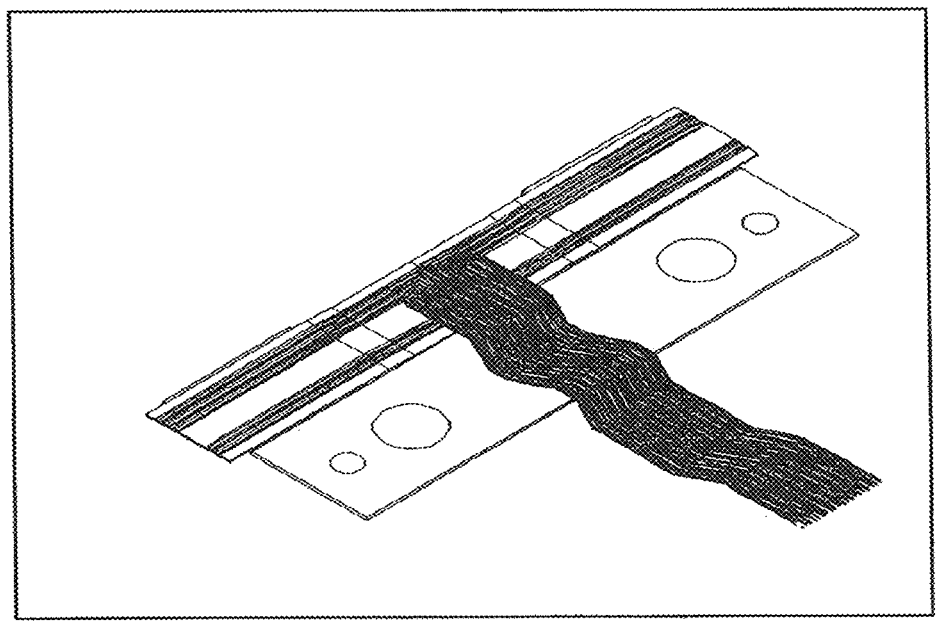

Second, the top end of the spring will eventually be soldered to its respective contact pad on the support member, as in FIG. 51.

Third, a certain length of the spring, between the tip and the solder end, can be insulated. This would prevent any "short circuit", if ever any two adjacent needles do touch.

Fourth, a certain length of that insulated portion of the spring can have a conductive material layer over the insulation, where the latter layer could be "grounded", so that the whole thing would act as a grounded coax cable, to improve the electrical performance of the probe.

Fifth, the support member can be a stiff board made like a PCB or a metal plate together with a "flex circuit on it, or any equivalent arrangement. The solder pads will be staggered and spread over a number of rows to accommodate the number of needles that will be on small center distances. This could be similar to present probe cards.

Figure 52:
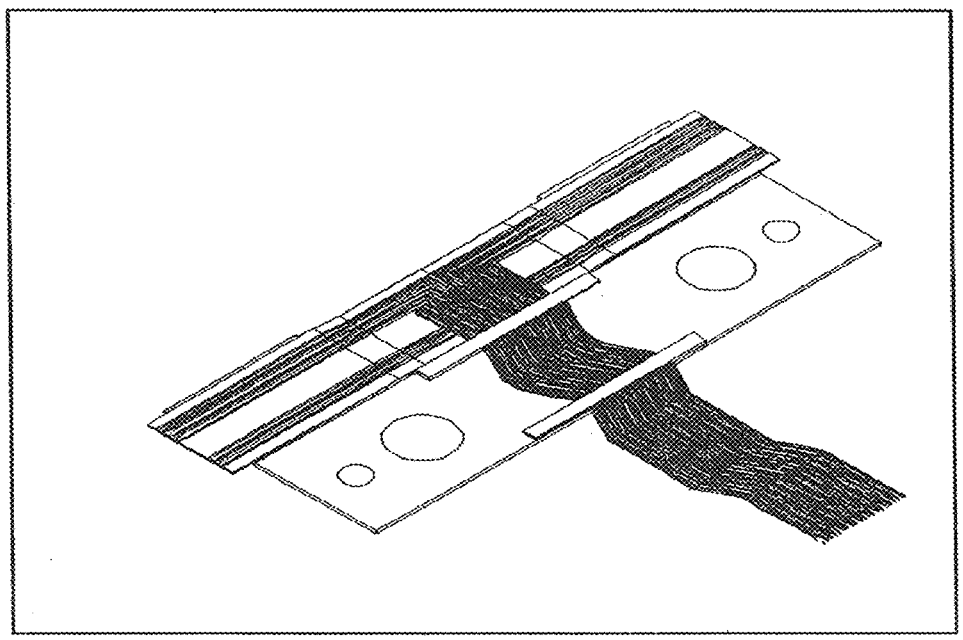

FIG. 52 shows some of the steps to affix the needle to the support. The lower edge of the support will be the "anchor" for the needles.

Figure 53:
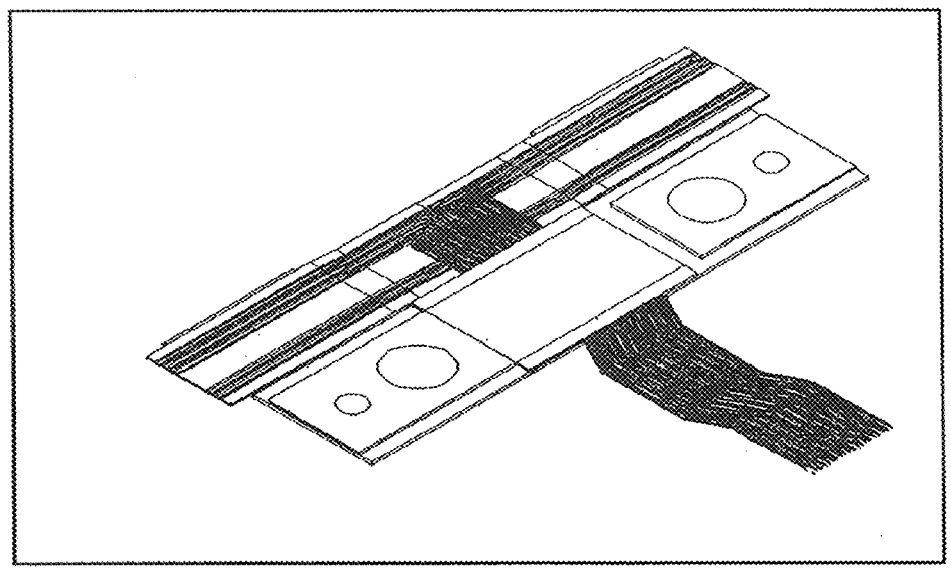

FIG. 53 shows a "slab" after going through some of the subsequent assembly steps, where more needles are mounted on the support member and soldered to their corresponding pads. If the needles are insulated and covered/shielded by a conductive material, then they will also be "glued" to the support member and their shields "grounded". Spacers and/or fillers will be added, as necessary, to create slabs of uniform thickness.

Figure 54:
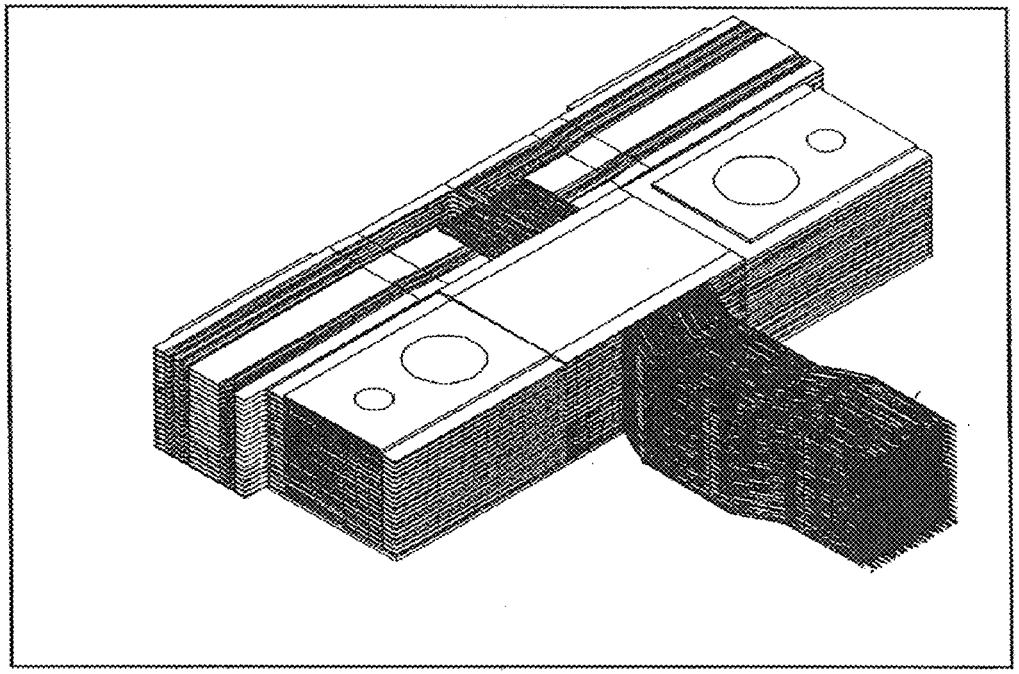
Figure 55:
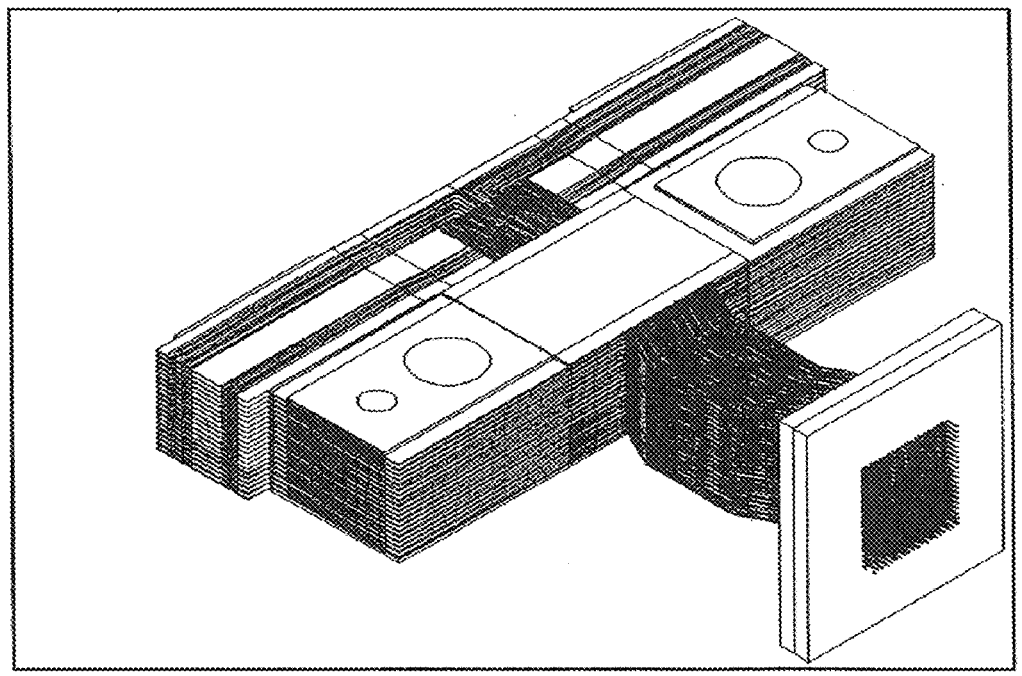

FIG. 54 shows a "STACK" of 20 slabs, assembled together to make the basic probe. Each slab is made as the one shown earlier. The stack shown here would be used together with a comb or two, as will be explained later, to end up like the one shown in FIG. 55. The whole thing will then be "fixtured" properly, to work with whatever testing equipment that are used for the probing operation. It will then look as show in FIGS. 48 and 49.

Frequently, the chip/DUT does not have a full matrix of contact pads. The pads may be on the perimeter; and even so, they may not be evenly distributed all on the same pitch; or some gaps may exist between some contact pads. In such cases, only the proper number of needles would be selectively mounted on the various slabs, so that after all the slabs are stacked together, the needles will be distributed in a pattern that matches the pattern of the contact pads of the DUT. This will create a sort of a "matched set".

Next, I will show some details of the major components of the probe stack.

Figure 56:
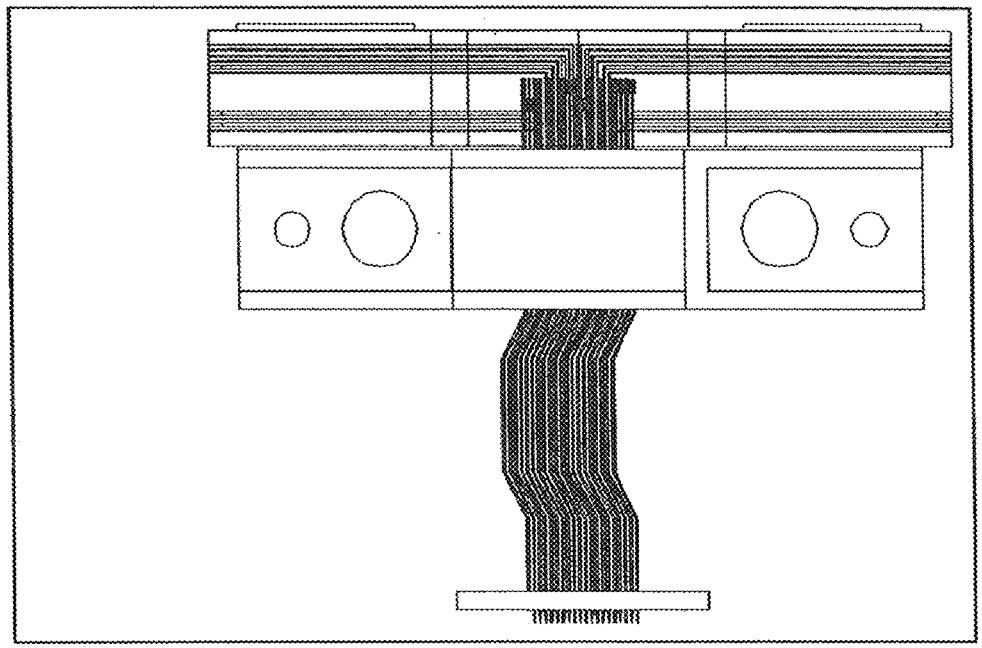
Figure 57:
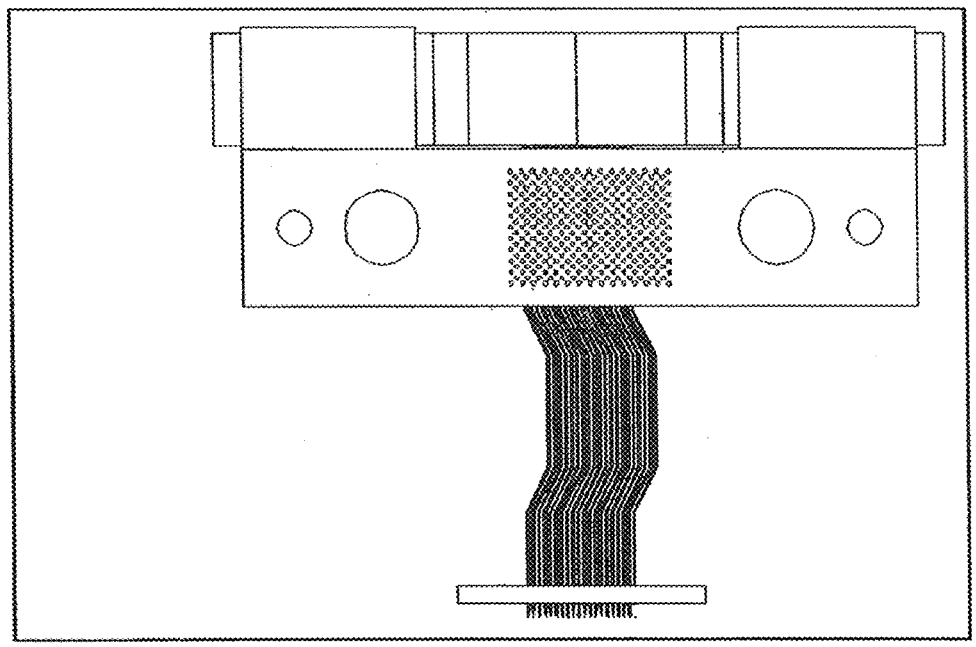

FIG. 56 shows a side view of the stack together with a comb, looking at it from the front. FIG. 57 is looking at it from the back. Notice here that there is only one comb, so we would get wipe or scrub. Compare this with FIG. 59.

Figure 58:
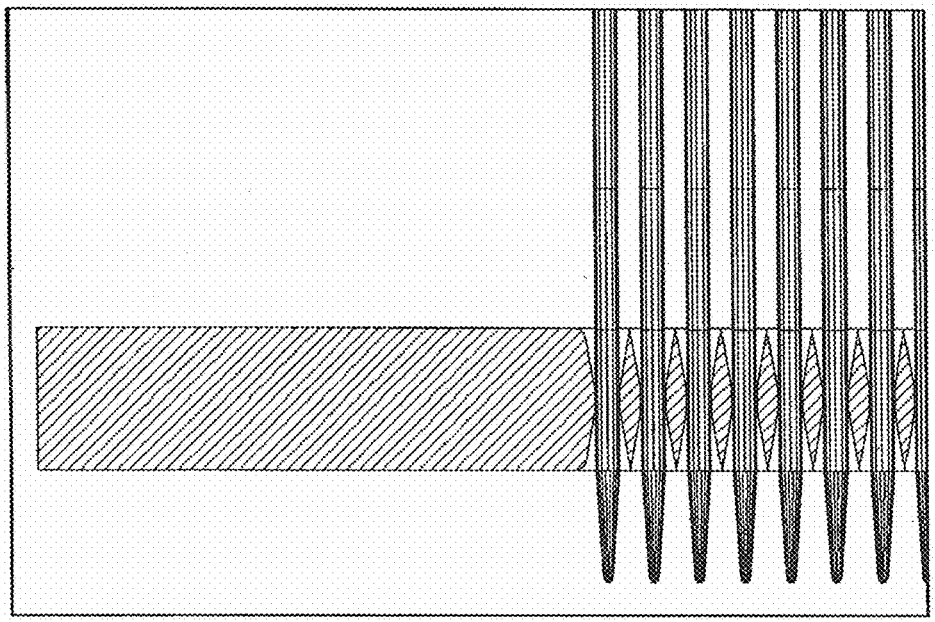

FIG. 58 shows an enlarged partial cross-sectional view of the comb and the tips of the probe needles. The holes in the comb are tapered both at the top and bottom of the comb. This gives them an hourglass shape, which would allow the needles to tilt and sway sideways, if deflected under compression. This tilting action would result in the "wipe" or "scrub", which is desirable in most cases.

Figure 59:
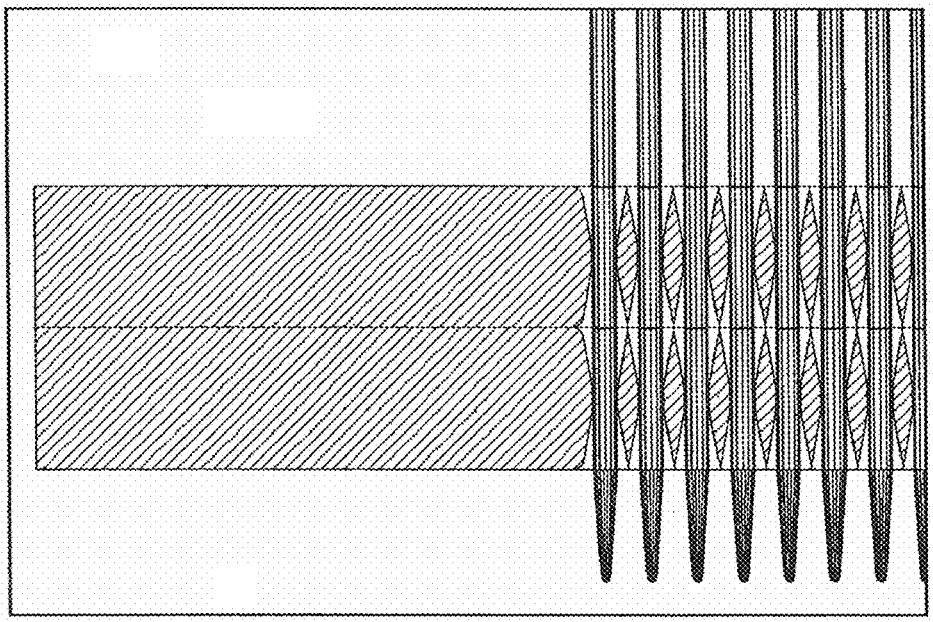

FIG. 59 shows a similar view, but with two such combs. It is clear that the two combs, acting rigidly together, would "guide" the needles and prevent them from swaying. Hence, in this case, we would not get any appreciable scrub, if at all. I will expand on this later.

Please note that if desired, the two combs could be mounted such that they may slide sideways with respect to each other, in which case we would get scrub. We can go one step further. By allowing the two combs to slide only a certain distance with respect to each other, we can control how much scrub we would get. So, we can decide on the amount of scrub, doing this kind of "gymnastics". This is another way to control the scrub, as compared to the methods mentioned earlier, when I proposed to use the shape of the spring and the amount of symmetry, etc. to control the amount of scrub. Another method is to have two combs, where one would have a hole and the other a slot.

Notice also that the comb can be made of several layers, where the holes in the different layers can have successively larger diameters, to simulate the hourglass shape. This can make the manufacturing process easier. However, these layers will still behave as if there is only one comb in the system, like a "glue-lam" beam, and we would still get the desired wipe/scrub.

Similarly, if the diameter of the hole is very small compared to its length, i.e. the thickness of the comb, then it would be very difficult and/or expensive to make such a hole. By using two or more layers to make the comb, the length of the hole in each individual layer will be shorter and the aspect ratio of the hole will be more favorable, thus easier and less expensive to make.

Other Examples of Probes

In all the previous FIGS. 48 through 57, the way to get the signals out from the contact springs and to route them to the outside world was through the top of the support member. In those figures I had used a flex circuit as the conduit. The two ends at the right and left of the top portion of the support member are where the signals would go out at. The basic support member can be a sheet metal or the like, and it will carry the flex circuit.

Figure 60:
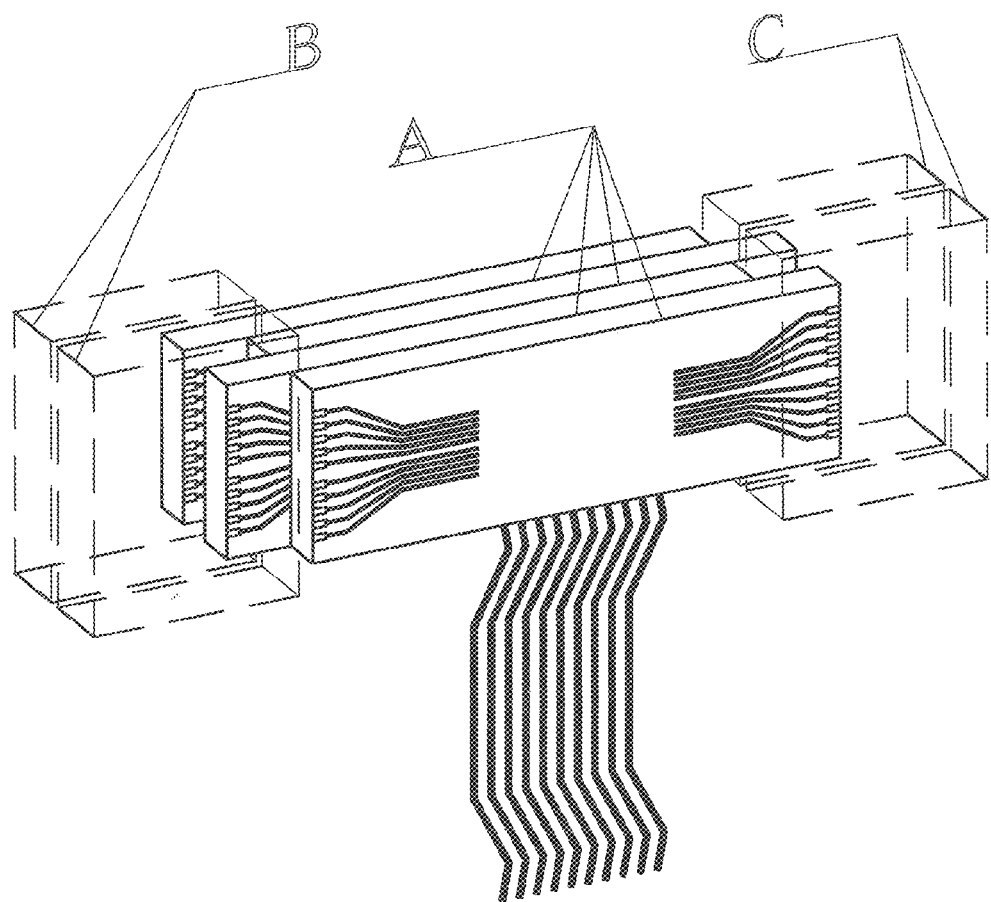

An alternate way is shown in FIG. 60. Here we make the whole support member out of a PCB material, with its own traces and edge board contact pads. Then we can use edge board connectors to get the signals out to the outside world.

Figure 61:
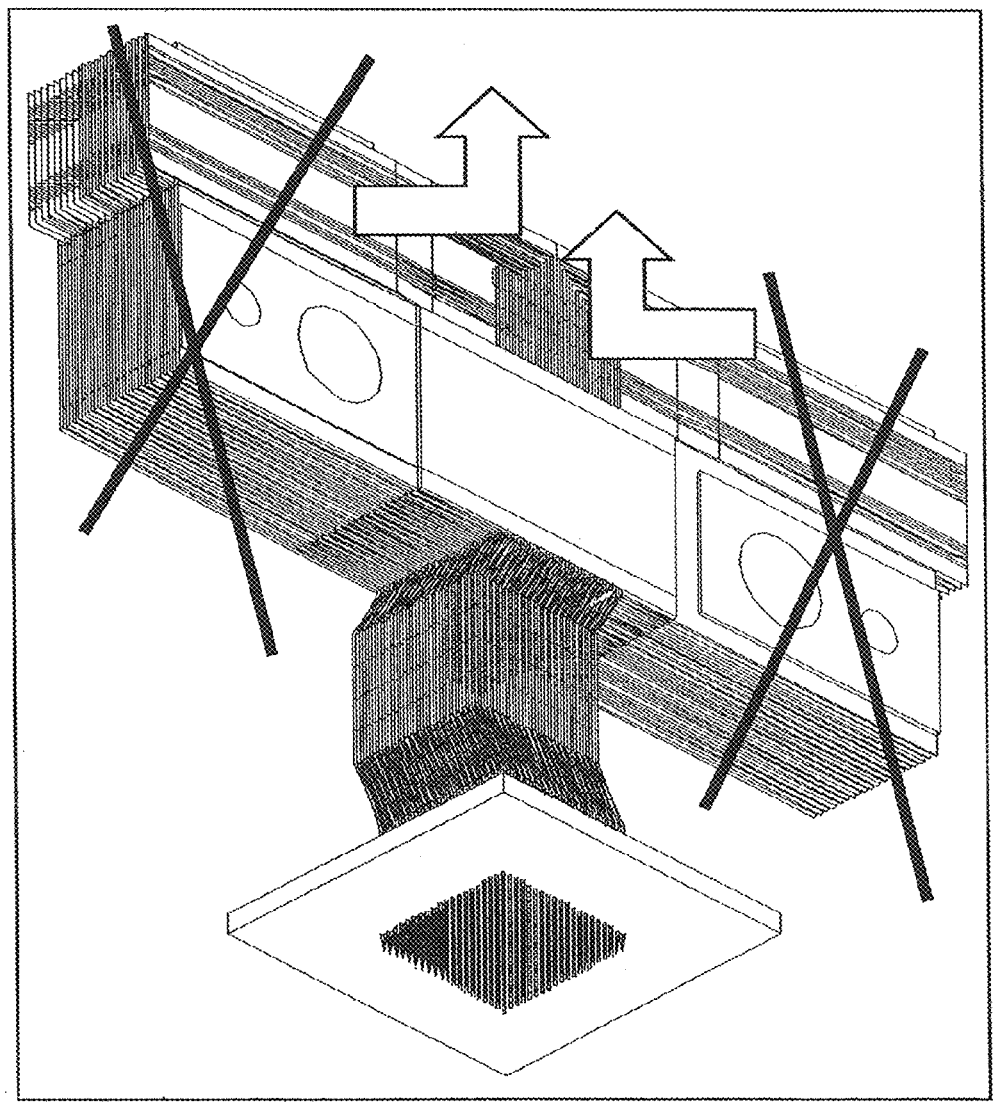

FIG. 61 shows yet another alternative to get the signals out. Here the connections can be directed to the top of the support member. This would make the whole probe narrower, and it would have a smaller footprint on top of the DUT.

Figure 62:
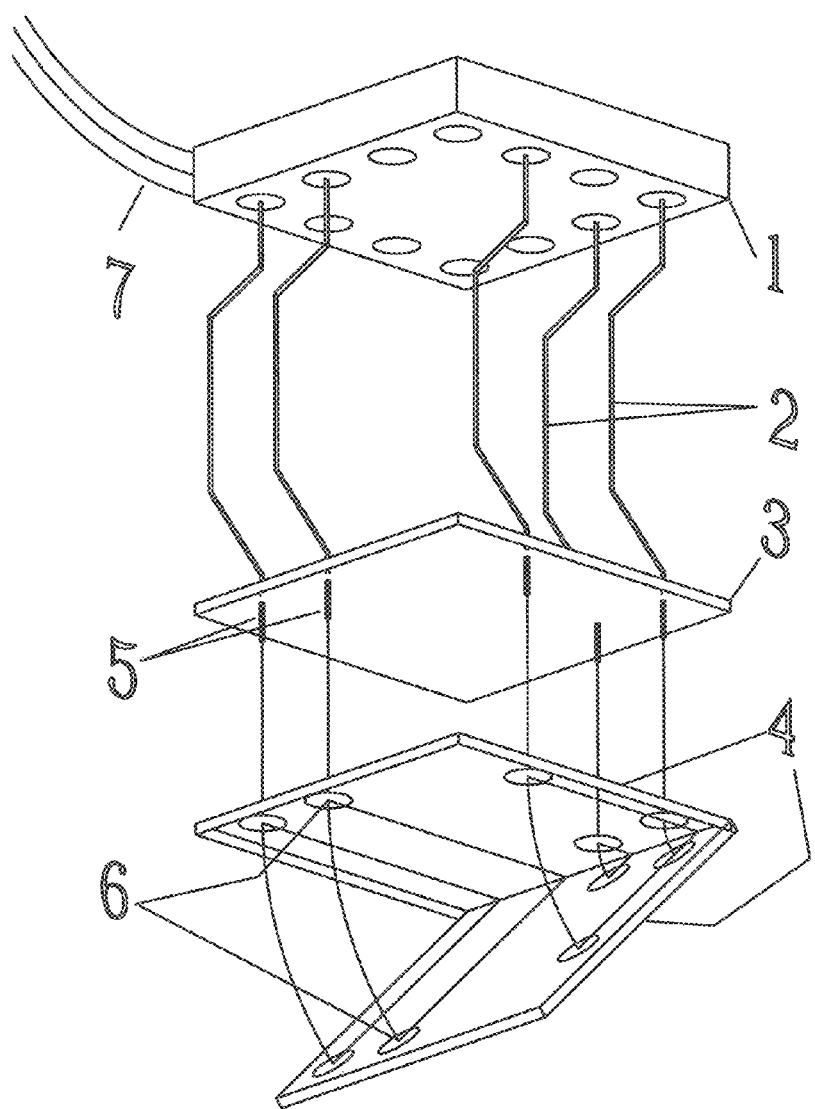

FIG. 62 demonstrates how we can mount the contact springs selectively, so as to match the pattern of the contact pads of the DUT.

"Vertical" Needles with "Offset": Cantilever Needles

Figure 63:
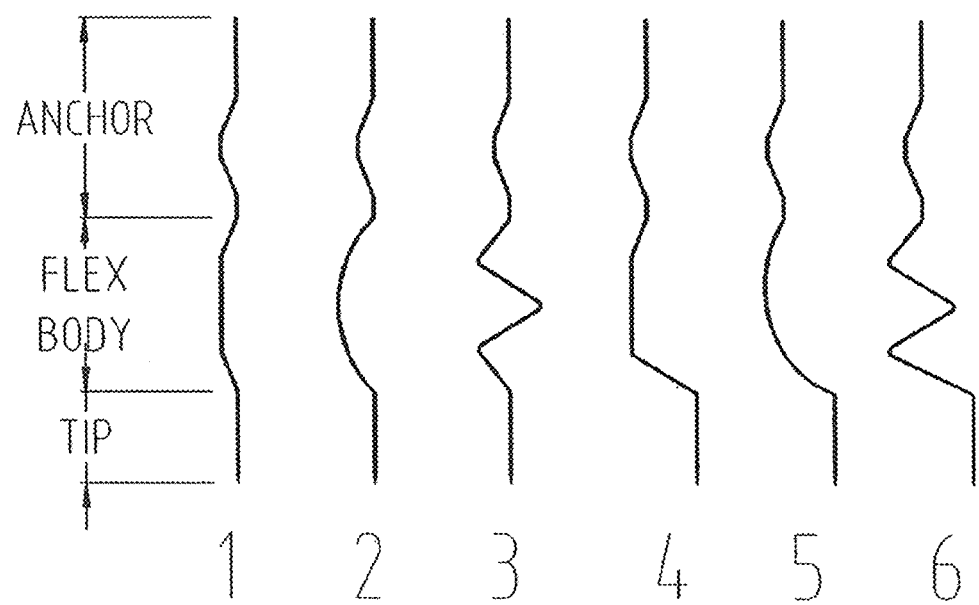

FIG. 63 shows six needles. Spring #1 is the one shown earlier, in FIGS. 48 through 57. Needles #2 and #3 are variations of #1. Notice that all these three needles have their tips "in line" with their anchors, i.e. vertically underneath it. In other words, their axis is vertical. Notice also how a portion of their body lays outside the axis, making it easier for axial forces to bend the springs. Such needles could be used if we have a condition as shown in FIGS. 64 and 65.

Figure 64:
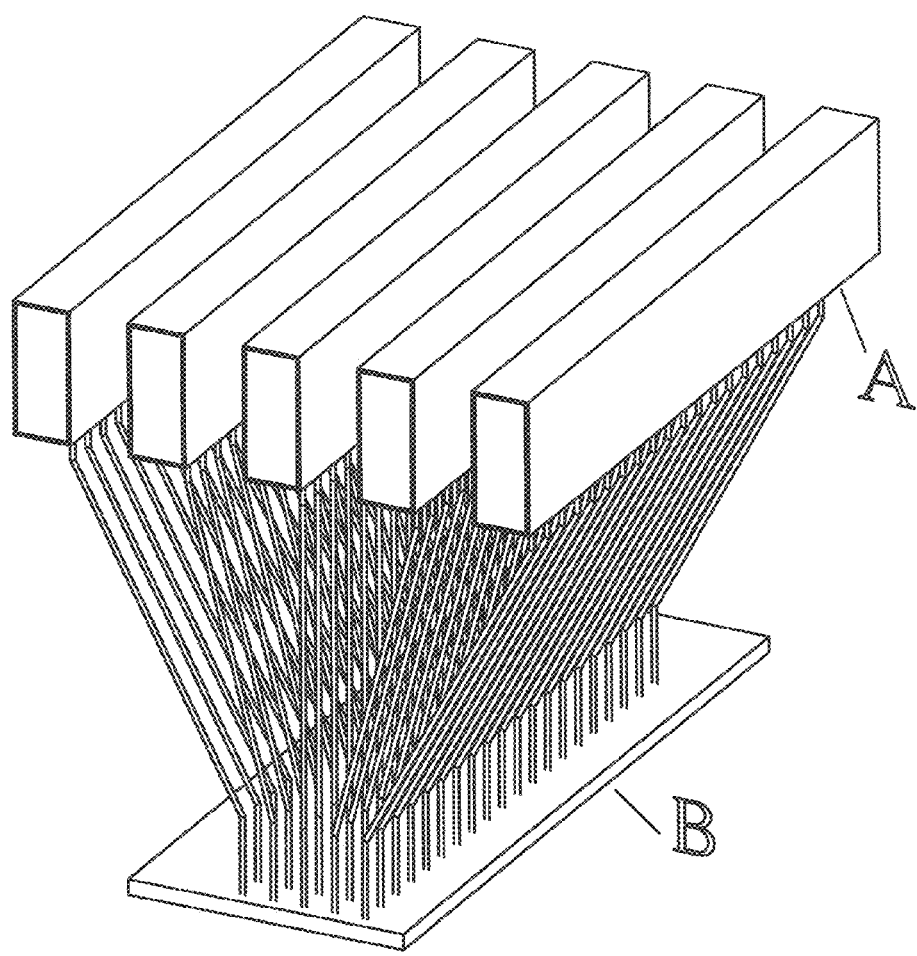
Figure 65:
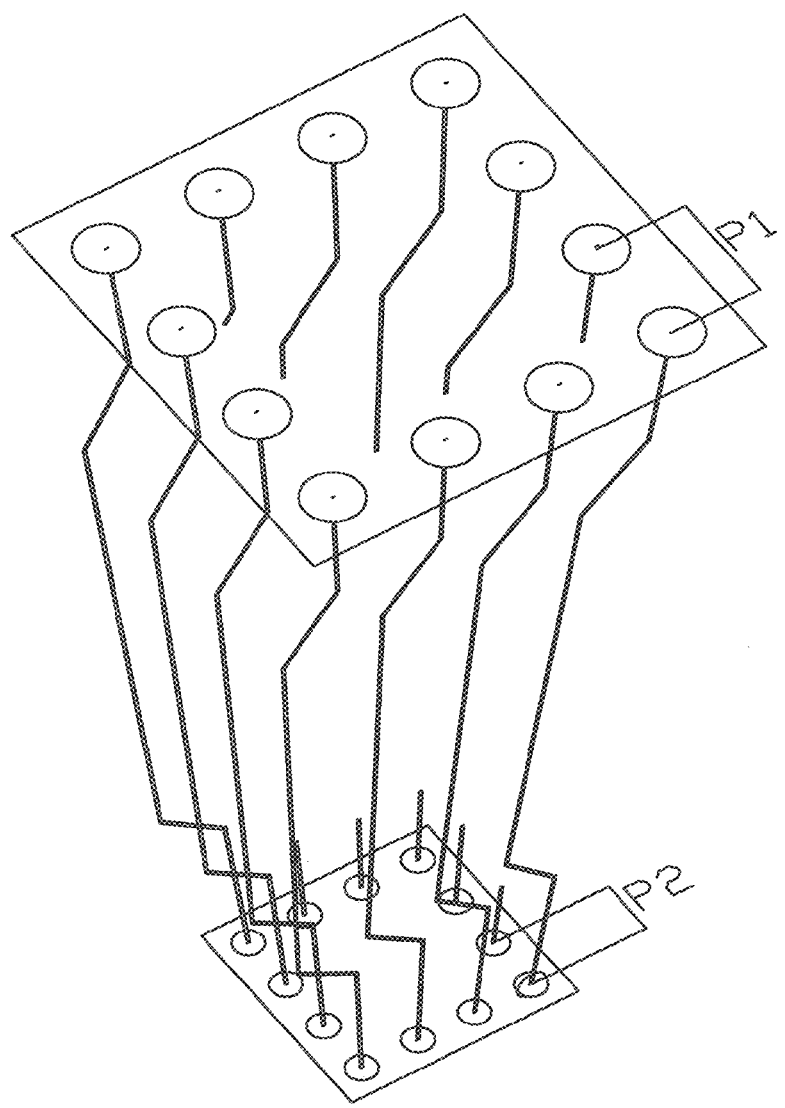

FIG. 64 shows the axes of the springs on an increasingly larger angle to the vertical, as the support members/carriers are farther away from the center. FIG. 65 shows another alternative, where the springs are sloping in both the X- and the Y-directions.

Needles #4 through #6 are basically very similar to their counterparts #1 through #3, except for one special feature. The tips are "offset" sideways, away from the vertical line. One main advantage of this configuration is to accommodate the situation shown in FIGS. 2, 66 and 67, FIGS. 69 through 79, 82 through 85 and 87 through 101. The anchors of the needles will be on the outside of the chip pattern, while the tips of the needles will be extending farther inwards, to create a tighter pattern, to match that of the chip. Furthermore, the needles can be tapered, i.e. with the tip diameter smaller than the diameter at the anchor. The tapering can be gradual or in steps. The amount of offset and its effect on the force-deflection relation and on the amount of wipe/scrub will have to be taken into consideration during the design of the needles.

For our purposes here, we will consider the axis of these offset springs to be the line between the anchor point and the lower tip of the spring. See FIG. 2 and DEFINITIONS. You will notice also that in all these offset springs, a portion of the flex portion of the spring body is eccentrically offset away from the spring axis, similar to the springs #1 through 3.

Also, for ease of referencing, I will call most of these offset springs "CANTILEVER" springs.

Probe for a Row of Chips

Figure 66:
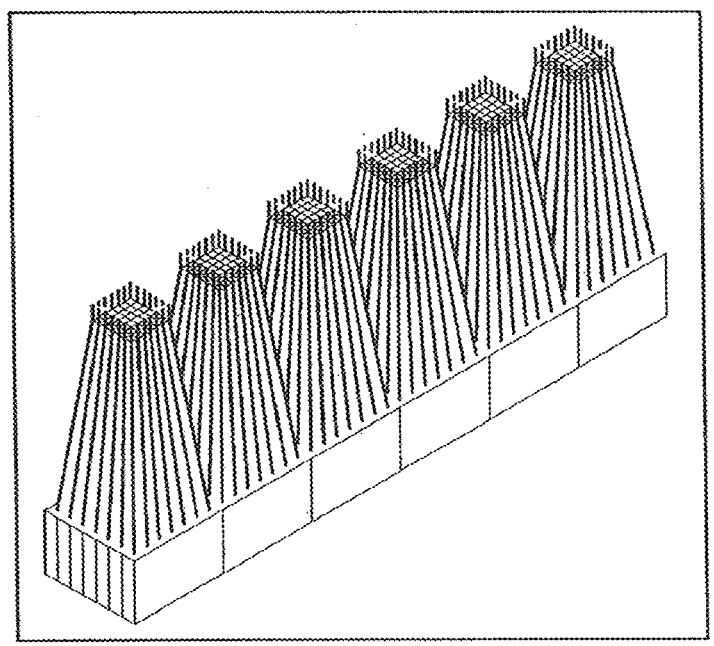

FIG. 66 shows a "row" of probe entities or "cells", which is what can be done if we want to test more than one chip at a time and if the contact pads on the DUT are extremely close to each other. This would be done if the thinnest support members may still be too large and could not match the center distances of the DUT. In this case, we can make a "row" of probe "cells", each cell matching the DUT, but with a "gap" between subsequent cells, to accommodate the size of the support members. In use, we would test one "set" of chips, then "index" to test the chips in the "gaps". Then we can index to the adjacent row of chips and so on.

Probe for a Cluster of Chips

Figure 67:
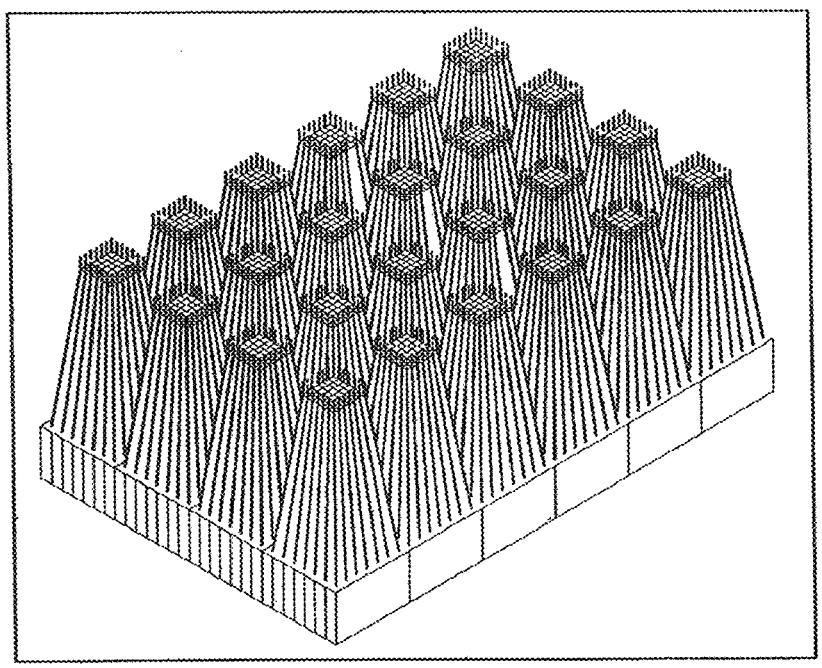

FIG. 67 shows a "cluster" of probe entities or cells, which is what can be done if we want to test even more than one row of chips at a time. In this case, we would need to "index" in both the X- and the Y-directions, to ensure that we test all the chips under the cluster footprint. Then, we would again, index to the next adjacent cluster footprint and so on.

"Connector Box" as a Probe

If we visualize that the springs or needles described above are enclosed in some "housing". They would basically become a "connector box" or a "socket", or a "test head" or a "test module".

Now, let us visualize that we would place a PCB on top of the connector and place all this, above the chip or the wafer. Place all this between two pressure plates, and bingo, we have a new way to probe wafers. The springs or needles inside the connector box can be arranged as a full matrix; or placed in only the desired locations, to create another "matched" set of prober and wafer, similar to what was mentioned earlier.

There are two potential problems with this kind of arrangement, although they are not insurmountable. First, the top PCB, which will contact the springs or needles at the top of the connector box, would need to have contact pads that are as small as those of the DUT and distributed on similar distances, etc. The other thing would be the "routing" of the signals out to the outside word. One solution that I can visualize would be to use a pretty thick "multi-layer" board, with all the fine features in it. A second solution is to have a "matching wafer" kind of device to act as the top PCB. A third solution is to tie the needles to the matching wafer, like by wire-bonding. This gets to look a lot like some of the devices developed by "FormFactor", References 2 and 3, but with some novel variations.

FIG. 68 shows still another application of the concepts of this invention. Here, the springs are joined directly onto a "base substrate". They can be soldered, brazed, wire-bonded, or joined by any other suitable means. They can also be "grown" (created) on location. (See "FormFactor", Refs 1 & 2). The other "free" ends of the springs protrude through a comb, similar to the combs described earlier. The comb helps in positioning the springs tips and will create scrub or wipe and will control its magnitude. Notice also the wide funnel entry at the bottom of each hole of the comb. This helps in guiding the springs during assembly.

Needles, with Basically Perpendicular Axis to DUT

Please notice that all the above needles have their general shape and axis in a basically "perpendicular" direction to the surface of the DUT. This configuration allows us to pack more needles in comparatively the same area as the DUT. Some "test heads" or "test modules" have their springs axes perpendicular to the DUT. These will be in the category as our devices described earlier. I would like to refer to this whole category as "vertical needles" or "probes with vertical needles".

This is in contrast to most of the probe cards presently on the market

Since the DUT is usually held in a horizontal position, I have earlier referred to the above springs or needles as "vertical". I intended it to mean "perpendicular axis" to the DUT.

Needles, with Axis Basically Slanted to DUT, or Cantilever.

We can group these into two sub-groups: One where the springs anchors are horizontal and parallel to the DUT. We will call them "Cantilever Horizontal Probe Cards". The second sub-group will have the sprigs anchors vertical and we will call them "Cantilever Vertical Probe Cards".

We can use most of the concepts proposed here for most of the probe cards. We would still get a lot of the advantages and benefits obtained by the concepts proposed here.

Horizontal Cantilever Probe Cards

The needles in the present probe cards are essentially parallel to the DUT, "fanning out" from the DUT as a center, and spreading out to accommodate being soldered to the card solder pads. These needles have basically similar components as the ones shown in FIG. 63. I mean, they have an anchor, which is attached to the card. They have a "flex body", which is usually a straight cantilever, and they have a tip which is almost at 90 degrees to the flex body. The needles are usually made of fairly thick spring wires and look and perform almost as straight cantilevers, with their last tips tapered down to very small diameters and points. The tips are usually not protected by anything like our combs. They are usually fragile and need to be kept in protective boxes to prevent any accidental damage due to handling etc.

Applying Our Concepts to Horizontal Cantilever Probe Cards

I propose at least two changes to these present probe cards. The first is to have the needles look more like the ones shown in FIG. 63. The main difference is that their anchor portions would be horizontal as in FIG. 69, so that they can be mounted the same way they are mounted now.

Notice the kink in the anchor portion of the spring. This is a special feature, which controls the orientation of the whole spring body in a certain plane. In this case, it is the horizontal plane and it is perpendicular to the plane of the flex portion of the spring. Their flex body would look more like one of the springs described earlier, i.e. with a belly, but with a more pronounced slope downwards. [Claim]

Figure 69:
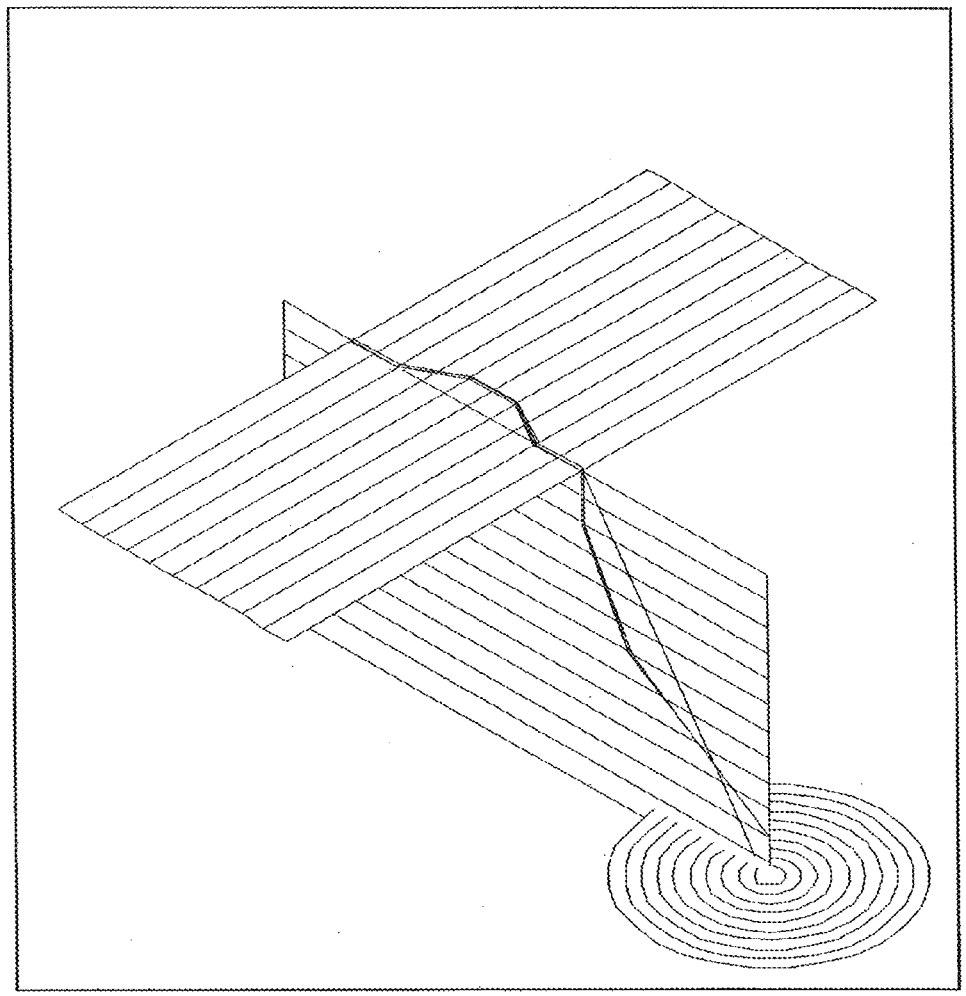

The second change is to use a comb to control the tip of the needles and to create and promote and control the "scrub", again as in FIG. 69. The comb can be mounted on three or more posts on the card. The posts can be rigid or spring-loaded.

I have made a model of such needles. It is shown in the following FIGS. 70 through 77. It is basically a modification of needles Number 4, 5 or 6, in FIG. 63. I have actuated it to show how it would work and how much scrub we can get with such a design and also how we can control the scrub. See next figures.

The same shape needles can be used with the "perpendicular" probe as well, especially like the one shown in FIGS. 66 and 67.

Visual Model of the "Scrub"

FIGS. 70 through 77 are eight scanned views of a probe needle that can be used with probe cards. Such needles could be used with either "parallel" or "perpendicular" kind of probe cards.

The views show the needle, with its anchor point at the top left corner. The needle "flex body" then stretches downwards and to the right. At the bottom right corner of the view, we can see two horizontal dark lines. The lower thicker one represents the chip or wafer or any DUT. The thinner line above it represents the comb. The tip of the needle passes through a hole in the comb and then protrudes downwards to meet the DUT.

I have included a background with a grid, to make it easier to observe the deflection of the needle.

Figure 70:

FIG. 70 shows the needle, when it has just touched the DUT. No-Load and No Compression.

Figure 71:

FIG. 71 shows the next step. Here the picture simulates the probe card being lowered against the DUT. The probe card and the needle anchor point have moved down an increment of 0.025".

We can see that the needle has been compressed down onto the DUT, the body of the needle has deflected slightly and the tip has tilted slightly and the contact point has moved a little bit to the right. This is what creates the desirable "scrub".

Figure 72:
Figure 73:
Figure 74:
Figure 75:

FIG. 72 shows the following step. Here the probe card was lowered another increment of 0.025". The body of the needle is bent more. And the contact point has moved more to the right, creating more scrub.

Figure 76:

The following Figures through FIG. 76 show the further progressive descent of the probe card down towards the DUT.

Figure 77:
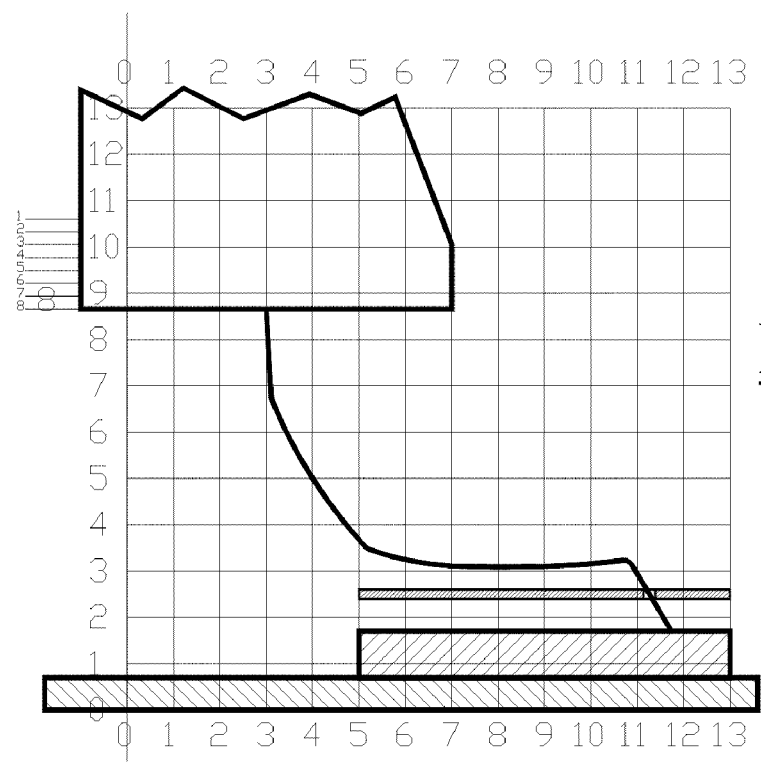

FIG. 77 shows an interesting point. The probe card has moved down yet another increment, but the tip of the spring has not moved to the right anymore. The reason is that the shape of the hole or aperture in the comb has limited the tilting of the tail of the spring. When the tail of the spring tilts so far, that it touches the walls or edges of the hole, then it cannot tilt any farther. We can use this feature to control the magnitude of the scrub or wipe.

The movement of the tip of the needle and of the contact point between the needle and the DUT is exactly the kind of "SCRUB" that we are looking for. The location of the comb and the whole geometry of the needle body and the needle tip control the amount of scrub and its extent on the surface of the DUT.

And we can design all that to suit the individual case and its requirements.

Figure 78:
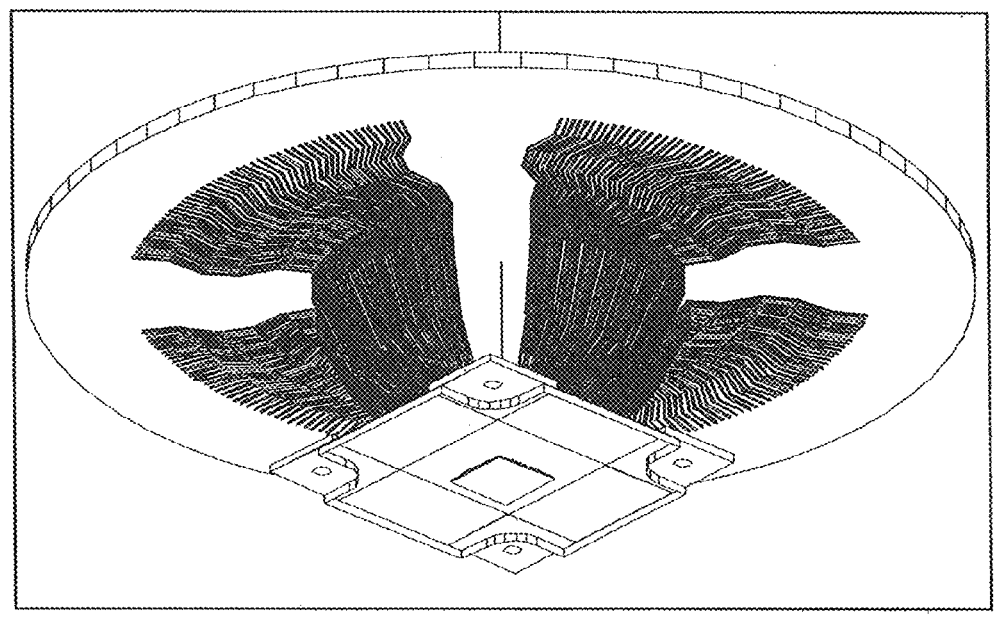
Figure 79:
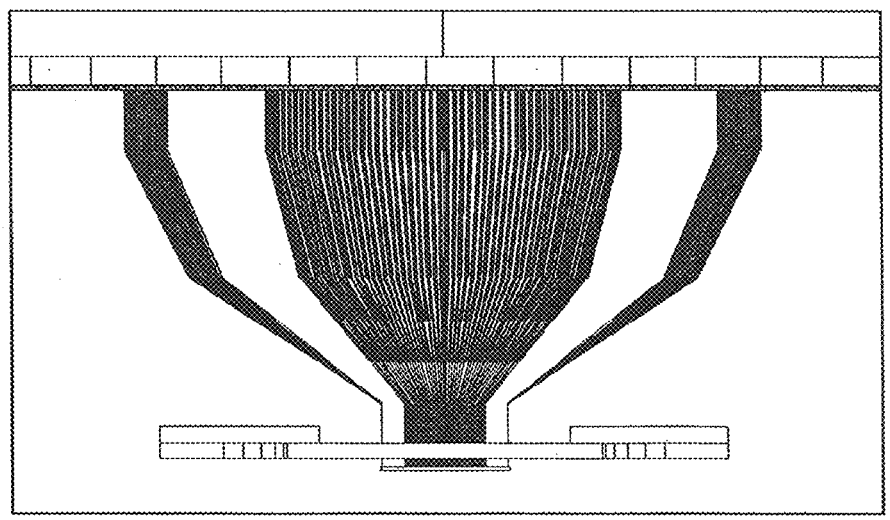

FIGS. 78 and 79 show an isometric and a side view of a probe card, utilizing the kind of spring that we saw in FIGS. 69 through 77. I would like to call such a probe card the Probe Card with Horizontally Anchored Cantilever Contact Springs. For short, "Horizontal Cantilever Probe Card". It looks very similar to the conventional probe cards available on the market, except for the fact that it uses the contact springs according to this invention and it also uses our comb and limiter.

Figure 80:
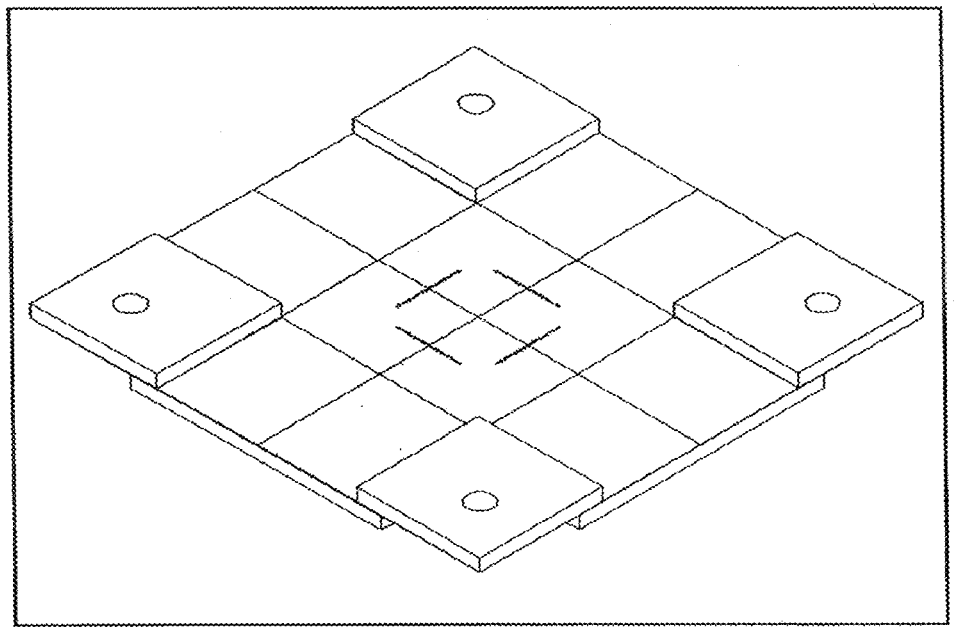
Figure 81:
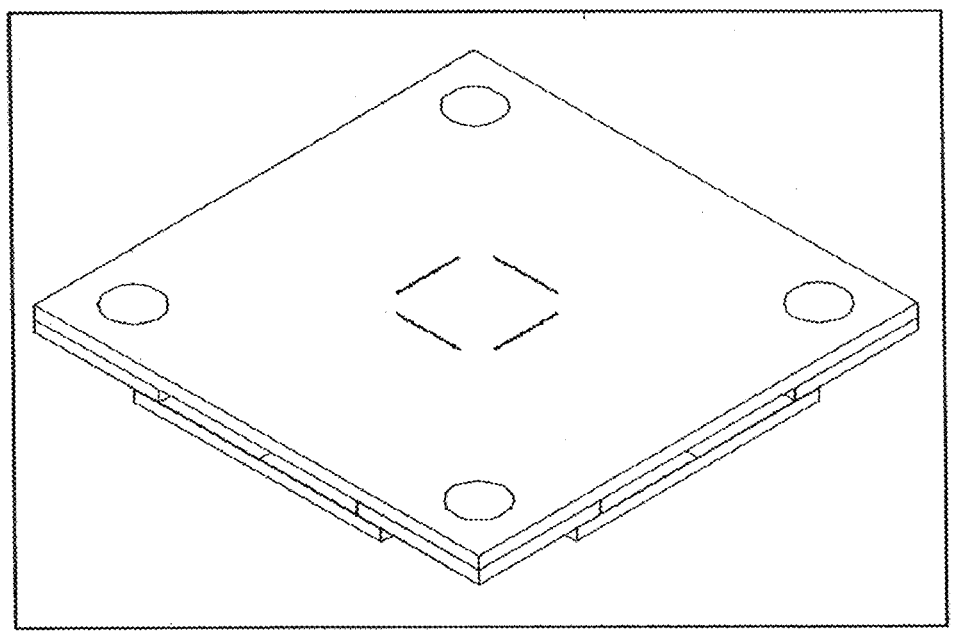

FIG. 80 shows a comb, as it is configured to mount on the Horizontal Cantilever Probe Cards. FIG. 81 shows the same comb, but on top of it is shown a "Limiter". Please notice the four lines towards the center of both the comb and the limiter. These are the apertures for the contact springs to go through.

Figure 82:
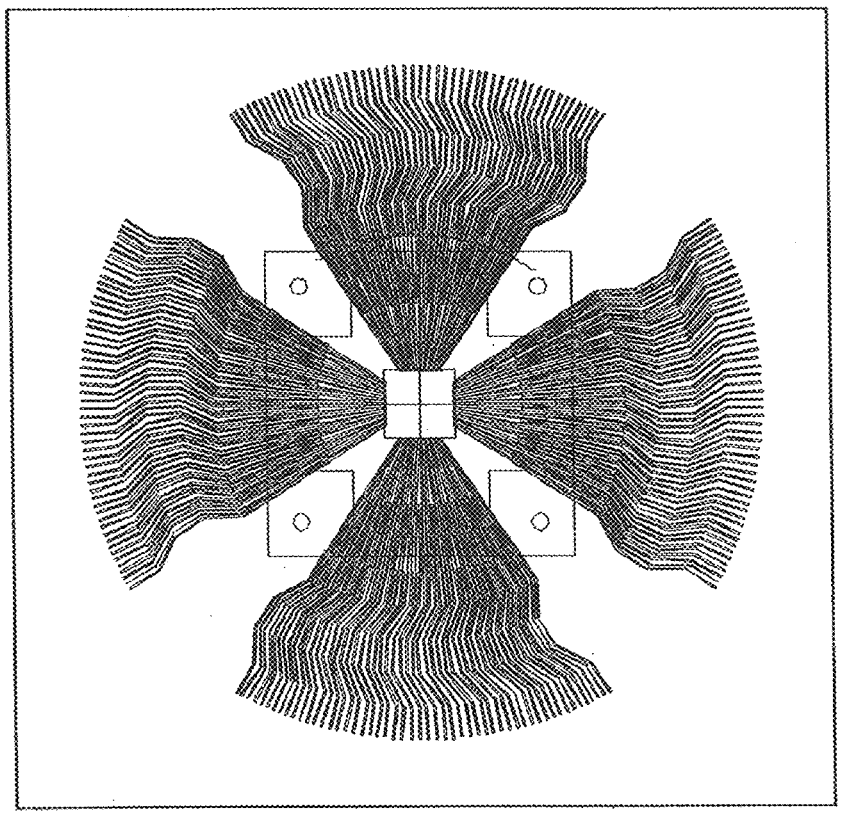

FIG. 82 shows a top view or bottom view of the contact springs of this Horizontal Cantilever Probe Card. You notice how the tips of the springs are located on the square pattern of the contact pads of the DUT. But the bodies of the springs fan out to take advantage of the larger space available as the distance increases away from the center. The second ends of the springs cannot be located along a true circle in such a case. If we want to have all the springs with the same length, to assure mass production and to reduce costs, we need to locate those second ends along a path, which allows us to have such a uniform distance from the "square" pattern of the contact pads of the DUT. I will call such a path the "distorted circle". This will be explained a little better later, in conjunction with FIG. 91, part A and part B.

Figure 83:
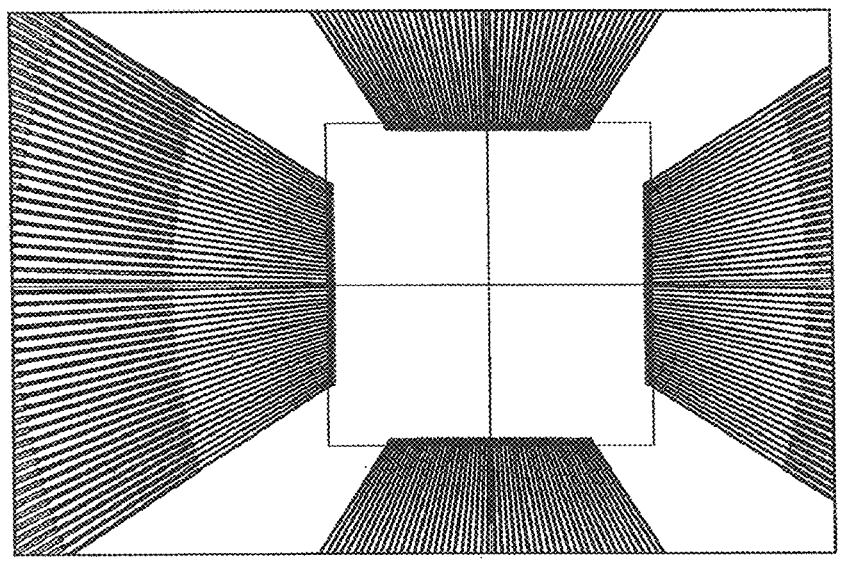
Figure 84:
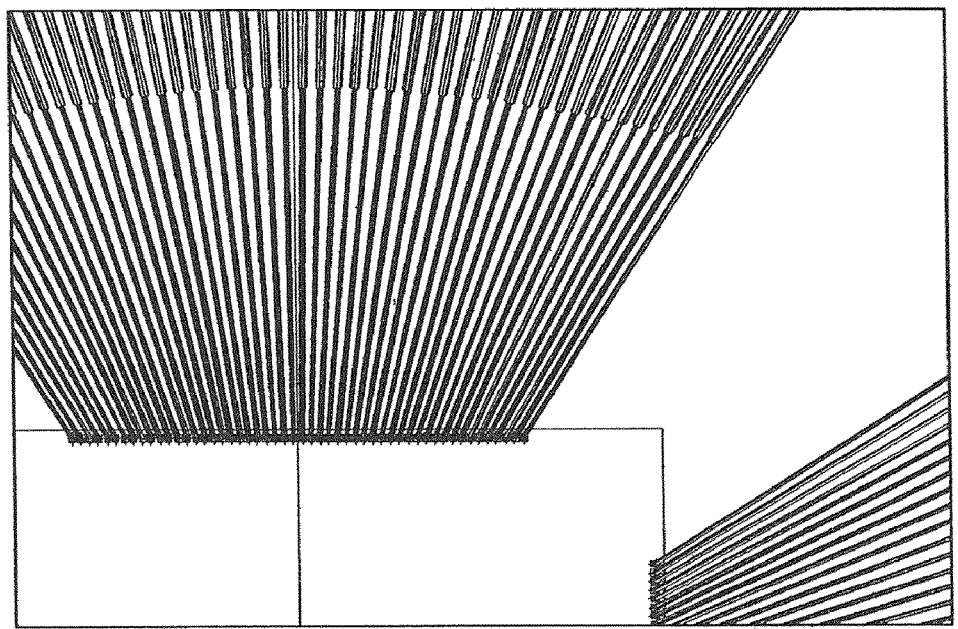
Figure 85:
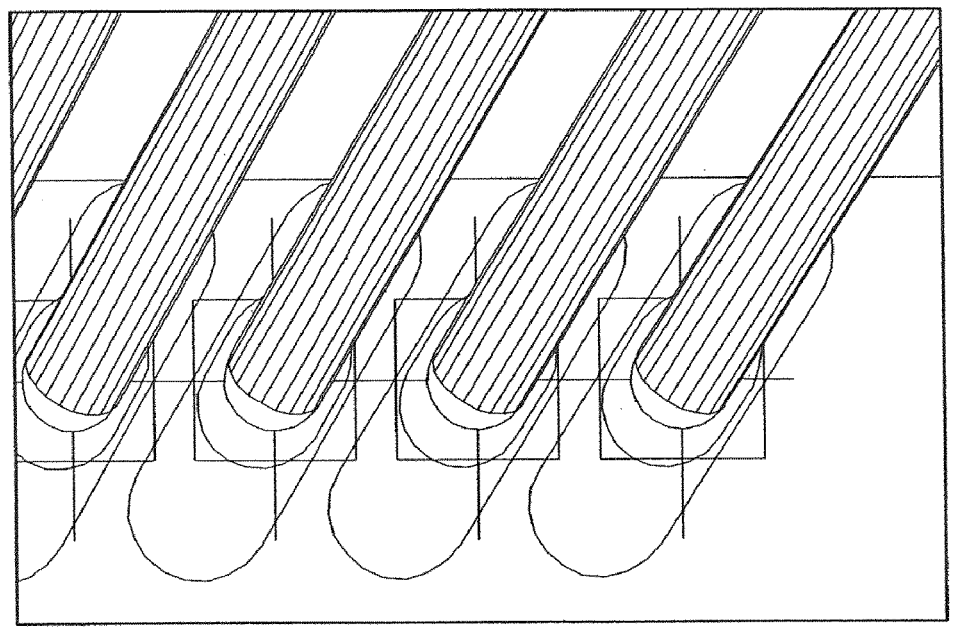
Figure 8G:
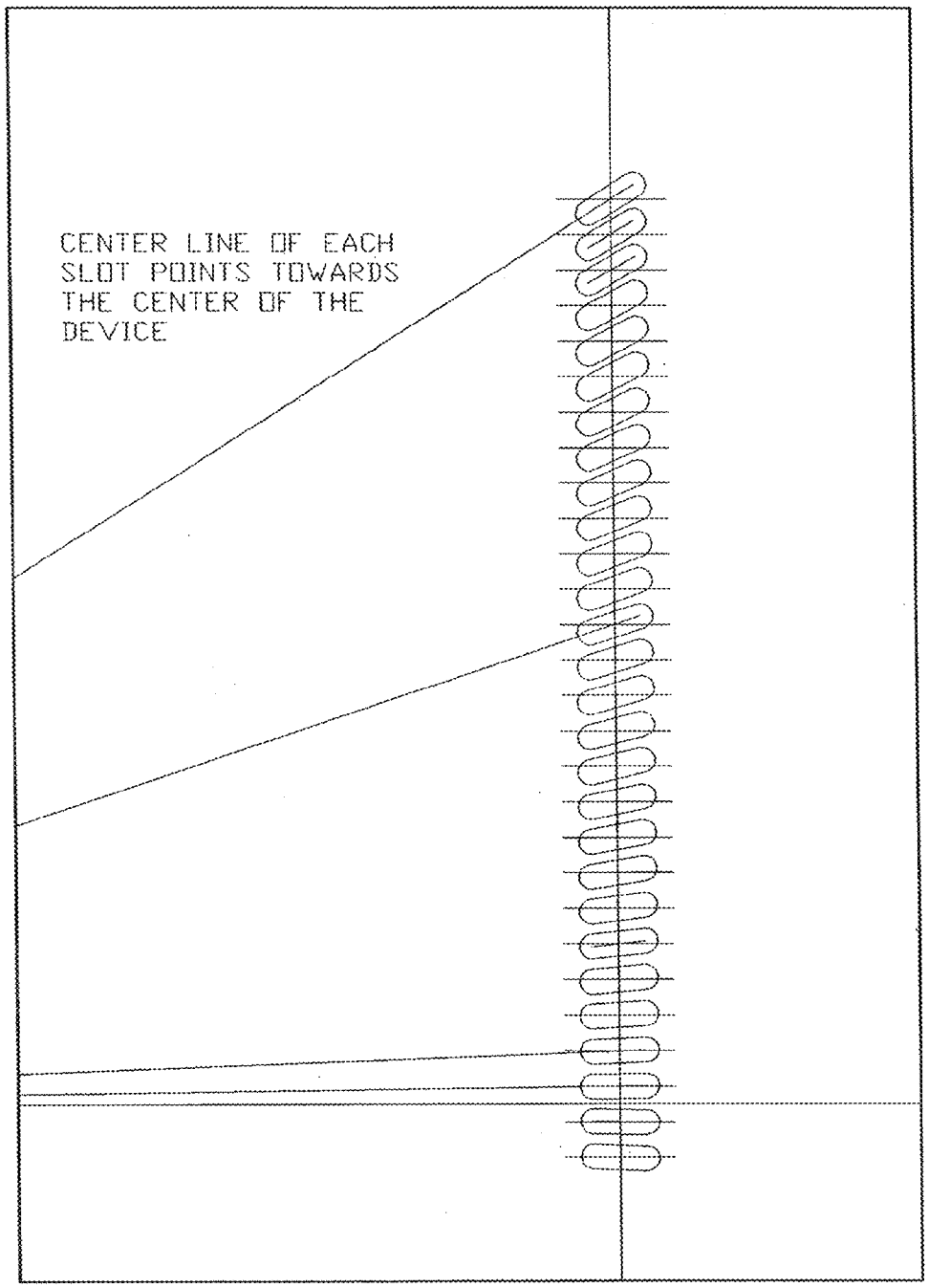

FIG. 83 shows a close up view of the center of FIG. 82. FIG. 84 shows still a closer view to the same. FIG. 85 shows yet a closer look. Here we see the slots in the comb and the slots in the limiter on top of the first set of slots. We see that the slots are inclined at certain angles. We see also that the slope of the slots is not constant.

Actually the slots should best be in line of the body of the contact springs. FIG. 86 shows that the slots are directed generally toward the center of the DUT, but more precisely in the direction of the springs bodies as the springs fan out as seen in FIG. 82.

Controlling the Amount of Wipe or Scrub

The amount of wipe can be controlled by "guiding" or "pivoting" the spring tips, by the shape of the spring and by the use of "combs".

For example, the chevron style creates wipe, while the 3-Vees will create almost no wipe, depending on the geometry of the Vees. The chevron spring is asymmetric, while the 3-Vees spring is more symmetrical. Other shapes of springs can be parallel nested and provide wipe or scrub, as well.

The shape of the holes in the comb is also important and affects the amount of the wiping action of the pin. Generally, it should have an hourglass shape. The location of the "waist" or "pinch point" of the hourglass has an important effect, too.

If the pinch point is located very near to the end of the spring, i.e. the tip, then the tilting of the tail and the movement of the spring would be internal or inside between the two pinch points of the top and the bottom combs. In such a case, we see very little side motion outside the combs. Hence, hardly any wipe.

However, if the pinch point were more towards the inside of the combs, then the free tips of the spring would move more sideways. This is because the pinch point is farther away from the tip. This geometry promotes wipe.

If we need to increase the amount/length of the wipe, we can place the pinch point further away from the tip of the spring and more toward the center of the spring. This will in essence "multiply" the effect of the tilting or rotation of the spring tail and result in more wiping action. It is like the multiplying effect of any arm or lever pivoting about a fulcrum point. So, we can say that the pinch point is the fulcrum of rotation of the tails.

This way, we can control how far the tip of the spring moves sideways to insure that the spring stays within the area of its intended contact pad. We can also use the "sides" of the hourglass and/or the edges of the hole, to limit the side movement of the spring tip.

Limiting the Amount of Wipe or Scrub

Usually, we need to control the magnitude of the wipe or scrub. We don't want the tip of the spring to wander off the contact pad of the device being contacted. There are several ways to accomplish that.

We can control the length (magnitude) of the wipe by controlling two things: First is the tilting angle of the spring tail, and Second, the distance from the pinch point to the contact pad, i.e. the length of the "lever arm", which is the portion of the tail beyond the pinch point.

We can control the angle by several methods: 1) by the side walls of the aperture/hole in the comb, 2) by the aspect ratio of the hole, 3) by using combs with two layers and by the effective aspect ratio of the combined hole, or 4) by using a combination of a comb together with a "limiter".

Using the sidewalls of the apertures/holes of the comb. If the holes are hourglass shaped, then the tail of the spring would stop tilting any further once the tail portions touch the sloped surfaces of the hourglass or the edge of the hole.

If the holes have a straight cylindrical or trapezoidal shape, then when the tail would tilt far enough, the edges of the hole would stop any further tilting. One part of the tail would touch one edge of the hole and the other part of the tail would touch the opposite end of that same hole. Then the tail would not be able to tilt any farther.

The same applies if the comb is composed of two layers. The effective shape of the hole would act as a stop to limit the tilting angle of the tail.

The Limiter

We can also provide another member that looks almost like the comb and place it near the comb, to act as a "limiter". The limiter can be physically touching the comb, or can be placed at a certain distance from it.

The holes in the limiter can be similar in shape like the holes in the comb, or can have a different cross-section. And they can have the same size or different size.

In addition, the holes in either the comb and/or the limiter can be oblong, like slots, if we look at them from the top view. Again, the slots can be the same size or different in size for the comb as compared to the limiter. The direction of the slots can be such that the axis of the slots would be angled toward the geometric center of the package or DUT, or of the pattern of contact pads. Or, the slots axes could be angled to match the direction of deflection of the contact springs. This last choice would be preferred especially with Peripheral Probes TCE and Avoiding Thermal Mismatch To reduce the effects of thermal cycling, the comb is made of a material that has a Thermal Coefficient of Expansion (TCE) that closely matches the material next to it. For example, if we are testing a ceramic package, the comb next to the package can be made of a similar ceramic material, or out of a material that has a TCE that closely or exactly matches that of ceramic. Ideally also, the comb should have a "thermal mass", [CLAIM], as close to that of the device under test. This way, when the device under test heats up and expands, the comb would heat up at the same rate and temperature. Consequently, the spring tips will remain in their respective position relative to the DUT. There would be no relative motion or lateral translation or migration or fretting corrosion due to the thermal fluctuations.

Similarly, if the socket is mounted to a printed circuit board made of FR4, the comb next to the PCB could be made from a similar material matching the TCE.

This would be very desirable for test and burn-in applications.

Combs can be used in other applications as well to reduce the effects of temperature on any interconnection device that interfaces with components made of different materials.

Non-Planarity

This is a very important issue and we can talk about it at length. The main purpose of using springs or needles is to accommodate "Non-Planarity". I have put together a spreadsheet to study the allowable Non-Planarity, and how it correlates with the pitch and the geometry of the springs or needles.

This study can take some time to go through. If anyone is interested, I can send you a copy of the study. For now, I can give you the summary of the following example.

This is for the "chevron" needles shown in the first probe example, described above. The needles are made of 0.010" (0.25 mm) diameter wire, and are approx. 0.900" (22.86 mm) long. They were placed on a 0.020" (0.5 mm) center distance. The study covers the deflections of the spring tips under the various loads of 10 grams, 20 grams, etc. up to 50 grams.

Basically, the study shows that if we have two adjacent contact pads that are not co-planar, the belly of the spring touching the higher pad would bulge more than the adjacent needles, which would be touching the lower pads. Based on the geometry of the needles and their location, the difference in height between the pads can be as much as approx. 0.0066" (0.167 mm) before the needles would touch.

Please note that for different needle geometries, the amount of allowable non-planarity would be different. Please note also that we can "design" the needles in ways that could allow more or less Non-Planarity, as desired, within reason.

Vertical Cantilever Probe Cards

Figure 87:
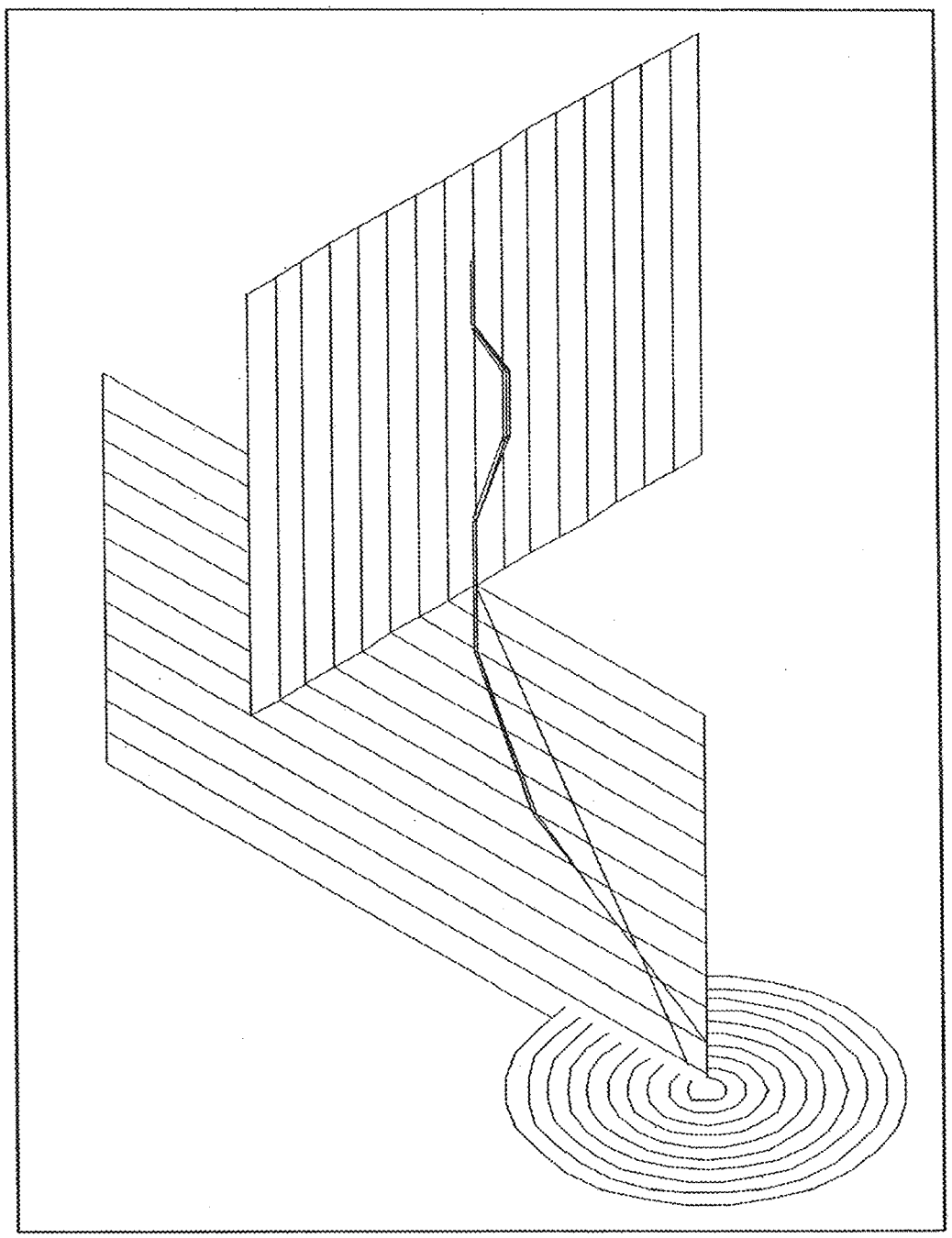

FIG. 87 is the basis of all vertical cantilever probe cards. Please compare it with FIG. 69. You will see that the only difference is that the anchor portion of the contact spring was changed from being in a horizontal plane to being in a vertical plane.

Figure 88:
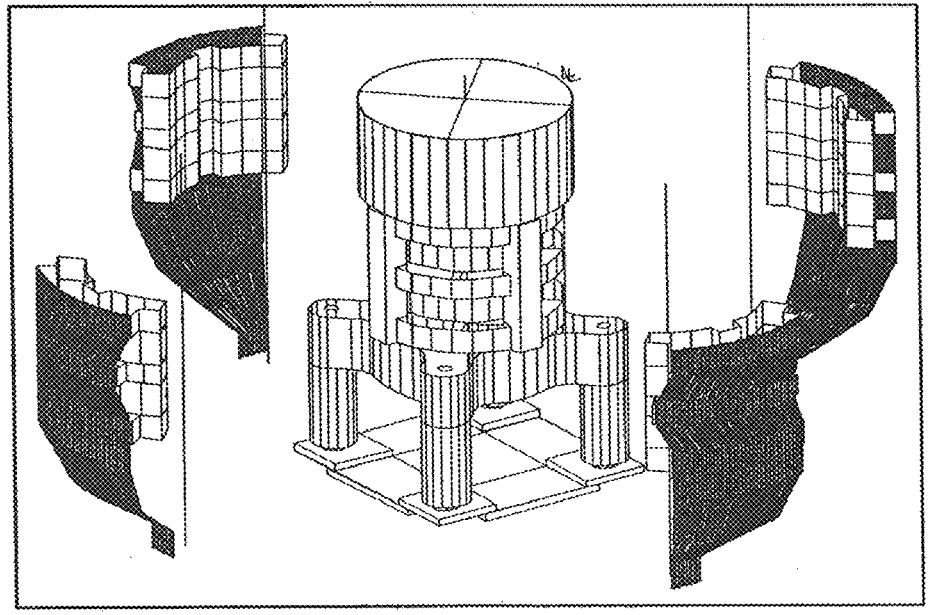
Figure 89:
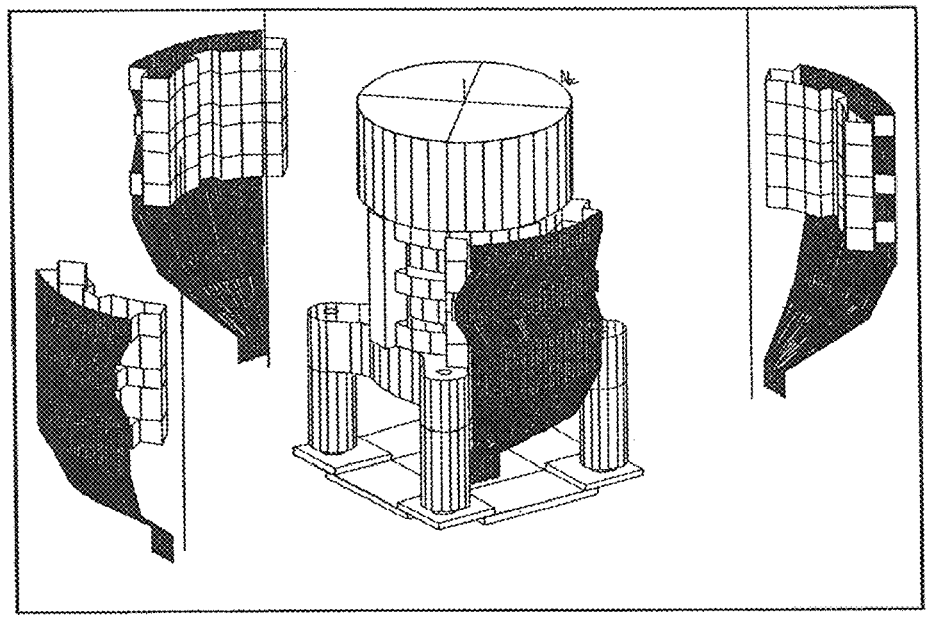
Figure 90:
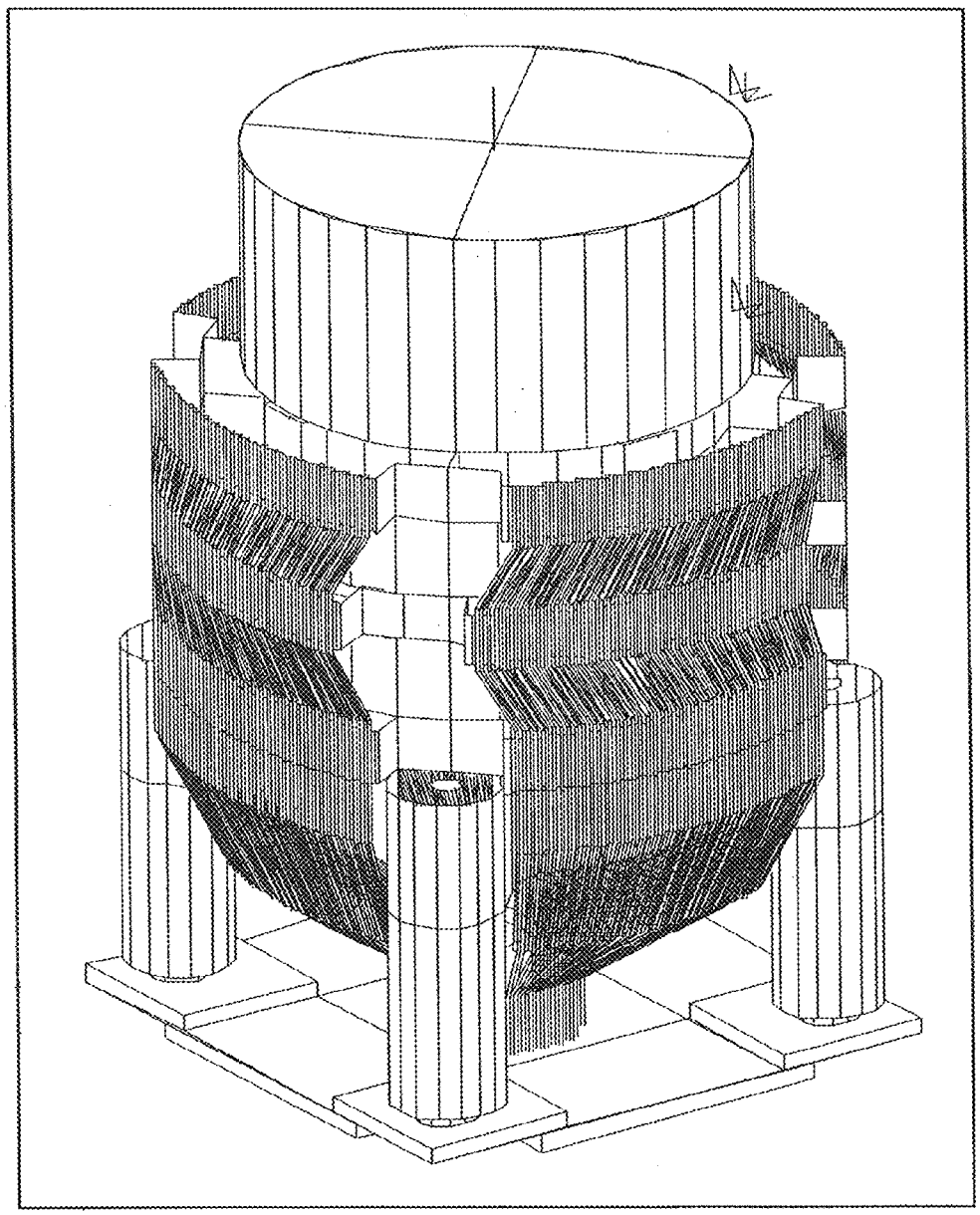

FIGS. 88 through 90 show a probe card of this category. FIG. 88 shows a central support member and four segments. Each segment carries a number of needles, located in a way such that their contact tips would match the pattern of the DUT. Each segment can be manufactured, assembled and prepared in advanced separately and stored. When desired, the proper segments can then be mounted on the core support and be used for a specific DUT. The time to configure a probe for a new DUT would be very short. This is very desirable to the industry.

FIG. 89 shows the segments, where one segment has been mounted to the core, while the other three are ready to be mounted. FIG. 90 shows all the four segments mounted.

The number of segments is optional. Most of the electronic devices are either square or rectangular, so four segments seem to be a logical choice. But 6 or 8 segments, or any other number would work too.

Minimizing Production Difficulty

Figure 91:
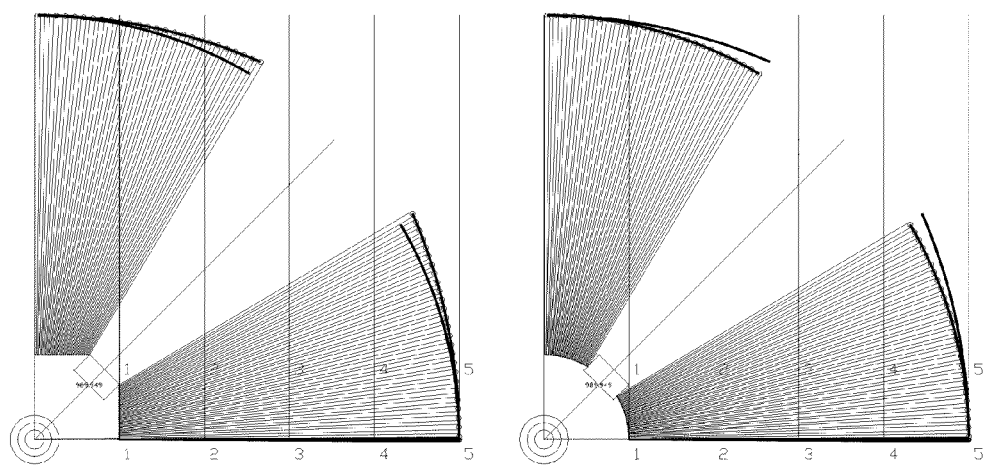

FIG. 91 shows two figures. FIG. A shows a square contact pads pattern on the DUT, while FIG. B shows a circular pattern. The needles are fanned out to utilize the larger space at the outer radii. The logical way is to have the needles positioned as in FIG. B, where the "contact" end of the needles would be on a "circle" and the angle increments between the needle uniform in value. The result of such arrangement would be that the "anchor" ends of the needles would fall on a "circle" as well, assuming that all the needles are identical in shape and length, which would be another logical thing to do. It would be the contour or path labeled "3" on the figure. This would make the manufacturing of the support member or the segment easy. It is easy to turn a circular object on a lathe or the like.

Now, if we use the same approach for the square pad pattern in FIG. A, we will need to push the needle out, so that their "contact" ends would fall on the square. The result would be that their "anchor" ends would be displaced from their circular contour, curve 1 in the figure. They will fall on a new contour, which is curve 2 in the figure. Now, curve 2 is not a circle anymore. It is some "flattened circle" curve. This one is most probably more difficult to accomplish than the real circular contour, curve 3. For comparison purposes, I have drawn both curves on both figures. It is easier to see the difference between the two curves. So curve 3 in FIG. B is identical to curve 1 in FIG. A. and curve 2 in FIG. A is identical to curve 4 in FIG. B. So, the question or choice would be to determine what is more economical. Choice 1 would be to make the needles identical and have a contour that is not a circular shape, hence more expensive. Choice 2 would be to make the contour circular and economical to manufacture and then we would need to form each needle individually to fit and to suit. My choice would be choice #1. Because there usually are so many needles, compared with one support member or four segments thereof. Such a profile can be programmed on a CNC machine readily and duplicated more economically than to form hundred of needles each one individually to a different shape.

Preloading

Usually it is desirable to use soft contact springs for sockets and the like. But this requires that we deflect the springs a considerable amount to reach the desired contact force and pressure. One way to overcome this dilemma is to "preload" the springs.

Figure 92:
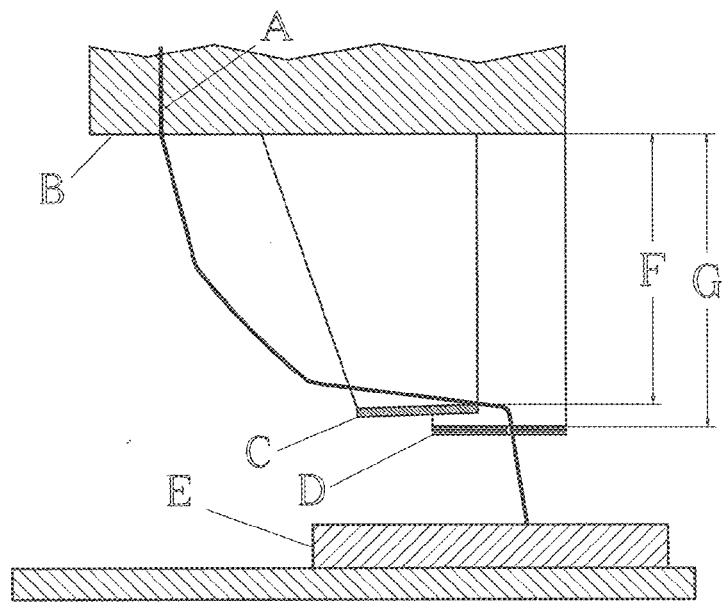
Figure 93:
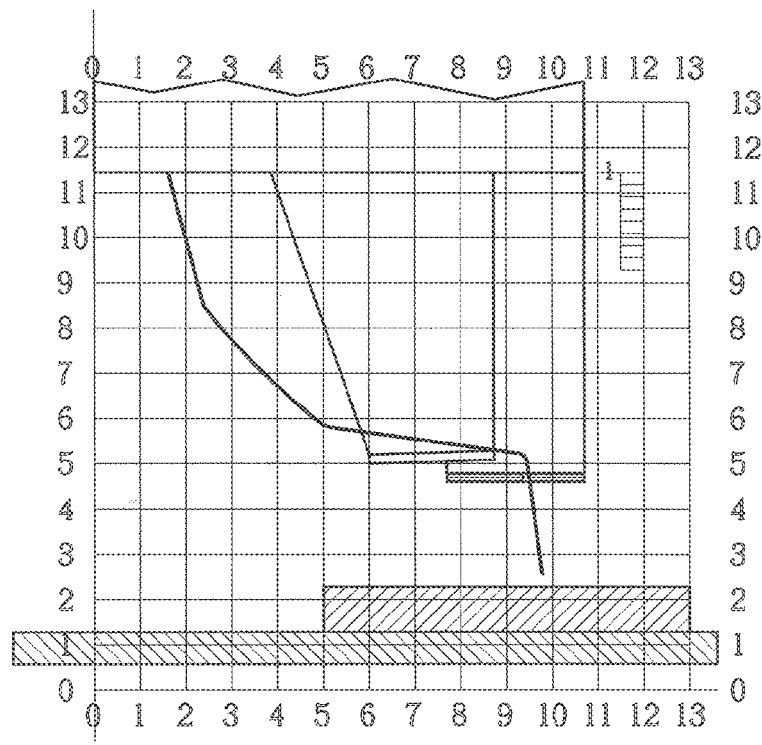
Figure 94:
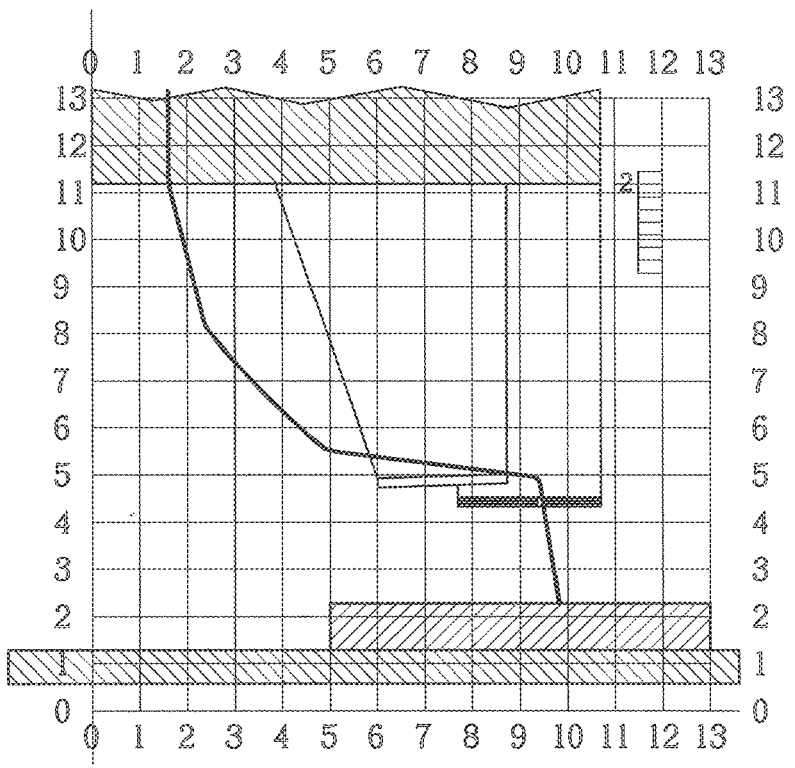
Figure 95:
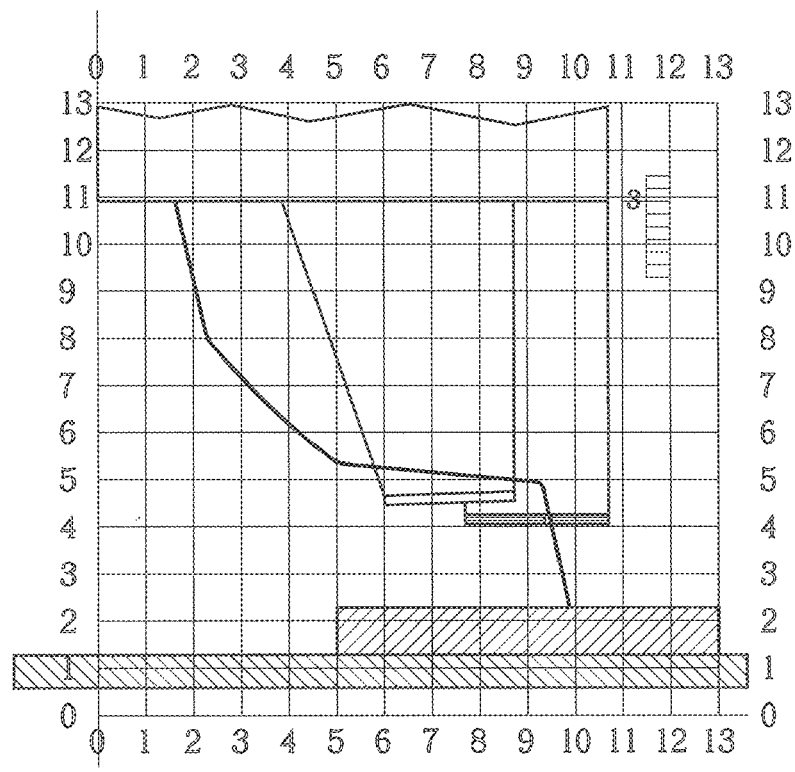
Figure 96:
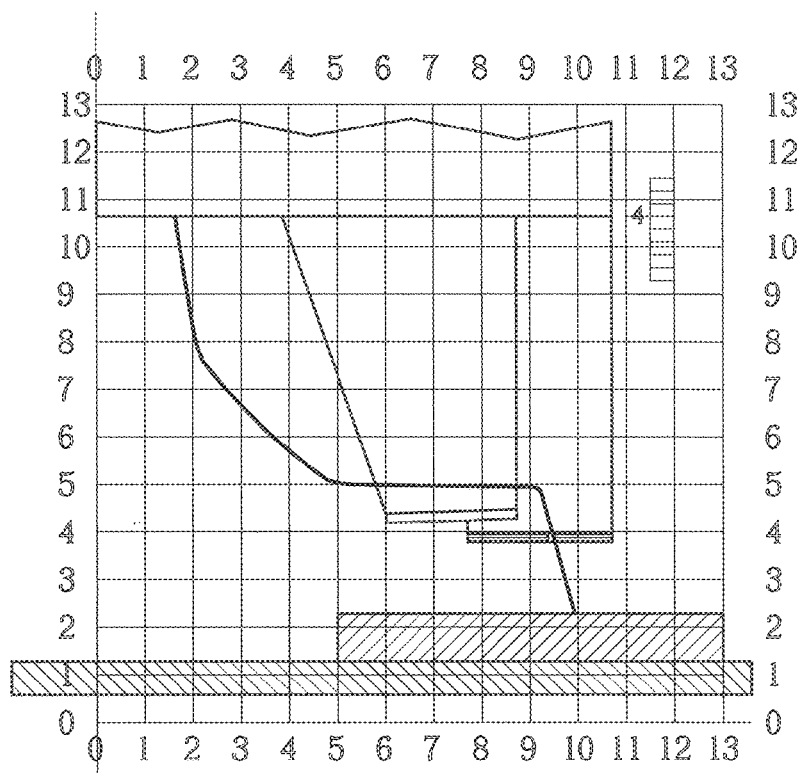
Figure 97:
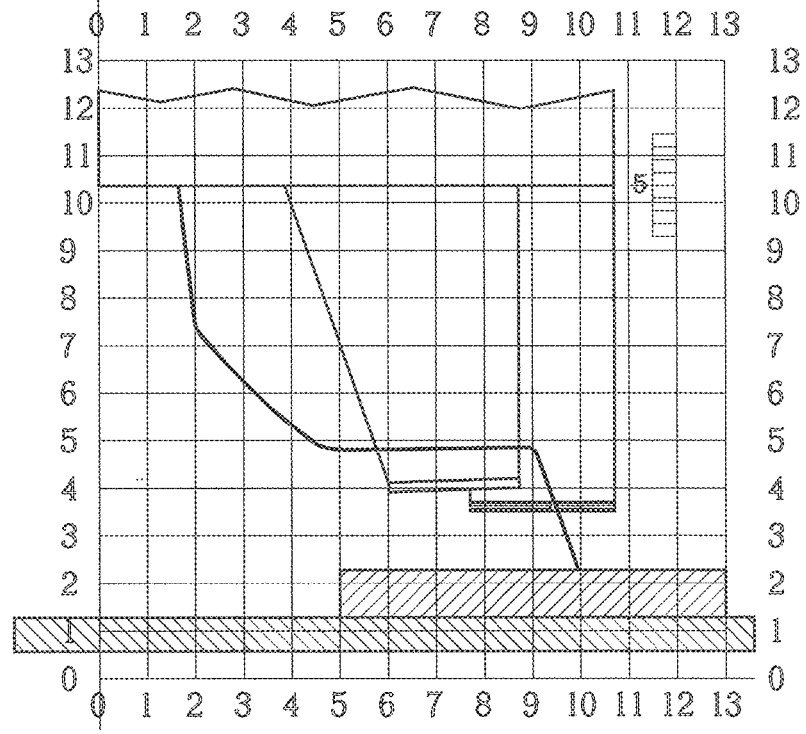
Figure 98:
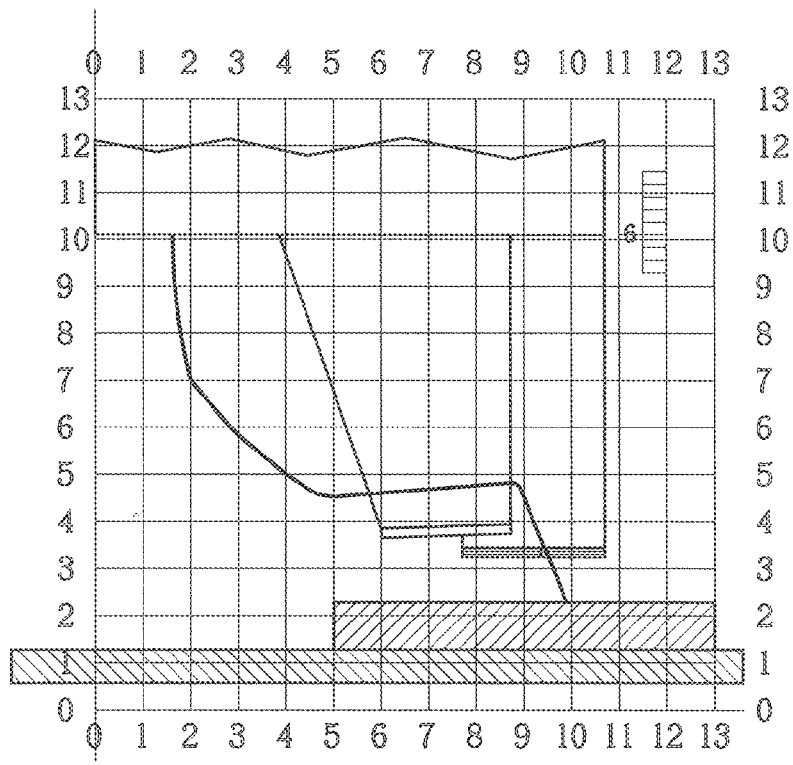
Figure 99:
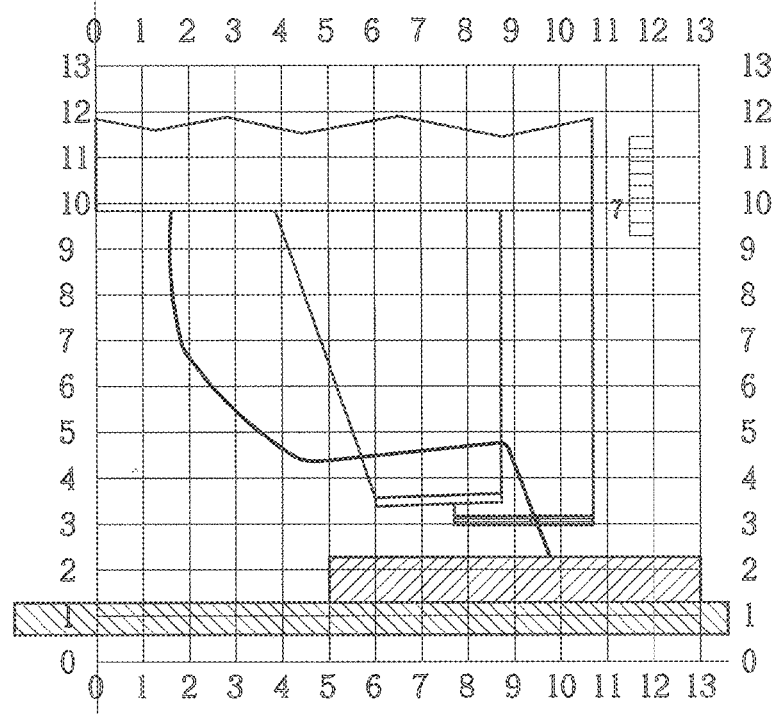
Figure 100:
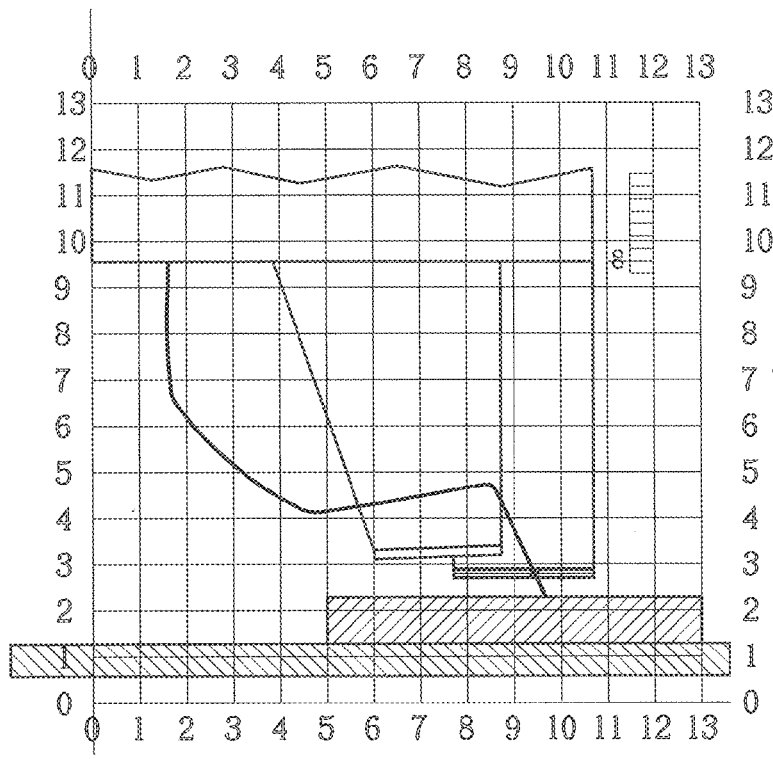
Figure 101:
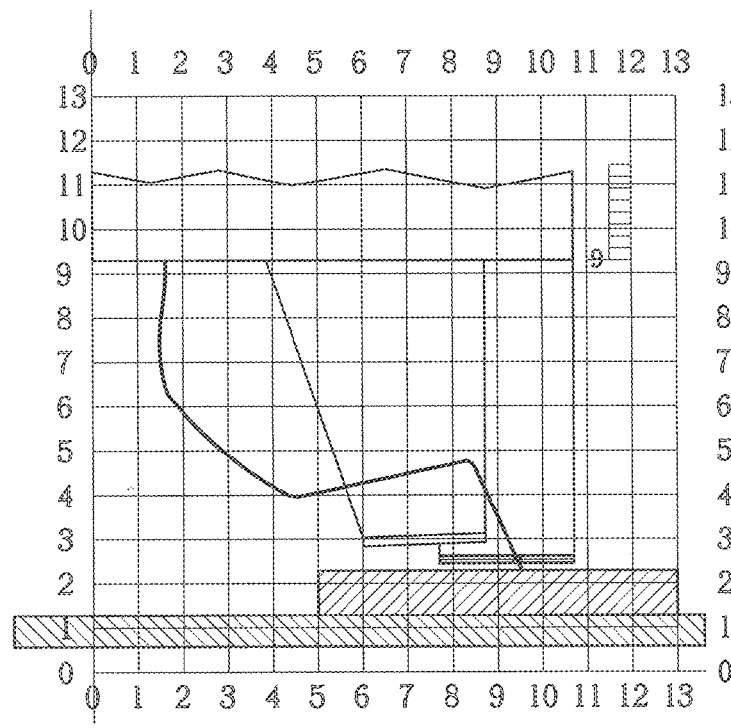

FIG. 92 shows one method to preload the needles on a probe card. In the figure we see the comb that is mounted at a fixed distance from the probe card, which supports the needles. We also a new member, which I called "Pre-Loader". This one is also mounted at a fixed distance from both the card and the comb. A point or portion of the needle will rest on the preloader. At this position, the needle is already under compression. The needle will not lift off the preloader unless and until some external force acting say on the contact tip will push the needle up. This force has to be larger than the preload already built in the needle due to the preloader. Such a situation is desirable frequently.

FIGS. 93 through 101 show a model of such a preloader while it is being lowered on a DUT. The sequence is shown at increments of 0.025", similar to the sequence shown in FIGS. 70 through 77. Again, we can see the scrub action, and at the same time, we can see how the needle lifts off the preloader at a point in time.

Highlights of Advantages & Benefits of the Invention:

The major advantages and benefits of the concepts described in this application are that:

We are helping the Electronics Industry in its efforts towards "miniaturization", by providing:

High-density springs or needles that allow testing of high-density devices. These include high-density packages, BGAs, Chips and even whole Wafers, as well as high-density PCBs, substrates or the like.

Testing of these devices improves reliability of electronic end products and lowers their ultimate costs.

Electrically "shielding" the springs and needles reduces the ill effects of stray electrical signals or noise, and allows for high frequency testing with controlled impedance.

Special materials and plated coatings are available to enhance the springs and probes properties and performance.

The comb is an important element in the whole concept, as you can see from all the above.

The use of "Combs" creates the desirable scrub or wiping action and controls its magnitude; hence less contact pressure/force force is required for good electrical connection.

The "Combs" also provides close control on the location and alignment of the springs and needles, at the "working point", i.e. the tip of the springs closest to the contact pads of the DUT. Hence, better and more reliable electrical contact.

TCE-Matched combs defeat the TCE Mismatch syndrome and make this the best kind of probes for "Thermal Cycling Tests" or for probing under Fluctuation Thermal Conditions.

The "Combs" protect the needles against damage due to accidental handling, especially in the case of Probe Cards. Hence, longer life and more economical cost of operation.

I claim:

1. An interconnection device, referred to as a probe, adapted for mechanically and electrically engaging a first electrical or electronic device, a chip or IC Package or substrate, referred to generically as the first device,
   a) said first device having a generally flat surface and at least a first and a second active contact element, pads, bumps or balls, referred to as first device pads,
   b) said first device pads being arranged in a certain pattern, referred to as the first device pad pattern,
   c) having a certain distance between the center of said first device first pad and the center of said first device second pad, said distance referred to as the first device pad pitch,
   d) said probe having at least a first and a second contact element, referred to as springs,
   e) each of said springs having a generally elongated slender curvilinear body,
   f) said spring body having a spring middle portion, and a spring first end portion ending with a spring first tip, which in turn is ending with a spring first contact point,
   g) each of said first and second spring being fixedly mounted at about its spring middle portion, on or in a first carrier, at a fixation spot in said first carrier, said spring first end portion exiting from said fixation spot of said first carrier at a point facing towards the first spring tip, said point being referred to as the spring first anchor point,
   h) said first carrier together with said number of springs mounted on or in it being referred to as a first carrying module; and
   i) said probe having a second module similar to said first module, disposed adjacent to said first module, said second module carrying a number of springs, similar to said first and second springs,
   j) said probe having also a first guide, referred to as the first comb, located generally adjacent and parallel to said first device,
   k) said first comb having at least a first and a second first comb aperture,
   l) said first comb apertures being arranged in a certain pattern, referred to as the first comb apertures pattern,
   m) having a certain distance between the center of said first aperture and the center of said second aperture of said first comb, said distance referred to as the first comb apertures pitch,
   n) said first comb apertures pattern corresponding to said first device pad pattern,
   o) said first comb apertures pitch corresponding to said first device pad pitch;
   p) said probe having also a housing,
   q) said housing having means to contain said first and second modules and said first comb, and to fixate them all in certain positions relative to each other and to said first device,
   r) each one of said spring first tip of said first and second spring passing through a corresponding aperture of said first comb, referred to as the spring first aperture, and said first contact points of said first and second springs protruding beyond the first comb, the amount of protrusion being large enough to allow the spring contact points to touch and make contact with their corresponding pads of said first device,
   s) each one of said first and second springs being arranged so as to have an interaction between its spring body and said first device, so as to create a normal force between its first contact point and its corresponding pad of said first device, in a direction generally perpendicular to the general surface of said first device;
   t) wherein
      when such a normal force is exerted between said first contact point of said spring and its corresponding pad of said first device, said first contact point of said spring will also move laterally, in a direction generally parallel to the general flat surface of said first device and its pads, thus creating the so-called wipe or scrub on the surface of the corresponding pad of said first device.

2. A probe as in claim 1, wherein
   an intermediate member, referred to as the slider, is placed within the housing, in a way that the slider is positioned between said first comb and said carrier modules, and
   said slider has sliders apertures, matching in number and general pattern to the number and general pattern of the apertures in said first comb and wherein
   each one of said first and second spring passes freely and slidably through a corresponding slider aperture and wherein
   said slider can move in a direction generally perpendicular to the general elongated bodies of the springs, and by doing so, the slider would deform the body of the springs laterally, generally normal to their general elongated lengths, thus retracting the tips of the springs back inwardly closer towards the center of the housing and thus reducing said amount of spring tips protrusions.

3. A probe as in claim 2, wherein
   the probe has also a lid, which can be placed against the first device, urging said first device towards said first comb and against the spring first contact points, and wherein
   said lid is linked to said slider; such that when the lid is placed behind said first device and in the vicinity of said comb, the slider will not retract the spring tips, and when the lid is removed from behind the first device or is pulled away from the vicinity of said first comb, the slider will retract the spring tips back closer towards the inside of the housing, thus reducing said amount of spring tips protrusions.

4. A probe as in claim 1, wherein
a) said probe is also adapted for mechanically and electrically engaging a second electrical or electronic device, a chip or IC Package or substrate, referred to as the second device,
b) said second device having a generally flat surface and at least a first and a second contact element, pads, bumps or balls, referred to as the second device pads,
c) said second device pads being arranged in a certain pattern, referred to as the second device pad pattern,
d) having a certain distance between the center of said first pad and the center of said second pad of said second device, said distance referred to as the second device pad pitch,
e) each of said first and second spring being fixedly mounted on the corresponding carrier, exiting from the fixation spot in said carrier, at a point facing towards the spring second tip, said point being referred to as the spring second anchor point; and
f) said probe having also a second guide, referred to as the second comb, located generally adjacent and parallel to said second device,
g) said second comb having at least a first and a second aperture,
h) said apertures being arranged in a certain pattern, referred to as the second comb aperture pattern,
i) having a certain distance between the center of said first aperture and the center of said second aperture of said second comb, said distance referred to as the second comb aperture pitch,
j) said second comb aperture pattern corresponding to said second device pad pattern,
k) said second comb aperture pitch corresponding to said second device pad pitch;
l) each one of said second spring tip of said first and second spring passing through a corresponding aperture of said second comb, referred to as the spring second aperture, and said second contact points of said first and second spring protruding beyond the second comb, the amount of protrusion being large enough to allow the spring contact points to touch and make contact with the corresponding pads of said second device,
m) each one of said first and second spring being arranged so as to have an interaction between its spring body and the second device, so as to create a normal force between its second contact point and its corresponding pad of said second device, in a direction generally perpendicular to the general surface of said second device; and
n) wherein
o) when such a normal force is exerted between said second contact point of said spring and its corresponding pad of said second device, said second contact point of said spring will also move laterally, in a direction generally parallel to the general flat surface of said second device and its pads, thus creating the so-called wipe or scrub on the surface of the corresponding pad of said second device.

5. A probe as in 4, wherein
wherein
said device pad patterns of said first and second devices have a generally orthogonal distribution shape, like in rows and columns of pads, having a generally longitudinal axis and a generally transverse axis, and wherein the carrier modules and slabs carrying the springs are arranged and oriented at a certain angle with respect to said longitudinal and transverse axes, and yet the pattern of the spring tips still conforms and matches the corresponding orthogonal pad patterns of said first and second devices.

6. A probe as in 5, wherein
wherein said certain angle is 45 degrees.

7. An interconnection device, referred to as a probe, adapted for mechanically and electrically engaging two electrical or electronic devices, chips or IC Packages or substrates, referred to generically as the first and second device,
a) each one of said first and second devices having a generally flat surface and at least a first and a second active contact element, referred to as the first device pads and as the second device pads,
b) said first and second device pads being arranged in a certain pattern, referred to as the first device pad pattern and as the second device pad pattern,
c) having a certain distance between the center of said first pad and the center of said second pad of the first and second devices, said distances referred to as the first device pad pitch and as the second device pad pitch,
d) said probe having at least a first and a second contact element, referred to as springs,
e) each one of said springs having a generally elongated slender curvilinear body,
f) said spring body having a spring middle portion, and a spring first end portion ending with a spring first tip, which in turn is ending with a spring first contact point,
g) said spring body having also a spring second end portion ending with a spring second tip, which in turn is ending with a spring second contact point,
k) said probe having also a first and second guide, referred to as the first and second comb, located generally adjacent and parallel to said first and second device,
l) each one of said first and second comb having at least a first and a second comb aperture,
m) said first and second comb apertures being arranged in a certain pattern, referred to as the first comb apertures pattern and as the second comb apertures pattern,
n) having a certain distance between the center of said first aperture and the center of said second aperture, said distance referred to as the first comb apertures pitch, and as the second comb apertures pitch
o) said first comb apertures pattern corresponding to said first device pad pattern and said second comb apertures pattern corresponding to said second device pad pattern,
p) said first comb apertures pitch corresponding to said first device pad pitch and said second comb apertures pitch corresponding to said second device pad pitch;
q) said probe having also a housing,
r) said housing having means to accommodate said springs and said first and second combs, and to fixate them all in certain positions relative to each other and relative to said first and second device,
s) each one of said spring first tip of said first and second spring, passing through a corresponding aperture of said first comb, referred to as the spring first aperture, and said first contact points of said first and second springs protruding beyond the surface of the first comb, the amount of protrusion being large enough to allow the spring first contact points to touch and make contact with their corresponding pads of said first device,
t) each one of said first and second springs being arranged so as to have an interaction between its spring body and said first device, so as to create a normal force between its first contact point and its corresponding pad of said first device, in a direction generally perpendicular to the general surface of said first device;

s) each one of said spring second tip of said first and second spring, passing through a corresponding aperture of said second comb, referred to as the spring second aperture, and said second contact points of said first and second springs protruding beyond the surface of the second comb, the amount of protrusion being large enough to allow the spring second contact points to touch and make contact with their corresponding pads of said second device, t) each one of said first and second springs being arranged so as to have an interaction between its spring body and said second device, so as to create a normal force between its second contact point and its corresponding pad of said second device, in a direction generally perpendicular to the general surface of said second device;

u) wherein
when such a normal force is exerted between said first contact point of said spring and its corresponding pad of said first device, said first contact point of said spring will also move laterally, in a direction generally parallel to the general flat surface of said first device and its pads, thus creating the so-called wipe or scrub on the surface of the corresponding pad of said first device and when such a normal force is exerted between said second contact point of said spring and its corresponding pad of said second device, said second contact point of said spring will also move laterally, in a direction generally parallel to the general flat surface of said second device and its pads, thus creating the so-called wipe or scrub on the surface of the corresponding pad of said second device.

8. A probe as in claim 7, wherein
the first and the second devices are not equal in size, wherein although both devices have the same number of device pads and generally the same device pad pattern, the first device pad pitch may be smaller or larger than the second device pad pitch, and consequently, the combs will not be equal in size either, wherein
the first comb will have a first comb apertures pattern and pitch corresponding to the first device pad pattern and pitch, while the second comb will have a second comb apertures pattern and pitch corresponding to the second device pad pattern and pitch, and the springs as well as the combs will be shaped and installed in a way, so as to accommodate the differences.

9. A probe as in claim 7, wherein
the probe has also an arrangement, referred to as the nest, wherein the nest is located adjacent said first comb and has an opening, which can accommodate said first device and can position it in proper juxtaposition with respect to said first comb, so that the pads of said first device will be in proper alignment with their respective apertures of said first comb and so that the first contact points of said springs would properly contact their respective pads of said first device.

10. A probe as in claim 7, wherein
groups of the springs are encapsulated into one or more blocks of flexible material, an elastomer or a dissolvable material, where the flexible material blocks can be at different locations along the length of the springs bodies.

11. A probe as in claim 7, wherein the springs are shaped to have varying spring performance along their compression range, such that their elastic performance and spring stiffness or spring index vary gradually as the spring deformation increases, such that at the beginning of the spring deformation, e.g. under compression, the spring behaves as a fairly stiff spring, and gradually, the more the spring is deformed or compressed, the softer it looks, in other words, during the initial stages of compression the spring index is high and the spring behaves as a comparatively stiff spring, and during the latter stages of compression the spring index is smaller and the spring behaves as a comparatively softer spring.

12. A probe as in claim 7, wherein
the housing is arranged to have openings to allow access to the springs and other components inside the housing, and has some coverings to close these access openings after the probe is fully assembled.

13. A probe as in claim 7, wherein
groups of springs are supported by support members, referred to as modules or slabs, which are flat and elongated, and located inside said housing and are stacked one adjacent to each other to form a spring pattern, having their spring tips and spring contact points in a pattern, matching and corresponding to the devices pads pattern.

14. A probe as in 13, wherein
said device pad patterns of said first and second devices have a generally orthogonal distribution shape, like in rows and columns of pads, having a generally longitudinal axis and a generally transverse axis, and wherein
the carrier modules and slabs carrying the springs are arranged and oriented at a certain angle with respect to said longitudinal and transverse axes, and yet the pattern of the spring tips still conforms and matches the corresponding orthogonal pad patterns of said first and second devices.

15. A probe as in claim 7, wherein
an intermediate member, referred to as the slider, is placed within the housing, in a way that the slider is positioned between said first comb and said carrier modules and
said slider has sliders apertures, matching in number and general pattern to the number and general pattern of the apertures in said first and second comb and wherein
each one of said first and second spring passes freely and slidably through a corresponding slider aperture and wherein
said slider can move in a direction generally perpendicular to the general elongated bodies of the springs, and by doing so, the slider would deform the body of the springs laterally, generally normal to their general elongated lengths, thus retracting the tips of the springs back inwardly closer towards the center of the housing and thus reducing said amount of spring tips protrusions.

16. A probe as in claim 15, wherein
the probe has also a lid, which could be placed against the first device, urging said first device towards said first comb and against the spring first contact points, and
said lid is linked to said slider, such that when the lid is placed behind said first device and in the vicinity of said comb, the slider will not retract the spring tips, and when the lid is removed from behind the first device or is pulled away from the vicinity of said first comb, the slider will retract the spring tips back closer towards the inside of the housing, thus reducing said amount of spring tips protrusions.

17. An interconnection device, referred to as a probe, adapted for mechanically and electrically engaging two electrical or electronic devices, chips or IC Packages or substrates, referred to generically as the first and second device, a) each one of said first and second devices having a generally flat surface and at least a first and a second active contact element, pads, bumps or balls, referred to as the first device pads and as the second device pads, b) said first and second device pads being arranged in a certain pattern, referred to as the first device pad pattern and as the second device pad pattern,
c) having a certain distance between the center of said first pad and the center of said second pad of the first and second devices, said distances referred to as the first device pad pitch and as the second device pad pitch,
d) said probe having at least a first and a second contact element, referred to as springs,
e) each one of said springs having a generally elongated slender curvilinear body, comprising straight line portions, or arcs or vee-bend portions or the like,
f) said spring body having a spring middle portion, and a spring first end portion ending with a spring first tip,
g) said spring body having also a spring second end portion ending with a spring second tip, which in turn is ending with a spring first contact point,
s) each one of said spring first tip of said first and second springs being attached to its corresponding contact pad of said first device pad,
k) said probe having also a guide, referred to as the comb, located generally adjacent and parallel to said second device,
l) said comb having at least a first and a second comb aperture,
m) said first and second comb apertures being arranged in a certain pattern, referred to as the comb apertures pattern,
n) having a certain distance between the center of said first aperture and the center of said second aperture, said distance referred to as the comb apertures pitch,
o) said comb apertures pattern corresponding to said second device pad pattern,
p) said comb apertures pitch corresponding to said second device pad pitch;
s) each one of said spring second tip of said first and second spring, passing through a corresponding aperture of said comb, referred to as the spring comb aperture, and said second contact points of said first and second springs protruding beyond the surface of the comb, the amount of protrusion being large enough to allow the spring second contact points to touch and make contact with their corresponding pads of said second device,
t) each one of said first and second springs being arranged so as to have an interaction between its spring body and said second device, so as to create a normal force between its second contact point and its corresponding pad of said second device, in a direction generally perpendicular to the general surface of said second device;
u) wherein
when such a normal force is exerted between said second contact point of said spring and its corresponding pad of said second device, said second contact point of said spring will also move laterally, in a direction generally parallel to the general flat surface of said second device and its pads, thus creating the so-called wipe or scrub on the surface of the corresponding pad of said second device.

18. A probe as in claim 17, wherein said springs are parallel nested.

19. A probe as in claim 17, wherein said comb apertures are shaped so as to have a generous wide funnel entry at the inner side of the comb, i.e. at the side facing the middle portion of the springs.

20. A probe as in claim 17, wherein said comb has a thermal coefficient of expansion equal in value or approximately equal in value to the thermal coefficient of expansion of said second device.

\* \* \* \* \*